United States Patent [19]
Berlien, Jr. et al.

[11] Patent Number: 5,850,195
[45] Date of Patent: Dec. 15, 1998

[54] MONOLITHIC LIGHT-TO-DIGITAL SIGNAL CONVERTER

[75] Inventors: John H. Berlien, Jr., Plano, Tex.; Cecil J. Aswell, Orangevale, Calif.; Eugene G. Dierschke; Mehedi Hassan, both of Dallas, Tex.

[73] Assignee: Texas Instruments Incorporated, Dallas, Tex.

[21] Appl. No.: 625,611

[22] Filed: Mar. 29, 1996

Related U.S. Application Data

[63] Continuation of Ser. No. 118,910, Sep. 9, 1993, abandoned.

[51] Int. Cl.$^6$ .............................. H03M 1/00; G08C 19/04
[52] U.S. Cl. .................................... 341/137; 250/214 DC
[58] Field of Search .................................... 341/137, 155; 250/214 R, 214 DC, 214 SW

[56] References Cited

U.S. PATENT DOCUMENTS

| | | | |
|---|---|---|---|
| 4,137,451 | 1/1979 | Einolf, Jr. ............................... | 341/137 |
| 4,374,384 | 2/1983 | Moates ............................. | 340/870.38 |
| 4,465,370 | 8/1984 | Yuasa et al. ............................. | 356/224 |
| 4,498,020 | 2/1985 | Giolma et al. ......................... | 307/261 |
| 4,851,840 | 7/1989 | McAulay ................................. | 341/137 |
| 4,947,170 | 8/1990 | Falk ........................................ | 341/137 |
| 5,046,158 | 9/1991 | Groen ..................................... | 341/137 |
| 5,172,117 | 12/1992 | Mills et al. ............................. | 341/157 |

OTHER PUBLICATIONS

*TSL230, TSL231, TSL232 Programmable Light–to–Frequency Converters*, SOES007A–D4081, Oct. 1992—Revised Apr. 1993.

*Primary Examiner*—Marc S. Hoff
*Attorney, Agent, or Firm*—W. James Brady, III; Richard L. Donaldson

[57] ABSTRACT

A monolithic light-to-digital signal converter (1.10) includes a photodiode array (1.24) having a plurality of sections with each section producing a current signal in response to incident light, a current-to-digital signal converter circuit (1.28) for converting selected ones of the current signals to a digital signal, and a control circuit (1.26) for scaling the digital signal in response to user supplied programming signals. The control circuit (1.26) also responds to user supplied programming signals to supply control signals to current-to-digital signal converter circuit (1.28). Current-to-digital signal converter circuit (1.28) is responsive to the control signals for combining selected ones of the current signals into a composite current signal and converting the composite current signal to a digital signal.

4 Claims, 30 Drawing Sheets

MONOLITHIC LIGHT-TO-DIGITAL SIGNAL CONVERTER

This application is a Continuation, of application Ser. No. 08/118.910, filed Sep. 09, 1993 now abandoned.

FIELD OF THE INVENTION

This invention relates generally to systems for converting light to electrical signals and more particularly, to a monolithic light-to-digital signal converter.

BACKGROUND OF THE INVENTION

The widespread use of microprocessors and microcontrollers in systems has established the need for the conversion of analog signals to digital format for processing. One important form of analog to digital conversion is the conversion of light levels to digital information. Since light levels typically vary over several orders of magnitude, high-resolution conversion, such as 12 bit, is desirable in order to obtain the required dynamic range and low-level sensitivity.

Presently available systems for converting light levels to digital information use a discrete light sensing device, such as a photodiode device, coupled to a separate signal conversion circuit, such as a discrete current-to-frequency converter. Where the light sensor and conversion circuit are located away from the system's main board, the large number of bits required for high resolution conversion complicates interconnection of the conversion device to the main board. Even in situations in which the light sensor and conversion circuit can be mounted on the system's main board, reliable transmission of signals from the light sensor to the conversion device is difficult due to the fact that the signals produced by the light sensor are very small.

Hybrid devices in which a discrete photodiode device and a discrete current-to-frequency converter device are packaged together in a single package are presently available. However, such devices exhibit poor temperature stability and have low linearity at higher frequencies thus limiting useful resolution to 6 bits. In addition, these hybrid devices require an external integrator capacitor connected to the input node which increases susceptibility to external noise.

Accordingly, a need exists for a light-to-digital signal converter that overcomes the above problems.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
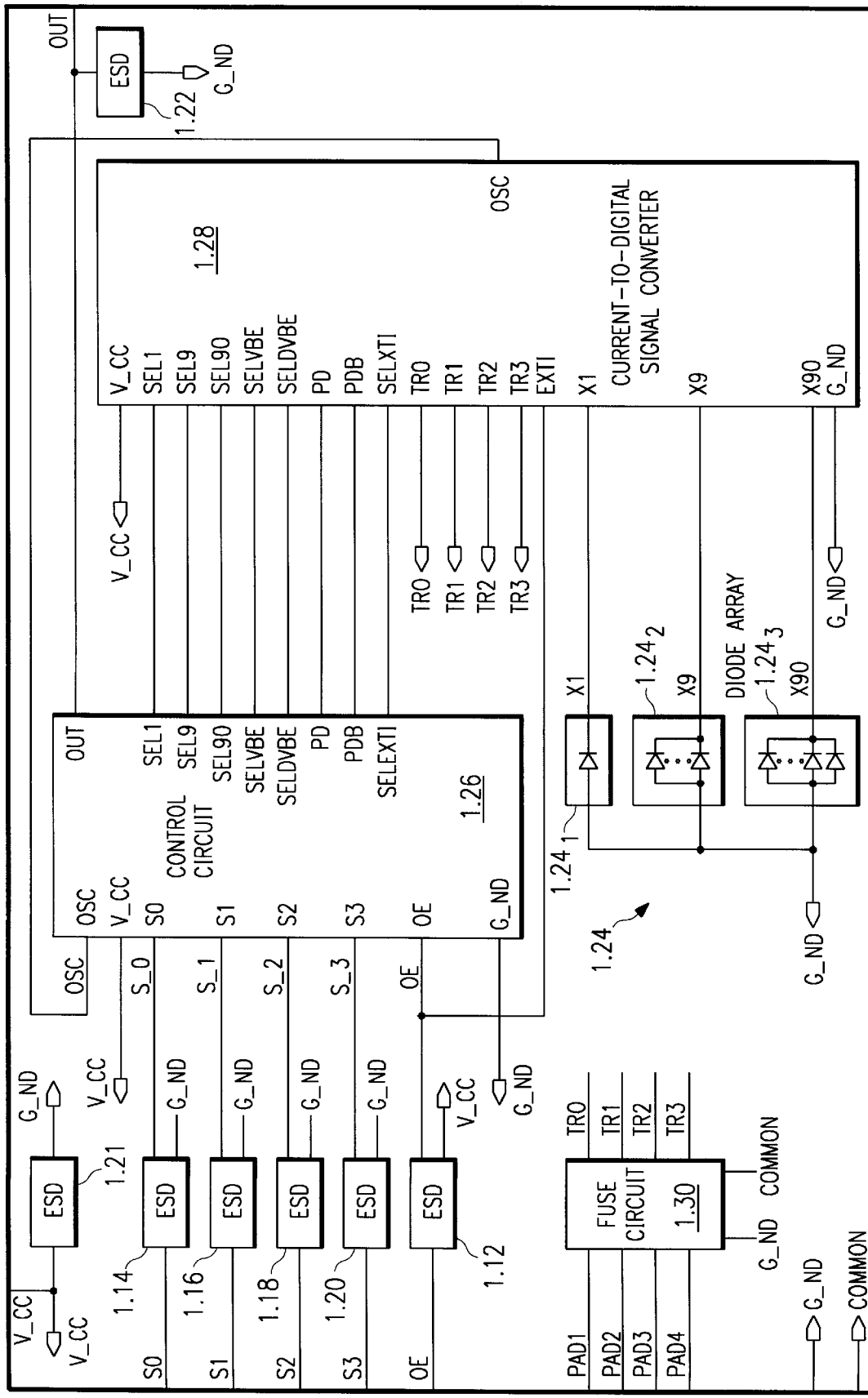
FIG. 1 is an electrical block diagram of a monolithic light-to-digital signal converter according to the invention.

FIG. 1 is an electrical block diagram of a monolithic light-to-digital signal converter 1.10 according to a preferred embodiment of the invention. Light-to-digital signal converter 1.10 includes a photodiode array 1.24, fuse circuit 1.30, and control circuit 1.26 that are coupled to a current-to-digital signal converter circuit 1.28.

Input signals S0–S3, OE, V_CC, and C_ND are supplied to light-to-digital signal converter 1.10 by way of external pins (not shown). Signals S0–S3 are user supplied programming signals. Signal OE is a user supplied output enable signal. Signal V_CC is received from an external 3–9 V power supply. Signal G_ND is received from an external source of ground. Output signal OUT is supplied by light-to-digital signal converter 1.10 to an external pin (not shown).

Light-to-digital signal converter 1.10 also includes electrostatic discharge (ESD) protection circuits 1.12, 1.14, 1.16, 1.18, and 1.20–1.22 coupled to the external pins carrying signals OE, S0–S3, V_CC, and OUT, respectively.

Photodiode array 1.24 includes 100 identical photodiodes arranged in a 10 by 10 array. Photodiode array 1.24 has three sections 1.24₁, 1.24₂, and 1.24₃. Section 1.24₁ includes a single photodiode; section 1.24₂ includes nine photodiodes connected in parallel; and section 1.24₃ includes ninety photodiodes connected in parallel. Sections 1.24₁, 1.24₂, and 1.24₃ are coupled to receive signal G_ND and produce output signals X1, X9, and X90, respectively, each having a current that is proportional to light incident on that photodiode section.

Fuse circuit 1.30 contains polysilicon fuses that can be selectively blown in response to external signals PAD1–PAD4 and COMMON applied during the trim at probe manufacturing step to produce trim signals TR0–TR3 that are supplied to current-to-digital signal converter 1.28. Signals PAD1–PAD4 and COMMON are supplied by way of pads (not shown) that are not coupled to pins extending from the package in which light-to-digital signal converter 1.10 is contained but are available at probe prior to packaging to generate trim signals TR0–TR3 that set the full scale operating frequency of light-to-digital signal converter 1.10.

Control circuit 1.26 receives signals V_CC, S0, S1, S2, S3, OE, OSC, and G_ND as inputs and produces signals OUT, SEL1, SEL9, SEL90, SELVBE, SELDVBE, PD, PDB, and SELEXTI as outputs.

Control circuit 1.26 decodes user supplied programming signals S0 and S1 to selectively place light-to-digital signal converter 1.10 in a power-down mode, select one of three sensitivity ranges for light-to-digital signal converter 1.10, or to place light-to-digital signal converter 1.10 in a test mode.

Control circuit 1.26 produces a high (i.e. logic "1" value) output signal PD and a low (i.e. logic "0" value) output signal PDB in response to signals S0 and S1 being low to place light-to-digital signal converter 1.10 in a power-down mode. Control circuit 1.26 produces a low output signal PD and a high output signal PDB in response to either of signals S0 or S1 being high indicating that light-to-digital signal converter 1.10 is not in the power-down mode.

Control circuit 1.26 produces a high output signal SEL1 and low output signals SEL9 and SEL90 in response to signals S0 and S1 being high and low, respectively, to select a first sensitivity range corresponding to only the output of section 1.24₁ of photodiode array 1.24. The first sensitivity range is therefore the output of only a single photodiode.

Control circuit 1.26 produces high output signals SEL1 and SEL9 and a low output signal SEL90 in response to signals S0 and S1 being low and high, respectively, to select a second sensitivity range corresponding to the outputs of sections 1.24₁ and 1.24₂ of photodiode array 1.24 added together. The second sensitivity range is therefore the output of one plus nine (i.e. ten) photodiodes.

Control circuit 1.26 produces high output signals SEL1, SEL9 and SEL90 in response to signals S0 and S1 being high to select a third sensitivity range corresponding to the outputs of sections 1.24₁, 1.24₂, and 1.24₃ of photodiode array 1.24 added together. The third sensitivity range is therefore the output of one plus nine plus ninety (i.e. one hundred) photodiodes.

Control circuit 1.26 produces high output signals SELEXTI and SELDVBE in response to signal S0 exceeding a test mode select voltage of about 1.5 times V_CC and signal S1 being low in order to place light-to-digital signal converter 1.10 in a first test mode. Control circuit 1.26 produces high output signals SELEXTI and SELVBE and low output signal SELDVBE in response to signal S1 exceeding the test mode select voltage of about 1.5 times V_CC and signal S0 being low in order to place light-to-digital signal converter 1.10 in a second test mode. Control circuit 1.26 produces high output signals SELEXTI, SELDVBE and SELVBE in response to signals S0 and S1 exceeding the test mode select voltage of about 1.5 times V_CC in order to place light-to-digital signal converter 1.10 in a third test mode.

Control circuit 1.26 decodes user supplied programming signals S2 and S3 to scale the full scale output frequency of light-to-digital signal converter 1.10 by one of four preset values 1, 2, 10, or 100. Control circuit 1.26 receives signal OSC having a frequency proportional to the intensity of light incident on the photodiode array from current-to-digital signal converter 1.28. In response to signals S2 and S3 being low, control circuit 1.26 scales signal OSC by the value 1 to produce signal OUT that has a frequency equal to the frequency of signal OSC. In response to signal S2 being high and signal S3 being low, control circuit 1.26 scales signal OSC by the value 2 to produce signal OUT that has a frequency equal to that of signal OSC divided by 2. In response to signal S2 being low and signal S3 being high, control circuit 1.26 scales signal OSC by the value 10 to produce signal OUT that has a frequency equal to that of signal OSC divided by 10. In response to signals S2 and S3 being high, control circuit 1.26 scales signal OSC by the value 100 to produce signal OUT that has a frequency equal to that of signal OSC divided by 100.

Current-to-digital signal converter 1.28 receives signals V_CC, SEL1, SEL9, SEL90, SELVBE, SELDVBE, PD, PDB, TR0, TR1, TR2, TR3, EXTI, SELEXTI, X1, X9, X90, and G_ND as inputs and produces signal OSC as an output.

Current-to-digital signal converter 1.28 uses a switched-capacitor charge metering technique to convert current to frequency. Signals SEL1, SEL9, and SEL90 control which of photocurrent signals X1, X9, and X90 are converted to a frequency signal OSC by current-to-digital signal converter 1.28. Signals TR0–TR3 trim capacitors used in the switched-capacitor charge metering technique by current-to-digital signal converter 1.28 to a value that will assure that the accuracy of the current to frequency conversion is within a desired tolerance. Power-down signals PD and PDB control whether or not current-to-digital signal converter 1.28 is placed in the power-down mode. Signals SELVBE, SELDVBE, and SELEXTI control whether testing of current-to-digital signal converter 1.28 is enabled. Signal EXTI is an external test current supplied during testing in the third test mode via the external pin that supplies output enable signal OE during normal operation.

Figure 2:
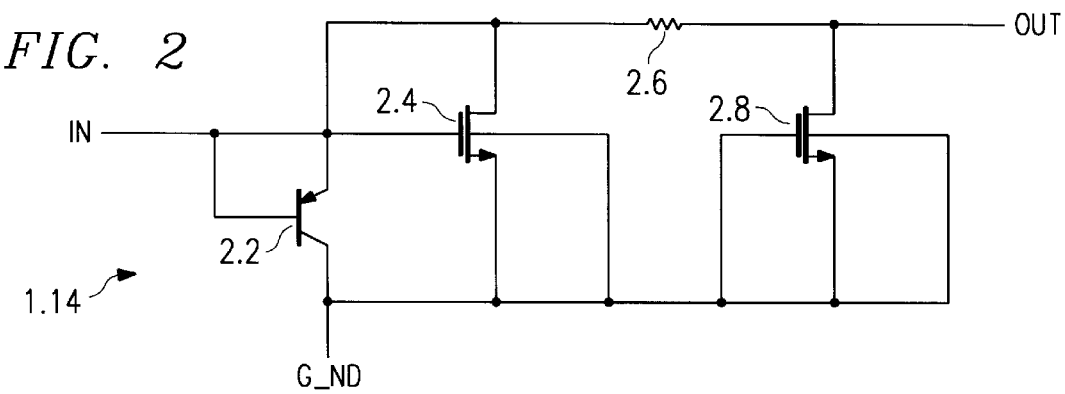
FIG. 2 is an electrical schematic diagram of input electrostatic discharge (ESD) protection circuit 1.14 of FIG. 1.

FIG. 2 is an electrical schematic diagram of ESD protection circuit 1.14 of FIG. 1. ESD protection circuit 1.14 has an input node IN that receives signal S0 from an external pin (not shown) and an output node OUT that supplies signal S0 to control circuit 1.26 of FIG. 1. ESD protection circuit 1.14 includes PNP transistor 2.2, n-channel transistors 2.4 and 2.8, and resistor 2.6. In response to an ESD voltage at node IN, transistors 2.2 and 2.4 break down to shunt the ESD current to ground at node G_ND. Transistor 2.8 also breaks down to clamp node OUT to a low voltage. Resistor 2.6 is provided to limit the current through transistor 2.8.

In a preferred embodiment, input ESD protection circuits 1.12, 1.16, 1.18, and 1.20 are identical to circuit 1.14. Other types of ESD protection circuits may be used. An alternate circuit that may be used as ESD protection circuit 1.12 is shown in FIG. 3.

Figure 3:
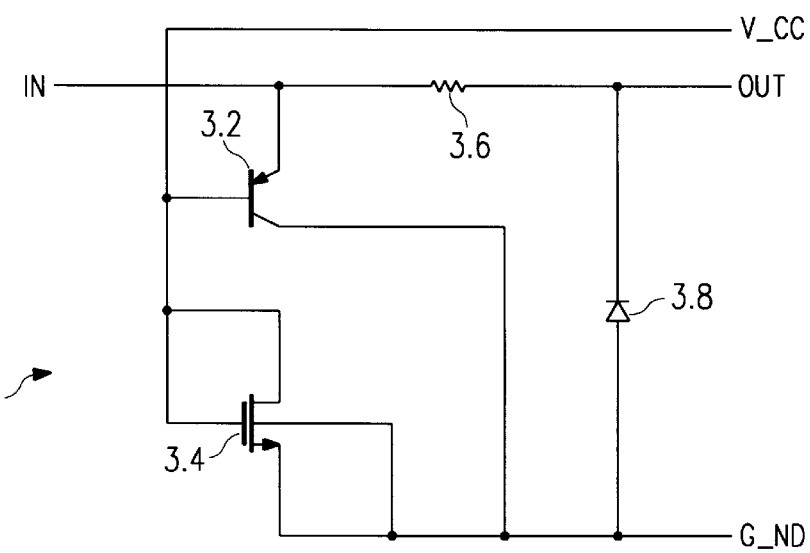
FIG. 3 is an electrical schematic diagram of ESD protection circuit 1.12 of FIG. 1.

FIG. 3 is an electrical schematic diagram of an alternate version of ESD protection circuit 1.12 of FIG. 1. ESD protection circuit 1.12 has an input node IN that receives a signal OE or an optional test-mode current signal EXTI from an external pin (not shown) and an output node OUT that supplies the received signal to control circuit 1.26 and current-to-digital signal converter 1.28 of FIG. 1. ESD protection circuit 1.12 includes PNP transistor 3.2, n-channel transistor 3.4, resistor 3.6, and diode 3.8. In response to a positive ESD voltage at node IN, transistor 3.2 and transistor 3.4 conduct to shunt the ESD current to ground at node G_ND. Diode 3.8 is provided to protect control circuit 1.26 and current-to-digital signal converter circuit 1.28, which are coupled to node OUT, from negative ESD voltages received at node IN. Resistor 3.6 limits the current through diode 3.8.

Figure 4:
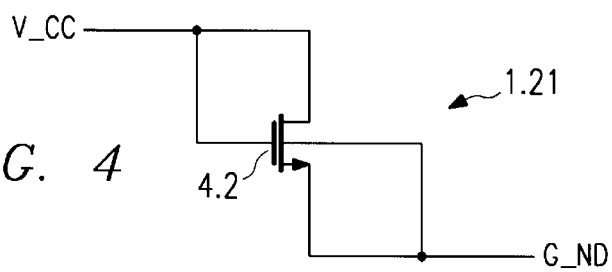
FIG. 4 is an electrical schematic diagram of ESD protection circuit 1.21 of FIG. 1.

FIG. 4 is an electrical schematic diagram of ESD protection circuit 1.21 of FIG. 1. ESD protection circuit 1.21 includes n-channel transistor 4.2 having its gate and drain coupled to node V_CC, which is coupled to a power supply via an external pin (not shown), and its source coupled to circuit ground at node G_ND. In response to an ESD voltage at node V_CC, transistor 4.2 breaks down to shunt the ESD current to ground at node G_ND.

Figure 5:
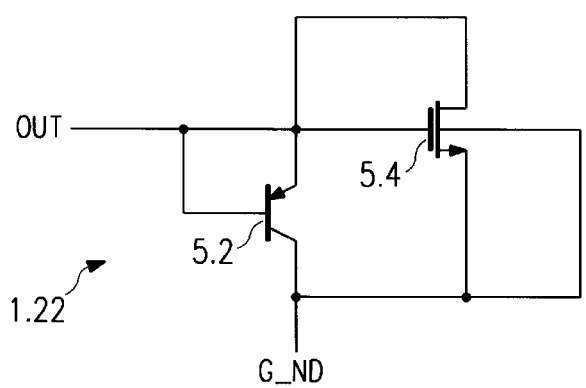
FIG. 5 is an electrical schematic diagram of ESD protection circuit 1.22 of FIG. 1.

FIG. 5 is an electrical schematic diagram of ESD protection circuit 1.22 of FIG. 1. ESD protection circuit 1.22 is coupled between a node OUT and circuit ground at node G_ND. Node OUT coupled to the external output pin (not shown) that receives the output signal of light-to-digital signal converter 1.10 from control circuit 1.26. ESD protection circuit 1.22 includes PNP transistor 5.2 and n-channel transistor 5.4. In response to an ESD voltage at node OUT, transistors 5.2 and 5.4 break down to shunt the ESD current to ground at node G_ND.

Figure 6:
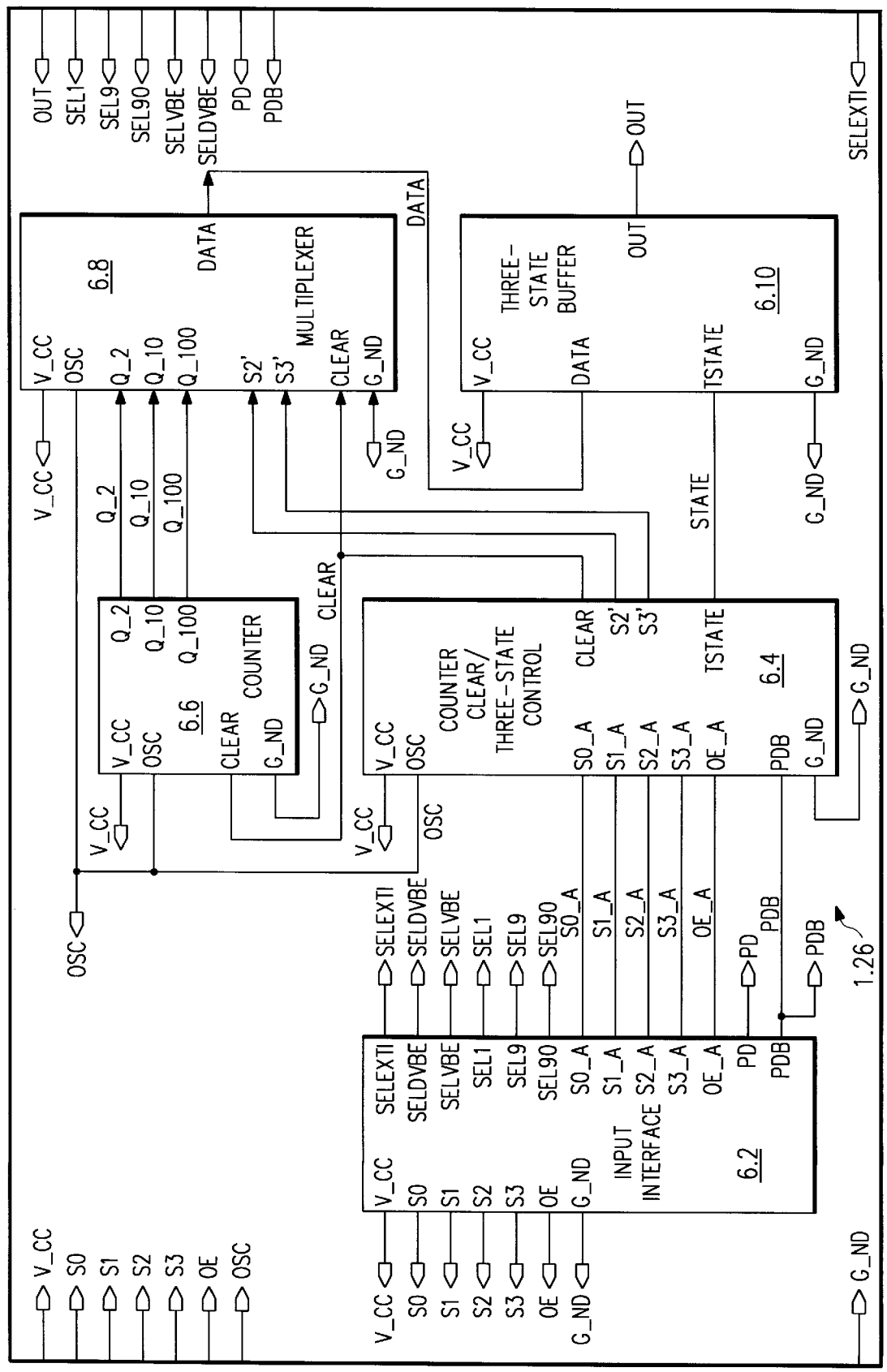
FIG. 6 is a block diagram showing control circuit 1.26 of FIG. 1 in more detail.

FIG. 6 is a block diagram showing control circuit 1.26 of FIG. 1 in more detail. Control circuit 1.26 includes input interface circuit 6.2, counter clear/three-state control circuit 6.4, counter circuit 6.6, multiplexer circuit 6.8, and three-state buffer circuit 6.10.

Input interface circuit 6.2 receives user supplied input signals S0–S3 and OE from external pins and produces output signals SELEXTI, SELDVBE, SELVBE, SEL1, SEL9, SEL90, S0_A, S1_A, S2_A, S3_A, OE_A, PD, and PDB. Output signals PD, PDB, SELEXTI, SELDVBE, SELVBE, SEL1, SEL9, and SEL90 are supplied to current-to-digital signal converter 1.28. Output signals S0_A, S1_A, S2_A, S3_A, OE_A, and PDB are supplied to counter clear/three-state control circuit 6.4. Input interface circuit 6.2 accepts CMOS level input signals and can be optionally reconfigured to accept TTL level input signals.

Input interface circuit 6.2 decodes user programmable input signals S0 and S1 to select either a power-down mode, one of three test modes, or one of three different sensitivities of light-to-digital signal converter 1.10. In the power-down mode, power consumption by light-to-digital signal converter 1.10 is reduced. In the test modes, operation of converter 1.10 can be tested without exposure to light and bandgap voltages generated in current-to-digital signal converter 1.28 for use in the charge metering switched capacitor conversion technique can be tested. The three different sensitivities include a first sensitivity determined by the photocurrent of a single photodiode, a second sensitivity determined by the photocurrent of 10 photodiodes, and a third sensitivity determined by the photocurrent of 100 photodiodes.

When input signals S0 and S1 are low (i.e. have a logic "0" value), input interface circuit 6.2 selects the power-down mode by producing output signals PDB and PD that are low and high (i.e. has a logic "1" value), respectively. Input interface circuit 6.2 also produces outputs signals S0_A, S1_A, S2_A, S3_A, OE_A, SEL1, SEL9, SEL90, and SELEXTI that are low and output signals SELDVBE and SELVBE that are high in the power-down mode.

When input signal S0 exceeds a predetermined test mode select voltage of approximately 1.5 times V_CC and input signal S1 is low, input interface circuit 6.2 selects a first test mode by producing output signals SELEXTI and SELDVBE that are high and output signals SEL1, SEL9, SEL90, and SELVBE that are low. Input interface circuit 6.2 also produces output signals PDB and S0_A that are high, output signals PD and S1_A that are low, and output signals S2_A and S3_A are the logical equivalent of input signals S2 and S3 in the first test mode.

When input signal Si exceeds a predetermined test mode select voltage of approximately 1.5 times V_CC and input signal S0 is low, input interface circuit 6.2 selects a second test mode by producing output signals SELEXTI and SELVBE that are high and output signals SEL1, SEL9, SEL90, and SELDVBE that are low. Input interface circuit 6.2 also produces output signals PDB and S1_A that are high, output signals PD and S0_A that are low, and output signals S2_A and S3_A that are the logical equivalent of input signals S2 and S3 in the second test mode.

When input signals S0 and S1 exceed a predetermined test mode select voltage of approximately 1.5 times V_CC, input interface circuit 6.2 selects a third test mode by producing output signals SELEXTI, SELDVBE, and SELVBE that are high and output signals SEL1, SEL9, SEL90, and SELDVBE that are low. Input interface circuit 6.2 also produces output signals PDB, S0_A, and S1_A that are high, output signal PD that is low, and output signals S2_A and S3_A are the logical equivalent of input signals S2 and S3 in the third test mode.

Input interface circuit 6.2 selects a low sensitivity corresponding to one photodiode in array 1.24 of FIG. 1 when signal S0 is high, but does not exceed the predetermined test mode select voltage, and signal S1 is low. Input interface circuit 6.2 selects the low sensitivity by producing output signal SEL1 that is high and output signals SEL9, SEL90, and SELEXTI that are low. Input interface circuit 6.2 also produces output signals S0_A, SELDVBE, SELVBE, and PDB that are high, output signals S1_A and PD that are low, and output signals S2_A and S3_A are the logical equivalent of input signals S2 and S3 in this situation.

An intermediate sensitivity corresponding to ten photodiodes in array 1.24 of FIG. 1 is selected when signal S1 is high, but does not exceed the predetermined test mode select voltage, and signal S0 is low. Input interface circuit 6.2 selects the intermediate sensitivity by producing output signals SEL1 and SEL9 that are high and output signals SEL90 and SELEXTI that are low. Input interface circuit 6.2 also produces output signals S1_A, SELDVBE, SELVBE, and PDB that are high, output signals S0_A and PD that are low, and output signals S2_A and S3_A are the logical equivalent of input signals S2 and S3 in this situation.

A high sensitivity corresponding to one hundred photodiodes in array 1.24 of FIG. 1 is selected when signals S0_A and S1_A are high but do not exceed the predetermined test mode select voltage. Input interface circuit 6.2 selects the high sensitivity by producing output signals SEL1, SEL9, and SEL90 that are high and output signal SELEXTI that is low. Input interface circuit 6.2 also produces output signals S0_A, S1_A, SELDVBE, SELVBE, and PDB that are high, output signal PD that is low, and output signals S2_A and S3_A are the logical equivalent of input signals S2 and S3 in this situation.

Counter clear/three-state control circuit 6.4 receives input signal OSC from current-to-digital signal converter 1.28 and input signals S0_A–S3_A, OE_A, and PDB from input interface circuit 6.2. Counter clear/three-state control circuit 6.4 supplies output signals S2' and S3' to multiplexer circuit 6.8, output signal CLEAR to counter circuit 6.6 and multiplexer circuit 6.8 and output signal TSTATE to three-state buffer circuit 6.10.

Counter clear/three-state control circuit 6.4 is responsive to input signals S0_A and S1_A being low (i.e. when light-to-digital signal converter 1.10 is in the power-down mode) to produce output signals S2' and S3' that are high irrespective of the value of input signals S2_A and S3_A. When at least one of input signals S0_A and S1_A is high, (i.e. light-to-digital signal converter 1.10 is not in the power-down mode), counter clear/three-state control circuit 6.4 produces output signals S2' and S3' that either already have the same logic state as input signals S2_A and S3_A, respectively, or will have the same logic state upon receipt of the next rising edge of pulse signal OSC. Pulse signal OSC is received from current-to-digital signal converter 1.28 of FIG. 1 and has a frequency related to the intensity of light incident on photodiode array 1.24. Output signals S2' and S3' are supplied to multiplexer 6.8 where they are decoded to control selection of the full scale frequency output of light-to-digital signal converter 1.10.

Counter clear/three-state control circuit 6.4 produces three-state control signal TSTATE in response to input signals OE_A and PDB. Output signal TSTATE is low when output enable input signal OE_A is low (i.e. when output is enabled) and input signal PDB is high (i.e. when light-to-digital signal converter 1.10 is not in the power-down mode). Output signal TSTATE is high whenever input signal OE_A is high (i.e. when output is disabled) or input signal PDB is low (i.e. when light-to-digital signal converter 1.10 is in the power-down mode). Output signal TSTATE is supplied to three-state buffer 6.10 to selectively cause the output of light-to-digital signal converter 1.10 to go to a high impedance state. When output signal TSTATE is low, three-state buffer 6.10 passes input signal DATA to its output. When output signal TSTATE is high, the output of three-state buffer 6.10 of FIG. 6 is in a high impedance state.

Counter clear/three-state control circuit 6.4 also produces output signal CLEAR in response to input signals OSC, S0_A–S3_A, and OE_A. Output signal CLEAR is high whenever input signal OE_A is low (i.e. output is enabled) and input signals S0_A–S3_A are constant or unchanging. Output signal CLEAR is low whenever input signal OE_A is high (i.e. the output is disabled) or when input signals S0_A and S1_A are low (i.e. light-to-digital signal converter 1.10 is in the power-down mode).

When input signal OE_A is low (i.e. the output is enabled) and light-to-digital signal converter 1.10 is not in the power-down mode (i.e. no more than one of input signals S0_A and S1_A is low), output signal CLEAR also goes low for a brief time period following a change in state of any one of signals S0_A–S3_A to select a different sensitivity or different full scale output frequency. In this situation, output signal CLEAR stays low until the next rising edge of input signal OSC at which time it goes high again. The generation of signal CLEAR having a low value following a change in selected sensitivity or full scale output frequency, as reflected by a change in state of any one of signals S0_A–S3_A, until the next rising edge of input signal OSC minimizes the delay between change in input signals S0–S3 and a valid output signal (signal OUT from three-state buffer 6.10) from light-to-digital signal converter 1.10.

Output signal CLEAR is supplied to multiplexer 6.8 of FIG. 6. When output signal CLEAR is low (when the output of light-to-digital signal converter 1.10 is disabled, when converter is in the power-down mode, or briefly following a change in state of any of signals S0_A–S3_A to select a different sensitivity or different full scale output frequency) the output of multiplexer 6.8 is forced low. Output signal CLEAR is also supplied to counter 6.6 of FIG. 6. When output signal CLEAR is low, counter 6.6 is cleared.

Counter circuit 6.6 receives signal OSC from current-to-digital signal converter 1.28 of FIG. 1. When signal CLEAR received from counter clear/three-state control circuit 6.4 is high, counter circuit 6.6 divides signal OSC by 2, 10, and 100 to produce signals Q_2, Q_10, and Q_100, respectively, that are supplied to multiplexer circuit 6.8. In this case, signals Q_2, Q_10, and Q_100 are pulse signals having frequencies of ½, ⅒, and ¹⁄₁₀₀ of signal OSC, respectively. Signal CLEAR is high whenever input signal OE is low (i.e. output is enabled) and input signals S0–S3 are constant or unchanging.

When signal CLEAR received from counter clear/three-state control circuit 6.4 is low, counter circuit 6.6 is cleared forcing signals Q_2, Q_10, and Q_100 low. Signal CLEAR is low whenever input signal OE is high (i.e. output is disabled) or when light-to-digital signal converter 1.10 is in the power-down mode (i.e. input signals S0 and S1 are low). When output is enabled and light-to-digital signal converter 1.10 is not in the power-down mode, output signal CLEAR also goes low for a brief time period following a change in state of any one of signals S0–S3 to select a different sensitivity or different full scale output frequency.

Multiplexer circuit 6.8 receives input signals S2', S3', and CLEAR from counter clear/three-state control circuit 6.4, input signal OSC from current-to-digital signal converter 1.28 of FIG. 1, and input signals Q_2, Q_10, Q_100 from counter 6.6. Multiplexer circuit 6.8 supplies output signal DATA to three-state buffer circuit 6.10. Multiplexer 6.8 decodes input signal CLEAR to determine if the user programmed full scale frequency output, which is one of input signals OSC, Q_2, Q_10, or Q_100, should be output.

When signal CLEAR goes low temporarily after a change in any of input signals S0–S3 to select a different sensitivity or different full scale output frequency, the output of multiplexer 6.8, signal DATA, goes low irrespective of the value of programming signals S2' and S3' to prevent light-to-digital signal converter 1.10 from generating an output signal OUT that is ambiguous. Signal CLEAR is also low when the output of light-to-digital signal converter 1.10 is disabled or when light-to-digital signal converter 1.10 is in the power-down mode to force signal DATA low.

When signal CLEAR is high, multiplexer 6.8 decodes programming signals S2' and S3' to determine the full scale output frequency programmed by a user and outputs either signal Q_2, signal Q_10, signal Q_100, or the complement of signal OSC. Where signals S2' and S3' have logic 0 values and signal CLEAR has a logic 1 value, signal DATA is equal to the complement of signal OSC. Where signal S3' has a logic 0 value and signals S2' and CLEAR have logic 1 values, signal DATA is equal to Q_2. Where signal S2' has a logic 0 value and signals S3' and CLEAR have logic 1 values, signal DATA is equal to Q_10. Where signals S2', S3' and CLEAR have logic 1 values, signal DATA is equal to Q_100.

Three-state buffer circuit 6.10 receives input signals TSTATE and DATA and produces an output signal OUT which is the output signal of light-to-digital signal converter 1.10 of FIG. 1. Signal TSTATE is received from counter-clear/three-state control circuit 6.4 and signal DATA is received from multiplexer 6.8. In the low impedance mode, signal TSTATE is low to permit output signal OUT be equivalent to input signal DATA. Output signal TSTATE is low when the output of light-to-digital signal converter 1.10 is enabled and when light-to-digital signal converter 1.10 is not in the power-down mode.

In the three-state mode, signal TSTATE is high to force output signal OUT into a high impedance state. Output signal TSTATE is high when the output of light-to-digital signal converter 1.10 is disabled or when light-to-digital signal converter 1.10 is in the power-down mode.

Figure 7:
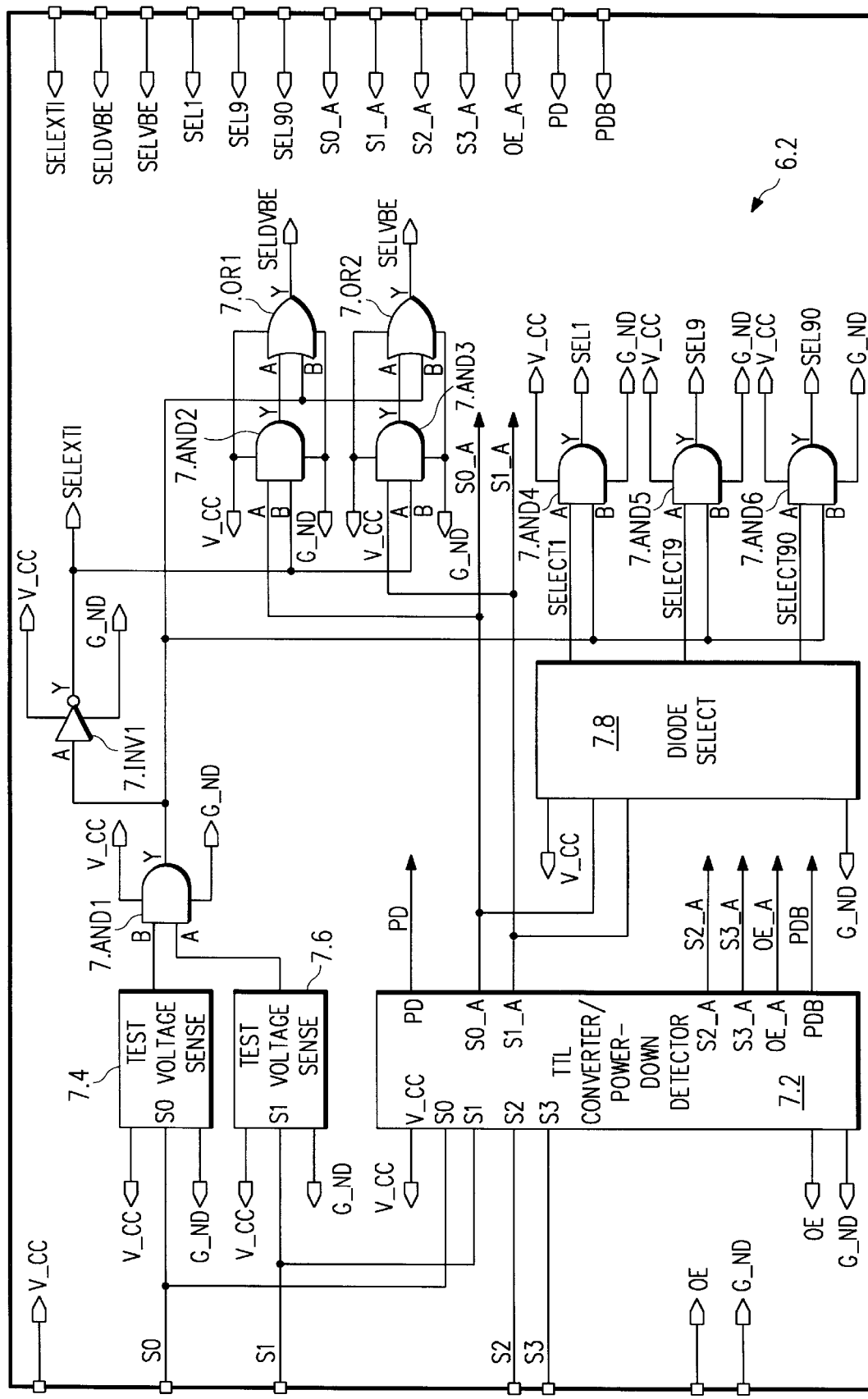
FIG. 7 is an electrical schematic diagram in partial block form of the input interface circuit 6.2 of FIG. 6.

FIG. 7 is an electrical schematic diagram of input interface circuit 6.2 of FIG. 6. Input interface circuit 6.2 receives input signals S0–S3 and OE and produces output signals SELEXTI, SELDVBE, SELVBE, SEL1, SEL9, SEL90, S0_A, S1_A, S2_A, S3_A, OE_A, PD, and PDB.

User programmable input signals S0 and S1 are decoded by input interface circuit 6.2 to select either the power down mode, a test mode, or one of three different sensitivities of light-to-digital signal converter 1.10.

The power-down mode is selected when signals S0 and S1 are low. A first test mode is selected when signal S0 exceeds a predetermined test mode select voltage that is approximately 1.5 times V_CC and signal S1 is low (has a logic 0 value). A second test mode is selected when signal S1 exceeds the predetermined test mode select voltage and signal S0 is low. A third test mode is selected when signals S0 and S1 exceed the predetermined test mode select voltage. A low sensitivity corresponding to one photodiode in array 1.24 of FIG. 1 is selected when signal S0 is high (has a logic 1 value) and signal S1 is low. An intermediate sensitivity corresponding to ten photodiodes in array 1.24 of FIG. 1 is selected when signal S1 is high and signal S0 is low. A high sensitivity corresponding to one hundred photodiodes in array 1.24 of FIG. 1 is selected when signals S0 and S1 are high.

Input interface circuit 6.2 includes TTL converter circuit/power-down detector 7.2, test voltage sense circuits 7.4 and 7.6, diode select circuit 7.8, AND gates 7.AND1-7.AND6, inverter 7.INV1, and OR gates 7.OR1 and 7.OR2.

TTL converter/power-down detector circuit 7.2 receives input signals S0–S3 and OE supplied from external pins and generates output signals PD, S0_A, S1_A, S2_A, S3_A, OE_A, and PDB. TTL-converter/power-down detector 7.2 decodes user programmed input signals S0 and S1 to determine if light-to-digital signal converter 1.10 should be placed in the power-down mode of operation. TTL-converter/power-down detector 7.2 also provides optional compatibility with TTL level input signals.

In the power-down mode, input signals S0 and S1 are both low and TTL-converter/power-down detector 7.2 supplies output signals PDB and PD which are low and high, respectively, to current-to-digital signal converter 1.28 of FIG. 1. In the power-down mode, TTL-converter/power-down detector 7.2 forces output signals S2_A, S3_A, and OE_A high irrespective of the values of input signals S2, S3, and OE. In both power-down and non-power-down modes, output signals S0_A and S1_A are the logical equivalent of input signals S0 and S1.

When at least one of input signals S0 and S1 is high, light-to-digital signal converter 1.10 is not in the power-down mode and TTL-converter/power-down detector 7.2 produces output signals PDB and PD which are high and low, respectively. In the non-power-down mode, output signals S2_A, S3_A, and OE_A are the logical equivalent of input signals S2, S3, and OE, respectively.

Test voltage sense circuit 7.4 receives signal S0 and supplies an output signal to a first input of AND gate 7.AND1. Test voltage sense circuit 7.4 senses whether signal S0 supplied by a user exceeds a predetermined test mode select voltage of approximately 1.5 times V_CC. When signal S0 is less than the predetermined test mode select voltage, test voltage sense circuit 7.4 produces a high output signal. When signal S0 exceeds the predetermined test mode select voltage, test voltage sense circuit 7.4 produces a low output signal.

Test voltage sense circuit 7.6 receives signal S1 and supplies an output signal to a second input of AND gate 7.AND1. Test voltage sense circuit 7.6 senses whether signal S1 supplied by a user exceeds a predetermined test mode select voltage of approximately 1.5 times V_CC. When signal S1 is less than the predetermined test mode select voltage, test voltage sense circuit 7.6 produces a high output signal. When signal S1 exceeds the predetermined test mode select voltage, test voltage sense circuit 7.6 produces a low output signal.

When neither signal S0 nor signal S1 exceeds the predetermined test mode select voltage, the output signals of test voltage sense circuits 7.4 and 7.6 are high forcing the output of gate 7.AND1 high. In response to the high output of gate 7.AND1, inverter 7.INV1 produces output signal SELEXTI which is low indicating that a test mode has not been selected. In response to the high output of gate 7.AND1, OR gates 7.OR1 and 7.OR2 produce output signals SELDVBE and SELVBE, respectively, which are high but since signal SELEXTI is low neither the first test mode, second test mode, nor third test mode is selected.

When signal S0 exceeds the predetermined test mode select voltage and signal S1 is low, the output signals of test voltage sense circuits 7.4 and 7.6 are low and high, respectively, forcing the output of gate 7.AND1 low. In response to the low output of gate 7.AND1, inverter 7.INV1 produces output signal SELEXTI which is high indicating that a test mode has been selected.

A logic circuit made up of gates 7.AND2 and 7.OR1 is responsive to the low output of gate 7.AND1, high output of gate 7.INV1 and signal S0_A from TTL converter 7.2 having a high value to produce output signal SELDVBE having a high value. A logic circuit made up of gates 7.AND3 and 7.OR2 is responsive to the low output of gate 7.AND1, high output of gate 7.INV1 and signal S1_A from TTL converter 7.2 having a low value to produce output signal SELVBE having a low value. The high values of output signals SELEXTI and SELDVBE and low value of output signal SELVBE indicate that the first test mode has been selected.

When signal S1 exceeds the predetermined test mode select voltage and signal S0 is low, the output signals of test voltage sense circuits 7.6 and 7.4 are low and high, respectively, forcing the output of gate 7.AND1 low. In response to the low output of gate 7.AND1, inverter 7.INV1 produces output signal SELEXTI which is high indicating that the test mode has been selected.

The logic circuit made up of gates 7.AND3 and 7.OR2 is responsive to the low output of gate 7.AND1, high output of gate 7.INV1 and signal S1_A from TTL converter 7.2 having a high value to produce output signal SELVBE having a high value. The logic circuit made up of gates 7.AND2 and 7.OR1 is responsive to the low output of gate 7.AND1, high output of gate 7.INV1 and signal S0_A from TTL converter 7.2 having a low value to produce output signal SELDVBE having a low value. The high values of output signals SELEXTI and SELVBE and low value of output signal SELDVBE indicate that the second test mode has been selected.

When signals S0 and S1 both exceed the predetermined test mode select voltage, the output signals of test voltage sense circuits 7.6 and 7.4 are both low, forcing the output of gate 7.AND1 low. In response to the low output of gate 7.AND1, inverter 7.INV1 produces output signal SELEXTI which is high indicating that a test mode has been selected.

The logic circuit made up of gates 7.AND3 and 7.OR2 is responsive to the low output of gate 7.AND1, high output of gate 7.INV1 and signal S1_A from TTL converter 7.2 having a high value to produce output signal SELVBE having a high value. The logic circuit made up of gates 7.AND2 and 7.OR1 is responsive to the low output of gate 7.AND1, high output of gate 7.INV1 and signal S0_A from TTL converter 7.2 having a high value to produce output signal SELDVBE having a high value. The high values of output signals SELEXTI, SELVBE, and SELDVBE indicate that the third test mode has been selected.

Diode select circuit 7.8 decodes signals S0_A and S1_A received from TTL converter/power-down detector 7.2. When signals S0_A and S1_A are low indicating the user has selected the power-down mode, diode select circuit 7.8 produces signals SELECT1, SELECT9, and SELECT 90 having a low value. When signal S0_A is high and signal S1_A is low (indicating the user has selected low sensitivity if light-to-digital signal converter 1.10 is not in a test mode), diode select circuit 7.8 produces signal SELECT1 having a high value and signals SELECT9 and SELECT90 having low values. When signal S0_A is low and signal S1_A is high (indicating the user has selected intermediate sensitivity if light-to-digital signal converter 1.10 is not in a test mode), diode select circuit 7.8 produces signals SELECT1 and SELECT9 having high values and signal SELECT90 having a low value. When signals S0_A and S1_A are high (indicating the user has selected high sensitivity if light-to-digital signal converter 1.10 is not in a test mode), diode select circuit 7.8 produces signals SELECT1, SELECT9 and SELECT90 having high values.

When neither of signals S0 or S1 exceeds the predetermined test mode select voltage indicating that light-to-digital signal converter 1.10 is not in a test mode, the output of gate 7.AND1 is high enabling gates 7.AND4-7.AND6 to produce output signals SEL1, SEL9, and SEL90 that are equal to signals SELECT1, SELECT9, and SELECT90 from diode select circuit 7.8. When either of signals S0 or S1 exceeds the predetermined test mode select voltage indicating that light-to-digital signal converter 1.10 is in a test mode, the output of gate 7.AND1 is low forcing gates 7.AND4-7.AND6 to produce output signals SEL1, SEL9, and SEL90 that are low.

Figure 8:
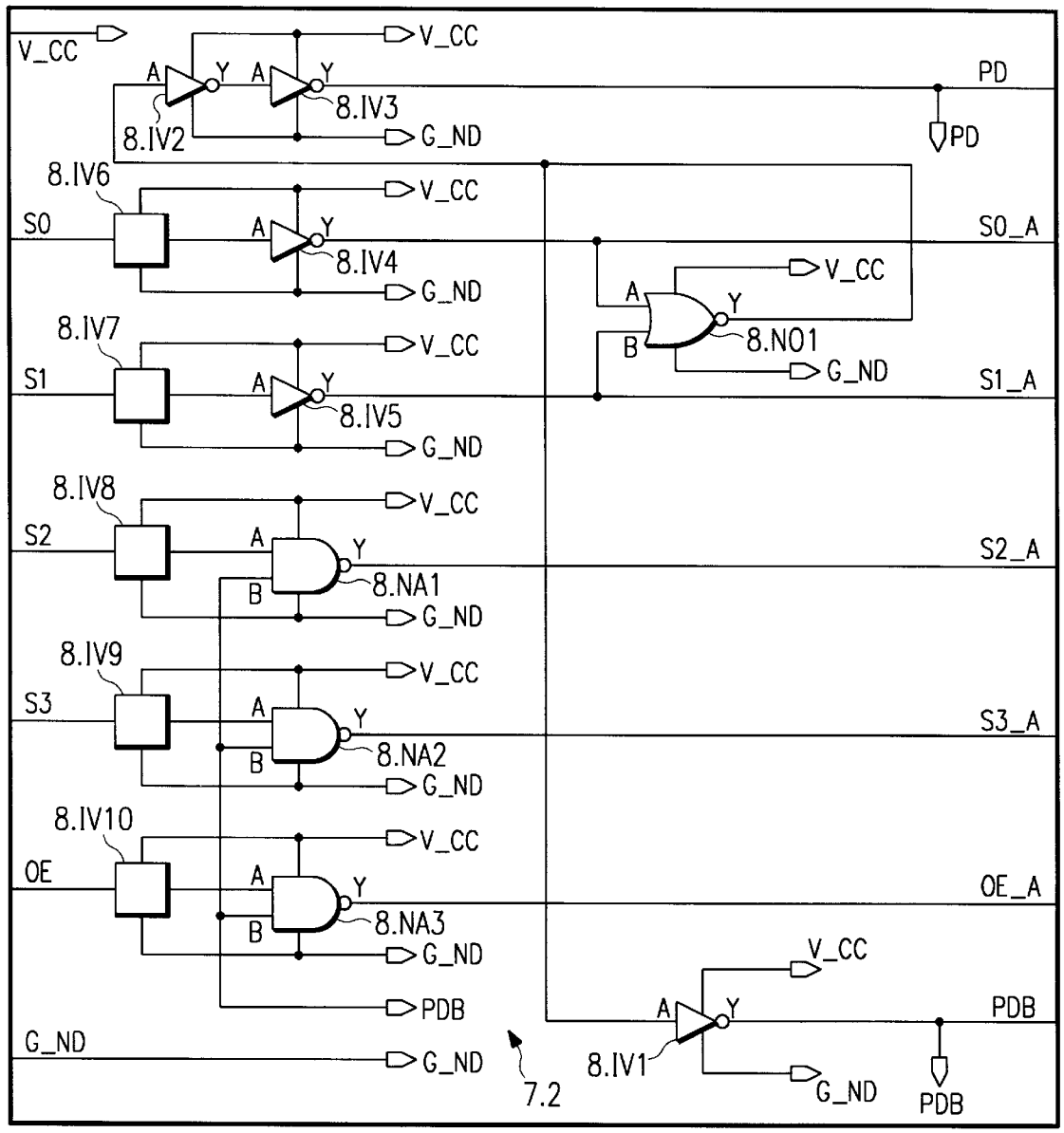
FIG. 8 is an electrical schematic diagram in partial block form of TTL converter circuit 7.2 of FIG. 7.

FIG. 8 is an electrical schematic diagram of TTL-converter/power-down detector 7.2 of FIG. 7. TTL-converter/power-down detector 7.2 receives input signals S0–S3 and OE and generates output signals PD, S0_A, S1_A, S2_A, S3_A, OE_A, and PDB. TTL-converter/power-down detector 7.2 decodes user programmed input signals S0 and S1 to determine if light-digital signal converter 1.10 should be placed in the power-down mode of operation. TTL-converter/power-down detector 7.2 is compatible with CMOS level input signals but can be converted to provide compatibility with TTL level input signals.

TTL-converter/power-down detector 7.2 includes inverters 8.IV1–8.IV10, NAND gates 8.NA1–8.NA3, and NOR gate 8.N01. Inverters 8.IV6–8.IV10 are compatible with CMOS level input signals but can be configured using a metal level option to accept TTL level input signals.

TTL-converter/power-down detector 7.2 decodes input signals S0 and S1 to determine if light-to-digital signal converter 1.10 has been programmed by the user to enter the power-down mode. In the power-down mode, input signals S0 and S1 are both low and TTL-converter/power-down detector 7.2 produces output signals PDB and PD which are low and high, respectively. In response to signal PDB going low, output signals S2_A, S3_A, and OE_A are forced high irrespective of the values of input signals S2, S3, and OE. In both power-down and non-power-down modes, output signal S0_A is the logical equivalent of input signal S0 since it results from passing input signal S0 through inverters 8.IV6 and 8.IV4. In both power-down and non-power-down modes, output signal S1_A output is the logical equivalent of input signal S1 since it results from passing input signal S1 through inverters 8.IV8 and 8.IV5.

When at least one of input signals S0 and S1 is high, light-digital converter 1.10 is not in the power-down mode and TTL-converter/power-down detector 7.2 produces output signals PDB and PD which are high and low, respectively. In response to signal PDB going high, output signals S2_A, S3_A, and OE_A are the logical equivalent of input signals S2, S3, and OE, respectively.

Figure 9:
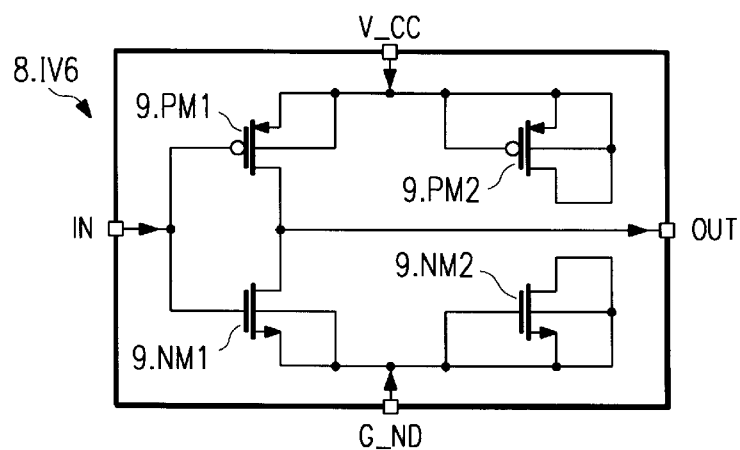
FIG. 9 is an electrical schematic diagram of CM-TTL inverter 8.IV6 of FIG. 8.

FIG. 9 is an electrical schematic diagram of inverter 8.IV6 of FIG. 8. Inverter 8.IV6 includes p-channel field effect transistors (FETs) 9.PM1 and 9.PM2 and n-channel FETs 9.NM1 and 9.NM2. Transistors 9.PM1 and 9.NM1 are connected to receive signal S0 from input terminal IN and supply an inverted S0 signal to output terminal OUT. Transistors 9.PM2 and 9.NM2 are connected so as to be nonfunctional as shown in FIG. 9 when input signal S0 is a CMOS level signal. The gates of transistor 9.PM2 and 9.NM2 can be coupled to the gates of transistors 9.PM1 and 9.NM1, respectively, and the drains of transistors 9.PM2 and 9.NM2 coupled to the drains of transistors 9.PM1 and 9.NM1, respectively, by way of metal level options to provide TTL level compatibility when input signal S0 is a TTL level signal.

Inverters 8.IV7–8.IV10 of FIG. 8 are identical to inverter 8.IV6.

Figure 10:
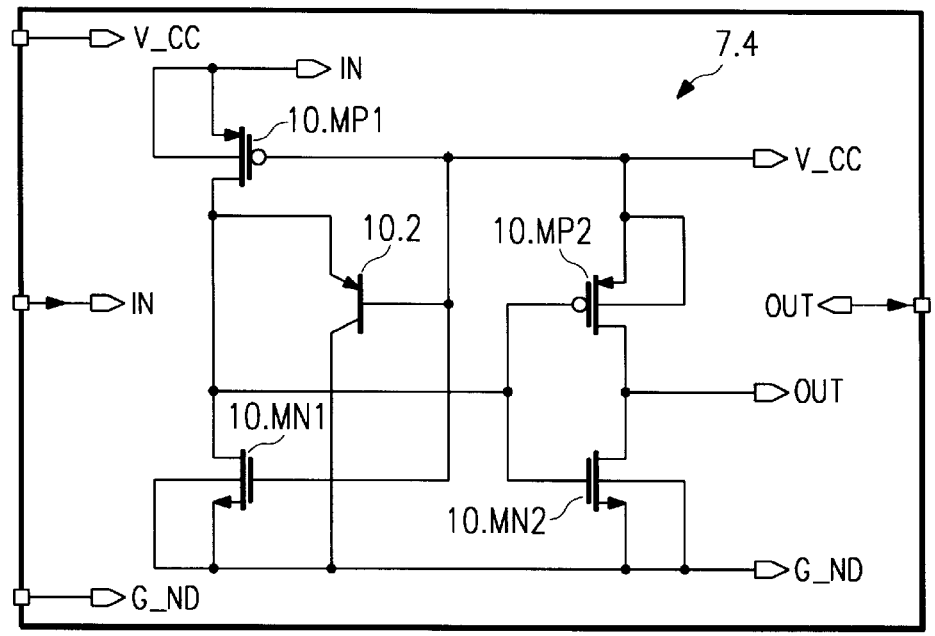
FIG. 10 is an electrical schematic diagram of the test voltage sense circuit 7.4 of FIG. 7.

FIG. 10 is an electrical schematic diagram of test voltage sense circuit 7.4 of FIG. 7. Test voltage sense circuit 7.4 determines when a test mode select voltage is applied by a user desiring to put light-to-digital signal converter 1.10 in a test mode to the external pin supplying signal S0. Test voltage sense circuit 7.4 has an input terminal IN that receives input signal S0 and an output terminal OUT that is connected to AND gate 7.AND1 of FIG. 7. Test voltage sense circuit 7.4 includes p-channel transistors 10.MP1 and 10.MP2, n-channel transistors 10.MN1, and 10.MN2, and PNP transistor 10.2.

During non-test mode operation, the voltages applied to the external pin supplying signal S0 are less than 1.5 times V_CC (i.e. approximately either 0 volts or V_CC). As a result, transistors 10.MP1 and 10.2 are off and transistor 10.MN1 is on bringing node N1 low. With node N1 low, transistor 10.MP2 is on and transistor 10.MN2 is off forcing output terminal OUT high.

During test mode operation, the voltage applied to the external pin supplying signal S0 is 1.5 times V_CC. As a result, transistors 10.MP1 and 10.2 are on and transistor 10.MN1 is off bringing node NM high. With node N1 high, transistor 10.MN2 is on and transistor 10.MP2 is off forcing output terminal OUT low.

Test voltage sense circuit 7.6 of FIG. 7 is identical to test voltage sense circuit 7.4 with the exception that it receives signal S1 at input terminal IN. Test voltage sense circuit 7.6 produces a low output signal at terminal OUT during test mode operation when the voltage applied to the external pin supplying signal S1 exceeds about 1.5 times V_CC and a high output signal at terminal OUT during non-test mode operation when the voltages applied to the external pin supplying signal S1 are less than 1.5 times V_CC.

Figure 11:
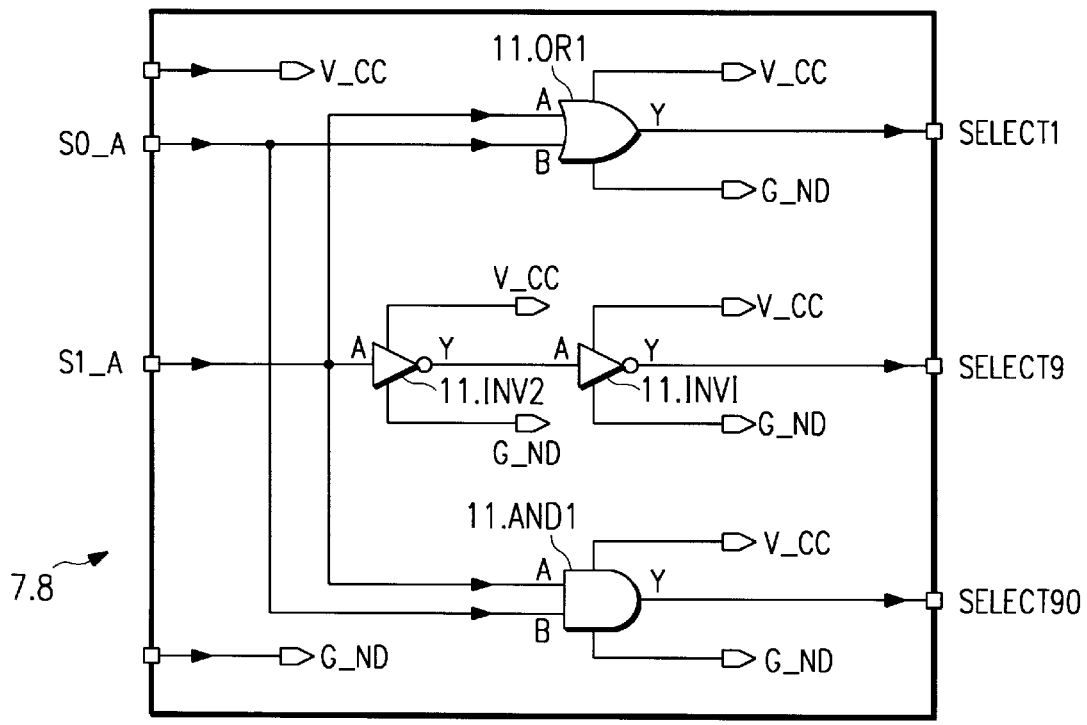
FIG. 11 is an electrical schematic diagram of the diode select circuit 7.8 of FIG. 7.

FIG. 11 is an electrical schematic diagram of diode select circuit 7.8 of FIG. 7. Diode select circuit 7.8 includes OR gate 11.OR1, AND gate 11.AND1, and inverters 11.INV1 and 11.INV2. Diode select circuit 7.8 decodes input signals S0_A and S1_A to produce output signals SELECT1, SELECT9, and SELECT90.

In the power down mode, input signals S0_A and S1_A are low and output signals SELECT1, SELECT9, and SELECT90 produced by diode select circuit 7.8 are low.

When a user selects sensitivity corresponding to a single photodiode, input signal SD_A is high and input signal S1_A is low and diode select circuit 7.8 produces output signal SELECT1 having a high value and output signals SELECT9 and SELECT90 having low values.

When a user selects sensitivity corresponding to a ten photodiodes, input signal S0_A is low and input signal S1_A is high and diode select circuit 7.8 produces output signals SELECT1 and SELECT9 having high values and output signal SELECT90 having a low value.

When a user selects sensitivity corresponding to a one hundred photodiodes, both input signal S0_A and input signal S1_A are high and diode select circuit 7.8 produces output signals SELECT1, SELECT9, and SELECT90 having high values.

Figure 12:
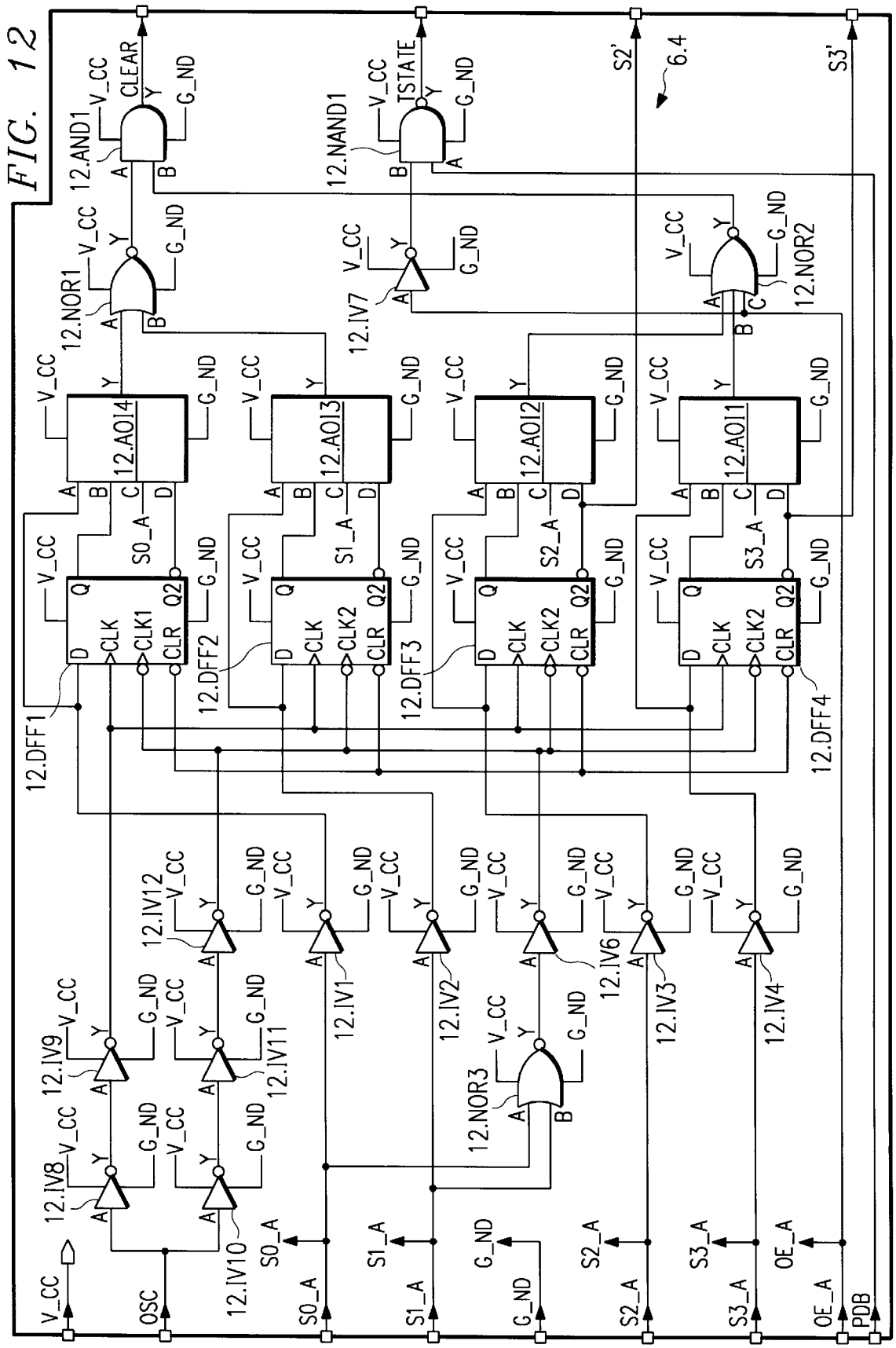
FIG. 12 is an electrical schematic diagram of the counter clear/three-state circuit 6.4 of FIG. 6.

FIG. 12 is an electrical schematic diagram of counter clear/three-state control circuit 6.4 of FIG. 6. Counter clear/three-state control circuit 6.4 receives input signals OSC, S0_A-S3_A, OE_A, and PDB and produces output signals S2', S3', CLEAR and TSTATE.

Counter clear/three-state control circuit 6.4 includes inverters 12.IV1–12.IV4 and 12.IV6–12.IV12, edge-triggered D flip-flops 12.DFF1–12.DFF4, AND-OR-Invert circuits 12.AOI1–12.AOI4, NOR gates 12.NO1–12.NO3, NAND gate 12.NAND1, and gate 12.AND1. AND-OR-Invert circuits 12.AOI1–12.AOI4 provide an output Y that is the complement of the Boolean expression (A·B)+(C·D) where A, B, C, and D are inputs.

Counter clear/three-state control circuit 6.4 produces output signals S2' and S3' at the Q2 outputs of flip-flops 12.DFF3 and 12.DFF4, respectively. When light-to-digital signal converter 1.10 is in the power-down mode (i.e. when S0 and S1 are low), the output of inverter 12.IV6 is low to clear flip-flops 12.DFF1–12.DFF4 forcing their outputs Q and Q2 low and high, respectively. As a result, in the power-down mode output signals S2' and S3' are high irrespective of the value of input signals S2_A and S3_A.

When light-to-digital signal converter 1.10 is not in the power-down mode (i.e. when at least one of S0 and S1 are high), output signals S2' and S3' either already have the same logic state as input signals S2_A and S3_A or will have the same logic state upon receipt of the next rising edge of pulse signal OSC supplied via inverters 12.IV8–12.IV12 to the clock inputs CLK and CLK2 of flip-flops 12.DFF3 and 12.DFF4. Output signals S2' and S3' are supplied to multiplexer 6.8 of FIG. 6 where they are decoded to control selection of the full scale frequency output of light-to-digital signal converter 1.10.

Counter clear/three-state control circuit 6.4 produces three-state control signal TSTATE in response to input signals OE_A and PDB. Output signal TSTATE is low when output enable input signal OE_A is low (i.e. when output is enabled) and input signal PDB is high (i.e. when light-to-digital signal converter 1.10 is not in the power-down mode). Output signal TSTATE is high whenever input signal OE_A is high (i.e. when output is disabled) or input signal PDB is low (i.e. when light-to-digital signal converter 1.10 is in the power-down mode).

Output signal TSTATE is supplied to three-state buffer 6.10 of FIG. 6 where it selectively controls the output of light-to-digital signal converter 1.10. When output signal TSTATE is low, three-state buffer 6.10 of FIG. 6 passes input signal DATA to its output. When output signal TSTATE is high, the output of three-state buffer 6.10 of FIG. 6 is in a high impedance state.

Counter clear/three-state control circuit 6.4 also produces output signal CLEAR in response to input signals OSC, S0_A-S3_A, and OE_A. Output signal CLEAR is high whenever input signal OE_A is low (i.e. output is enabled) and input signals S0_A-S3_A are constant or unchanging. Output signal CLEAR is low whenever input signal OE_A is high (i.e. output is disabled) or when the light-to-digital signal converter 1.10 is in the power-down mode (i.e. S0 and S1 are low).

When the output is enabled and the light-to-digital signal converter 1.10 is not in the power-down mode, output signal CLEAR also goes low for a brief time period following a change in state of any one of signals S0–S3, and thus a change in state of any one of signals S0__A–S3__A, to select a different sensitivity or different full scale output frequency. Following a change in state of any one of signals S0__A–S3__A to select a different sensitivity or different full scale output frequency, output signal CLEAR stays low until the D flip-flops 12.DFF1–12.DFF4 are clocked by the next rising edge of input signal OSC.

Output signal CLEAR is supplied to multiplexer 6.8 of FIG. 6. When output signal CLEAR is low (when the output of light-to-digital signal converter 1.10 is disabled, when converter is in the power-down mode, or briefly following a change in state of any of signals S0__A–S3__A to select a different sensitivity or different full scale output frequency) the output of multiplexer 6.8 is forced low.

Output signal CLEAR is also supplied to counter 6.6 of FIG. 6. When output signal CLEAR is low, counter 6.6 is cleared.

Figure 13:
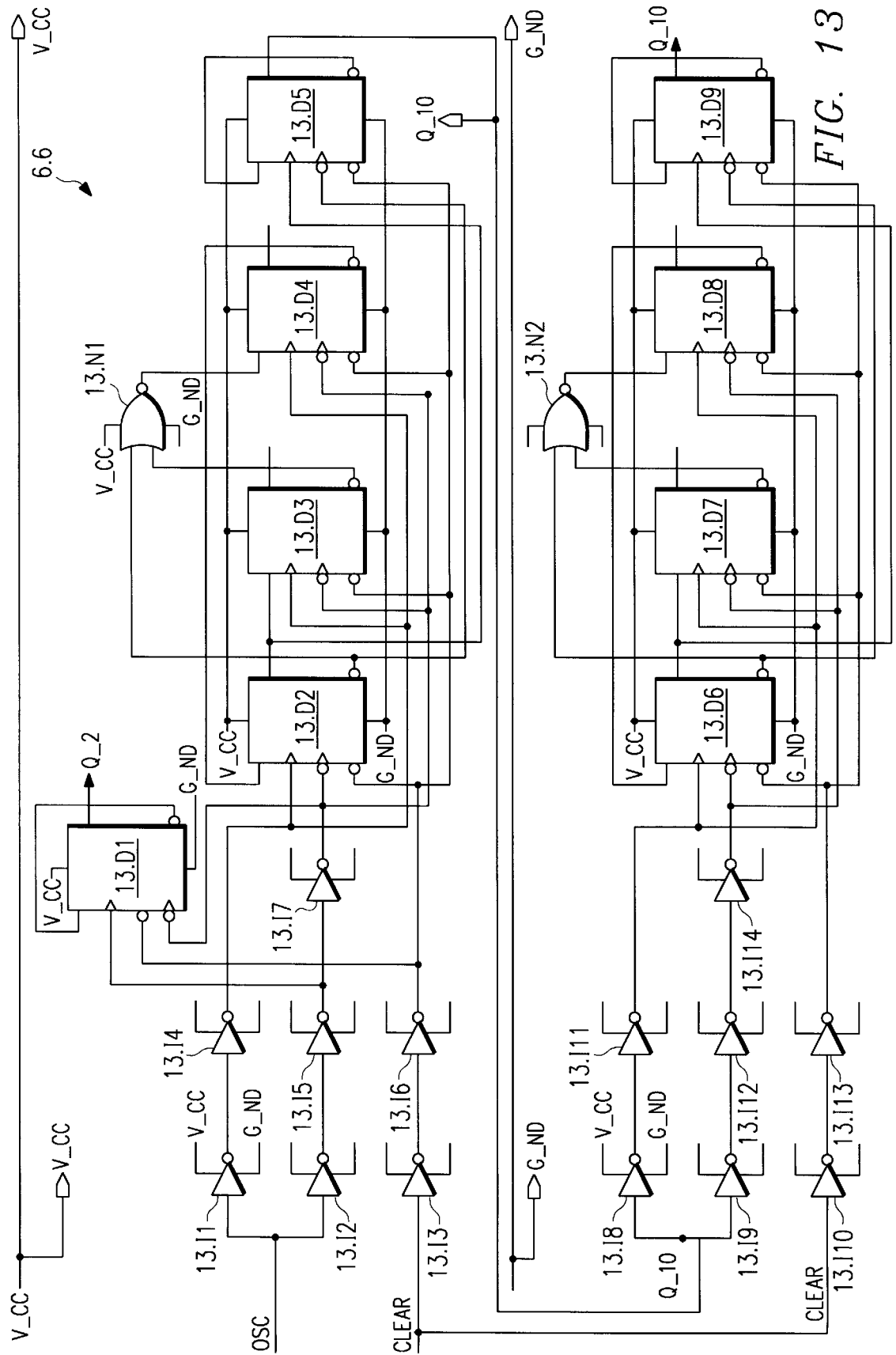
FIG. 13 is an electrical schematic diagram of the counter circuit 6.6 of FIG. 6.

FIG. 13 is an electrical schematic diagram of counter 6.6 of FIG. 6. Counter 6.6 is a frequency division circuit that receives oscillator output signal OSC as an input and divides signal OSC by 2, 10, and 100 to produce output signals Q__2, Q__10, and Q__100, respectively. Signals Q__2, Q__10, and Q__100 are pulse signals having frequencies of ½, 1/10, and 1/100 of signal OSC, respectively.

Counter 6.6 includes inverters 13.I1–13.I14, NOR gates 13.N1–13.N2, and edge-triggered D flip-flops 13.D1–13.D9. Signal OSC is coupled via two inverters 13.I2 and 13.I5 to the positive-edge-triggered clock input of flip-flop 13.D1, via two inverters 13.I1 and 13.I4 to the positive-edge-triggered clock input of flip-flops 13.D2–13.D5, and via three inverters 13.I2, 13.I5, and 13.I7 to the negative-edge-triggered clock input of flip-flops 13.D1–13.D5. As a result, flip-flops 13.D1–13.D5 are clocked on positive-going edges of signal OSC.

Flip-flop 13.D1 is configured to perform a divide by 2 operation on signal OSC to produce signal Q__2. Signal Q__2 is a pulse signal having a frequency of ½ the frequency of signal OSC. Flip-flops 13.D2–13.D4 and NOR gate 13.N1 are configured to perform a divide by 10 operation on signal OSC to produce signal Q__10. Signal Q__10 is a pulse signal having a frequency of 1/10 the frequency of signal OSC.

Signal Q__10 is also coupled via two inverters 13.I8 and 13.I11 to the positive-edge-triggered clock input of flip-flops 13.D6–13.D8 and via three inverters 13.I9, 13.I12, and 13.I14 to the negative-edge-triggered clock input of flip-flops 13.D6–13.D8. As a result, flip-flops 13.D6–13.D8 are clocked on positive-going edges of signal Q__10. Flip-flops 13.D6–13.D9 and NOR gate 13.N2 are configured to perform a divide by 10 operation on signal Q__10 to produce signal Q__100. Signal Q__100 is a pulse signal having a frequency of 1/10 the frequency of signal Q__10 and therefore 1/100 of the frequency of signal OSC.

Counter 6.6 also receives signal CLEAR from counter clear/three-state circuit 6.4. Signal CLEAR is coupled via inverters 13.I3 and 13.I6 to the active low clear inputs of flip-flops 13.D1–13.D5 and via inverters 13.I10 and 13.I13 to the active low clear inputs of flip-flops 13.D6–13.D9. When light-to-digital signal converter 1.10 has its output enabled and is not in the power-down mode, signal CLEAR goes low temporarily whenever any of input signals S0–S3 changes state from low to high or from high to low to select a different sensitivity or different full scale output frequency. Flip-flops 13.D1–13.D9 are cleared when signal CLEAR goes low to clear counter 6.6 thus temporarily forcing signals Q__2, Q__10, and Q__100 low. The clearing of counter 6.6 in response to signal CLEAR prevents changes in signals S0–S3 to select a different sensitivity or different full scale output frequency from causing errors in signals Q__2, Q__10, and Q__100.

Signal CLEAR also goes low when the output of light-to-digital signal converter 1.10 is disabled or when converter is in the power-down mode to force signals Q__2, Q__10, and Q__100 low.

Figure 14:
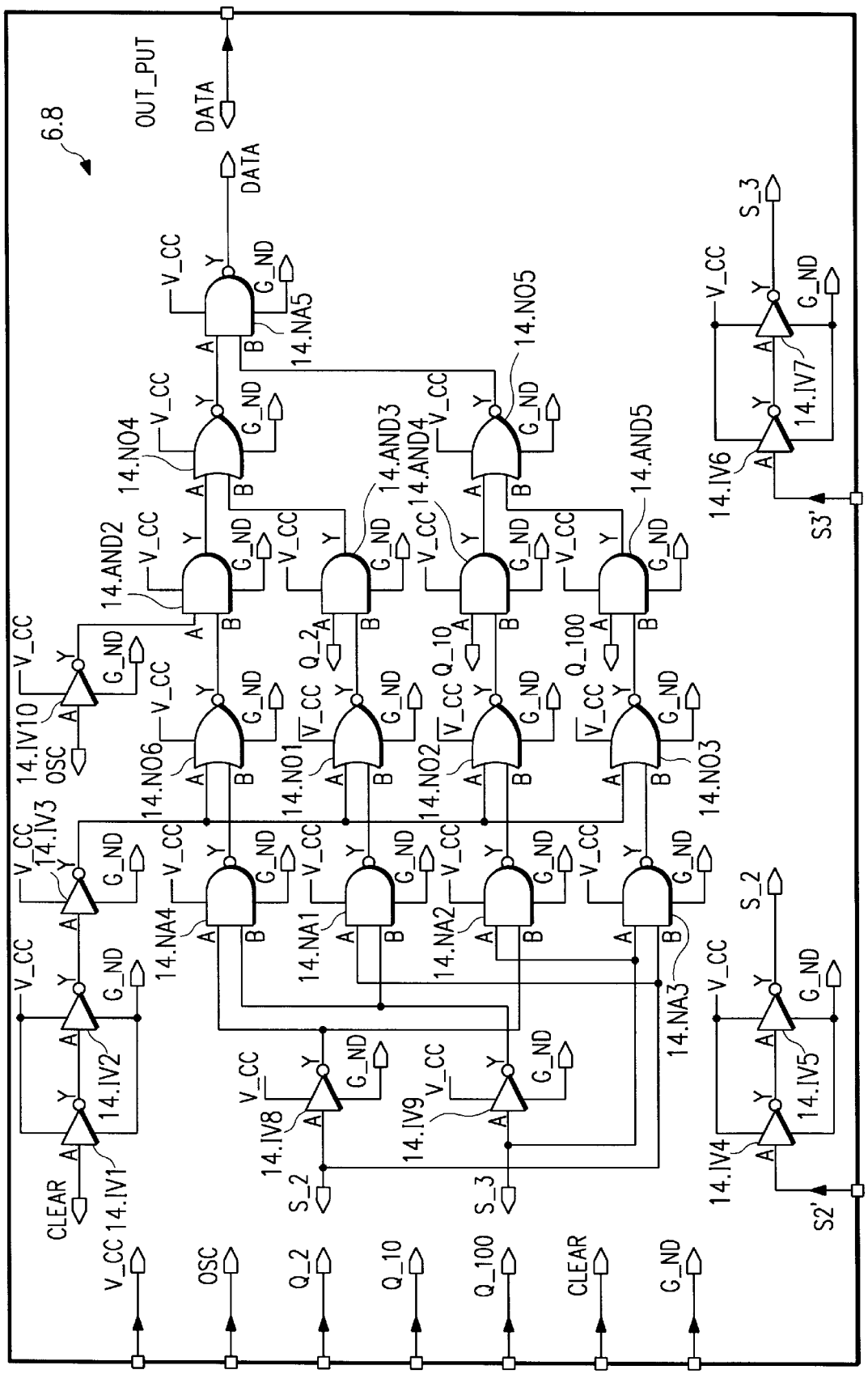
FIG. 14 is an electrical schematic diagram of the multiplexer circuit 6.8 of FIG. 6.

FIG. 14 is an electrical schematic diagram of multiplexer 6.8 of FIG. 6. Multiplexer 6.8 receives input signals S2', S3', OSC, Q__2, Q__10, Q__100, and CLEAR and produces output signal DATA. Multiplexer 6.8 includes inverters 14.IV1–14.IV10, NAND gates 14.NA1–14.NA5, NOR gates 14.NO1–14.NO6, and AND gates 14.AND2–14.AND5. Multiplexer 6.8 decodes input signal CLEAR to determine if the user programmed full scale frequency output, which is one of input signals OSC, Q__2, Q__10, or Q__100, should be output.

When signal CLEAR goes low temporarily after a change in any of input signals S0–S3 to select a different sensitivity or different full scale output frequency, the output of multiplexer 6.8, signal DATA, goes low irrespective of the value of programming signals S2' and S3' to prevent light-to-digital signal converter 1.10 from generating an output signal OUT that may be ambiguous. Signal CLEAR is also low when the output of light-to-digital signal converter 1.10 is disabled or when light-to-digital signal converter 1.10 is in the power-down mode to force signal DATA low.

When signal CLEAR is high, multiplexer 6.8 decodes programming signals S2' and S3' to determine the full scale output frequency programmed by a user and outputs either signal Q__2, signal Q__10, signal Q__100, or the complement of signal OSC. Where signals S2' and S3' have logic 0 values and signal CLEAR has a logic 1 value, signal DATA is equal to the complement of signal OSC. Where signal S3' has a logic 0 value and signals S2' and CLEAR have logic 1 values, signal DATA is equal to Q__2. Where signal S2' has a logic 0 value and signals S3' and CLEAR have logic 1 values, signal DATA is equal to Q__10. Where signals S2', S3', and CLEAR have logic 1 values, signal DATA is equal to Q__100.

Figure 15:
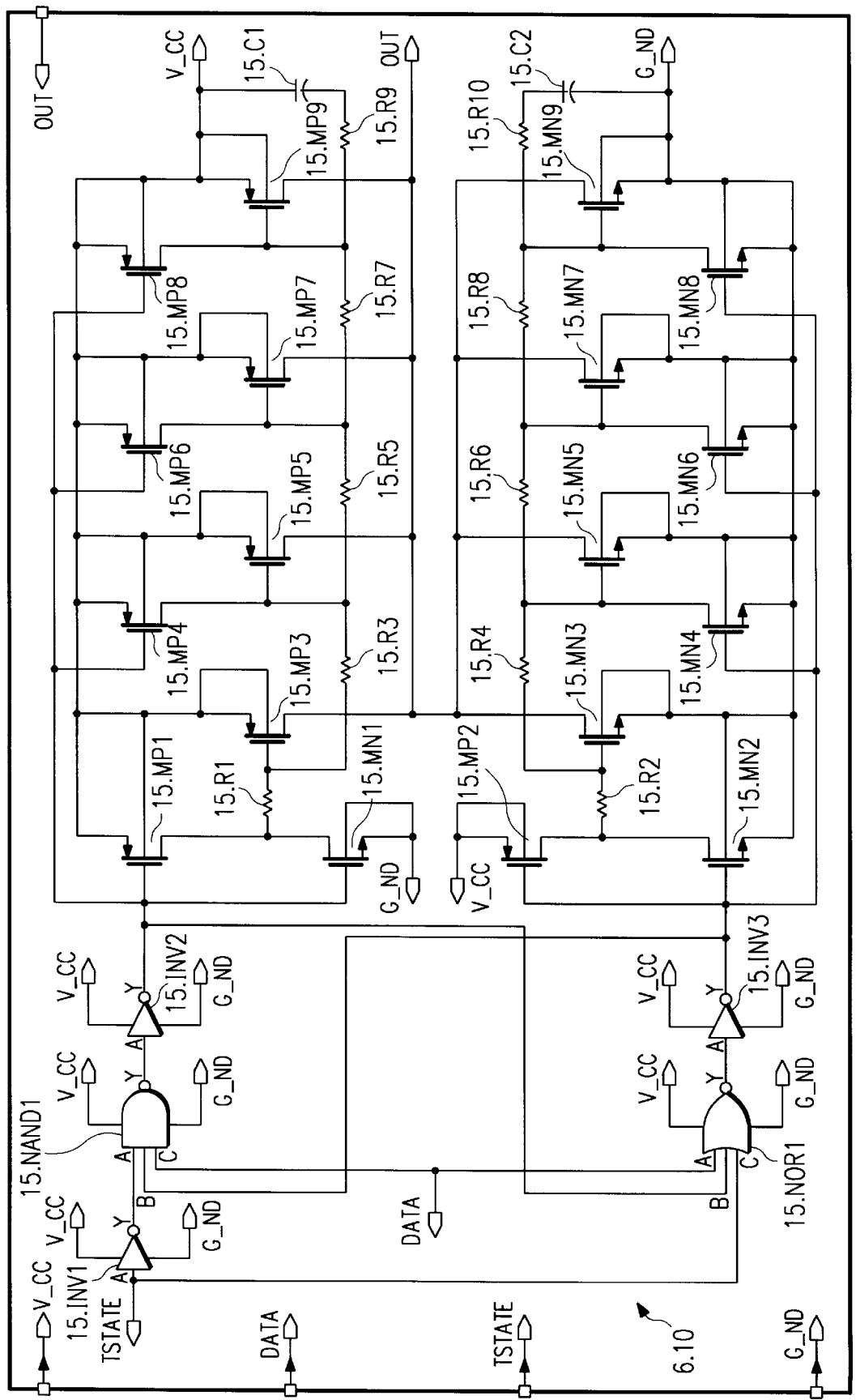
FIG. 15 is an electrical schematic diagram of the three-state buffer circuit 6.10 of FIG. 6.

FIG. 15 is an electrical schematic diagram of three-state buffer 6.10 of FIG. 6. Three-state buffer 6.10 receives input signals TSTATE and DATA and produces an output signal OUT which is the output signal of light-to-digital signal converter 1.10 of FIG. 1. Signal TSTATE is received from counter-clear/three-state control circuit 6.4 and signal DATA is received from multiplexer 6.8. In the low impedance mode, signal TSTATE is low to permit output signal OUT to track input signal DATA. Output signal TSTATE is low when the output of light-to-digital signal converter 1.10 is enabled and when light-to-digital signal converter 1.10 is not in the power-down mode.

In the three-state mode, signal TSTATE is high to force output signal OUT into a high impedance state. Output signal TSTATE is high when the output of light-to-digital signal converter 1.10 is disabled or when light-to-digital signal converter 1.10 is in the power-down mode.

Three-state buffer 6.10 includes inverters 15.INV1–15.INV3, NAND gate 15.NAND1, NOR gate 15.NOR1, p-channel FETs 15.MP1–15.MP9, n-channel FETs 15.MN1–15.MN9, resistors 15.R1–15.R10, and capacitors 15.C1 and 15.C2.

In the low impedance mode (i.e. signal TSTATE is low) when signal DATA is high, the outputs of inverters 15.INV2 and 15.INV3 are high. As a result transistors 15.MN1, 15.MN2, 15.MN4, 15.MN6, 15.MN8, 15.MP3, 15.MP5, 15.MP7, and 15.MP9 are on and transistors 15.MP1, 15.MP2, 15.MP4, 15.MP6, 15.MP8, 15.MN3, 15.MN5, 15.MN7, and 15.MN9 are off causing output signal OUT to be high.

In the low impedance mode (i.e. signal TSTATE is low) when signal DATA is low, the outputs of inverters 15.INV2 and 15.INV3 are low. As a result transistors 15.MN1, 15.MN2, 15.MN4, 15.MN6, 15.MN8, 15.MP3, 15.MP5, 15.MP7, and 15.MP9 are off and transistors 15.MP1, 15.MP2, 15.MP4, 15.MP6, 15.MP8, 15.MN3, 15.MN5, 15.MN7, and 15.MN9 are on causing output signal OUT to be low.

In the three-state mode (i.e. signal TSTATE is high), the output of inverter 15.INV2 is low and the output of inverter 15.INV3 is high irrespective of the value of signal DATA. As a result transistors 15.MN2, 15.MN4, 15.MN6, 15.MN8, 15.MP1, 15.MP4, 15.MP6, and 15.MP8 are on and transistors 15.MP2, 15.MP3, 15.MP5, 15.MP7, 15.MP9, 15.MN1, 15.MN3, 15.MN5, 15.MN7, and 15.MN9 are off causing output signal OUT to be in a high impedance state.

Resistors 15.R1, 15.R3, 15.R5, 15.R7, and 15.R9 and capacitor 15.C1 provide a turn-off delay for transistors 15.MP3, 15.MP5, 15.MP7, and 15.MP9. Resistors 15.R2, 15.R4, 15.R6, 15.R8, and 15.R10 and capacitor 15.C2 provide a turn-on delay for transistors 15.MN3, 15.MN5, 15.MN7, and 15.MN9. As a result of the delays, the n-channel transistors turn on slower than the p-channel transistors turn on and turn off faster than the p-channel transistors turn off. The delays insure that none of the p-channel transistors 15.MP3, 15.MP5, 15.MP7, and 15.MP9 are on at the same time that any of the n-channel transistors 15.MN3, 15.MN5, 15.MN7, and 15.MN9 are on.

Figure 16:
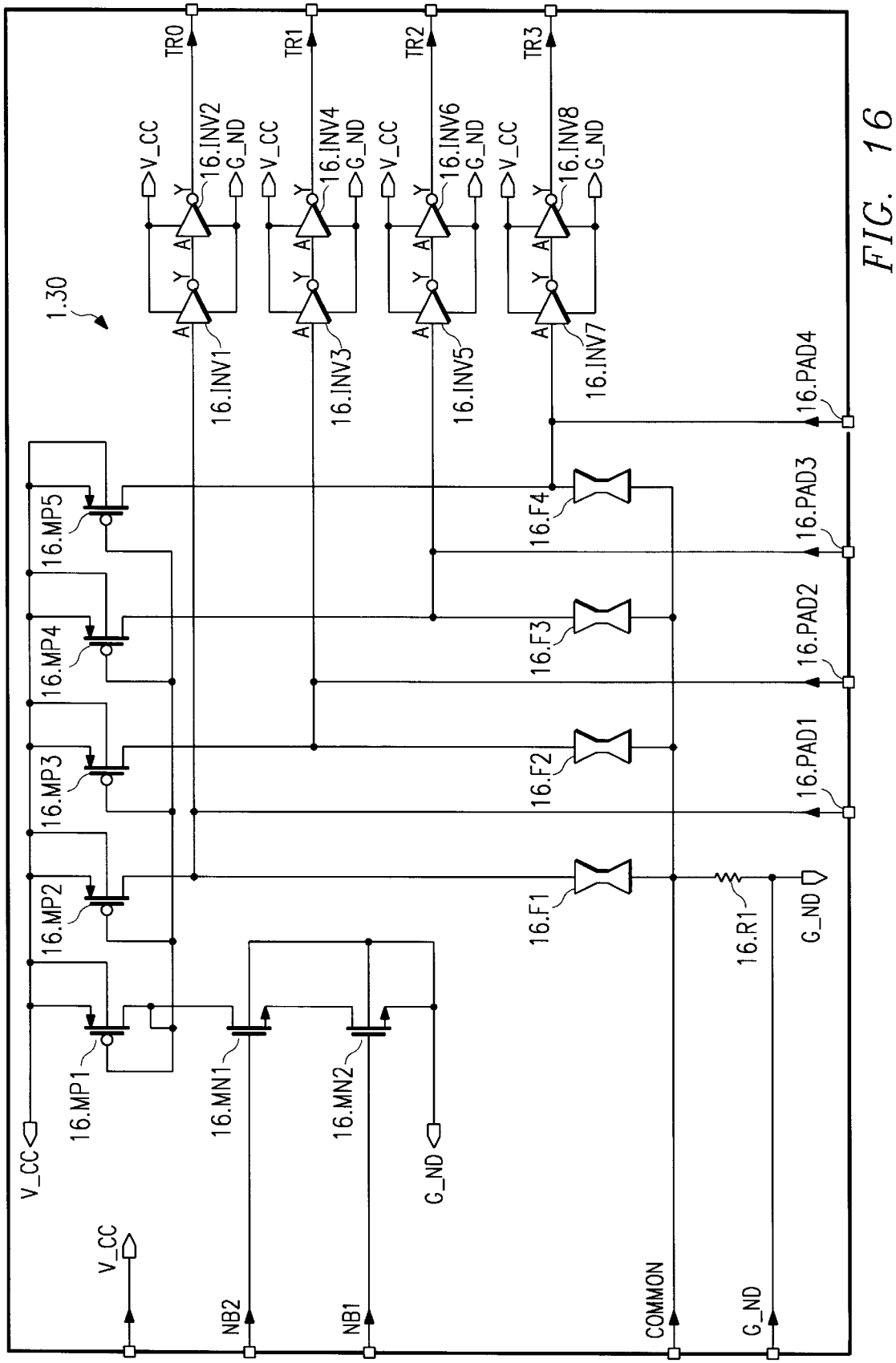
FIG. 16 is an electrical schematic diagram of the fuse circuit 1.30 of FIG. 1.

FIG. 16 is an electrical schematic diagram of fuse circuit 1.30 of FIG. 1. Fuse circuit 1.30 receives bias signals NB1 and NB2 from current-to-digital signal converter circuit 1.28 of FIG. 1 and supplies output trim signals TR0–TR3 to current-to-digital signal converter circuit 1.28. Fuse circuit 1.30 includes p-channel field effect transistors 16.MP1–16.MP5, n-channel field effect transistors 16.MN1 and 16.MN2, fuses 16.F1–16.F4, resistor 16.R1, and inverters 16.INV1–16.INV8.

Bias signals NB1 and NB2, which are applied to the gates of transistors 16.MN1 and 16.MN2, respectively, are selected to cause a current of approximately 15 µA to flow through the series coupled current paths of transistors 16.MN1, 16.MN2, and 16.MP1. The current through transistor 16.MP1 is mirrored by transistors 16.MP2–16.MP5. Transistors 16.MP2–16.MP5 have W/L ratios twice that of transistor 16.MP1 to mirror a current of approximately 30 µA.

Fuses 16.F1–16.F4 have low resistances when intact causing the inputs to inverters 16.INV1, 16.INV3, 16.INV5, and 16.INV7 and therefore output signals TR0–TR3 to be low.

Fuses 16.F1–16.F4 have very high resistances when blown causing the inputs to inverters 16.INV1, 16.INV3, 16.INV5, and 16.INV7 and therefore output signals TR0–TR3 to be high.

Each of fuses 16.F1–16.F4 can be blown by applying a high voltage to an associated terminal 16.PAD1–16.PAD4, respectively and a source of ground to terminal COMMON. Each of terminals 16.PAD1–16.PAD4 is connected to an associated trim pad that can be accessed during probe of the device prior to encapsulation. Terminal COMMON is connected to an associated fuse common pad that can also be accessed during probe of the device prior to encapsulation.

Figure 17:
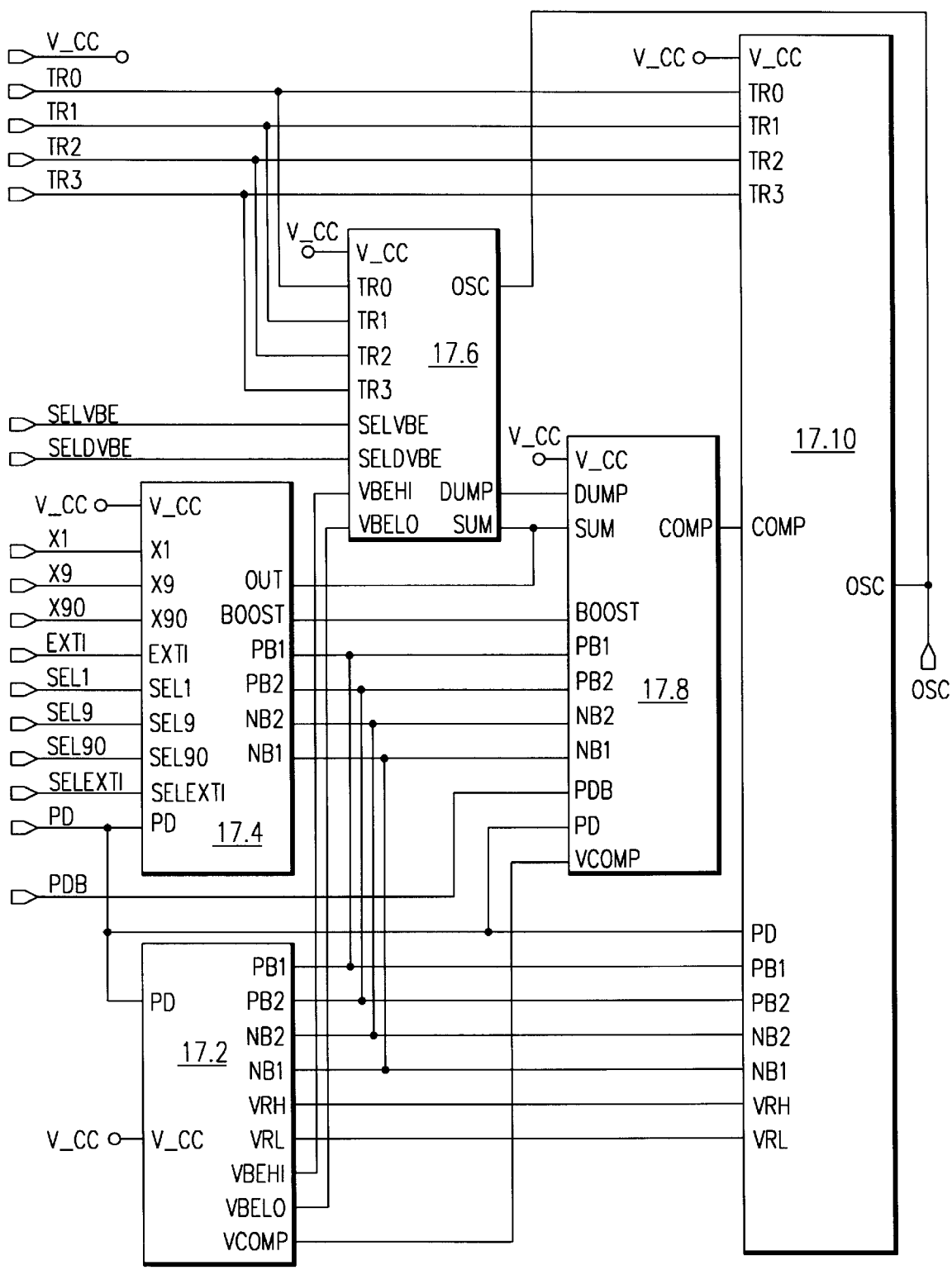
FIG. 17 is a block diagram of current-to-digital signal converter circuit 1.28 of FIG. 1.

FIG. 17 is a block diagram showing current-to-digital signal converter circuit 1.28 of FIG. 1 in more detail. Current-to-digital signal converter circuit 1.28 includes bias circuit 17.2, diode multiplexer circuit 17.4, switched capacitor circuit 17.6, amplifier circuit 17.8, and oscillator circuit 17.10.

Bias circuit 17.2 receives power-down signal PD from TTL-converter/power-down detector 7.2 of FIG. 7 and produces current source bias signals PB1, PB2, NB1, and NB2, bandgap voltage reference signals VBELO and VBEHI, and threshold voltage signals VRH, VRL, and VCOMP.

Diode multiplexer circuit 17.4 receives bias signals PB1, PB2, NB1, and NB2 from bias circuit 17.2 of FIG. 17, photodiode current input signals X1, X9, X90 from photodiode array 1.24 of FIG. 1, optional externally supplied test current input signal EXTI from output enable ESD circuit 1.12 of FIG. 1, input signals SEL1, SEL9, SEL90, SELEXTI, and PD from input interface 6.2 of FIG. 6. Diode multiplexer circuit 17.4 supplies an output signal OUT to the SUM node of amplifier circuit 17.8 and an output signal BOOST to the BOOST node of amplifier circuit 17.8. Diode multiplexer circuit 17.4 responds to input signals SEL1, SEL9, SEL90, and SELEXTI to produce output signal OUT that is equal to either X1, X1+X9, X1+X9+X90, or EXTI. Output signal OUT is a current that flows from node SUM of amplifier 17.8 to diode multiplexer 17.4. Output signal BOOST is a current that is substantially equal to output signal OUT and that flows from amplifier 17.8 to multiplexer 17.4. Diode multiplexer 17.4 also isolates the capacitance of the photodiode array from the remainder of current-to-digital signal converter 1.28 to reduce the bandwidth and power requirements of amplifiers in current-to-digital signal converter 1.28.

Switched capacitor circuit 17.6 includes a capacitor network that is selectively connected to bandgap voltage reference signals VBELO and VBEHI produced by bias circuit 17.2 and selectively switched to the DUMP and SUM nodes of amplifier circuit 17.8 in response to input pulse signal OSC from oscillator circuit 17.10. Switched capacitor circuit 17.6 receives trim signals TR0–TR3 from fuse circuit 1.30 to trim capacitors in the capacitor network. Signals SELD-VBE and SELVBE produced by control circuit 1.26 selectively place switched capacitor circuit 17.6 in a test mode for determining the actual values of VBELO and VBEHI. During normal light sensing operations and during operation in the third test mode, signals SELDVBE and SELVBE are high and when pulse signal OSC goes low, switched capacitor circuit 17.6 transfers or meters a known charge Q=(VBEHI*C1)+(ΔVBE*C2), where ΔVBE=VBEHI−VBELO and C1 and C2 are independent capacitances, to the SUM node on amplifier circuit 17.8. In the second test mode, signal SELDVBE is low and signal SELVBE is high and when pulse signal OSC goes low, switched capacitor circuit 17.6 transfers or meters a known charge Q=(VBEHI*C1) to the SUM node on amplifier circuit 17.8. In the first test mode, signal SELDVBE is high and signal SELVBE is low and when pulse signal OSC goes low, switched capacitor circuit 17.6 transfers or meters a known charge Q=(ΔVBE*C2) to the SUM node on amplifier circuit 17.8.

Amplifier circuit 17.8 receives power-down signals PD and PDB from TTL-converter/power-down detector 7.2 of FIG. 7 and bias signals PB1, PB2, NB1, and NB2 and voltage reference signal VCOMP from bias circuit 17.2. Amplifier circuit 17.8 has an input node DUMP that is a low impedance voltage source and an input node SUM that is the input or summing node of an integrator. Input nodes DUMP and SUM are typically at about 0.8 volts at 25 degrees Centigrade, which is nominally equal to the voltage of bias signal NB1. Signal OUT from diode multiplexer 1.74, which is either photodiode current (i.e. X1, X1+X9, or X1+X9+ X90) or external test current EXTI, is pulled from node SUM of amplifier circuit 17.8 and integrated by the integrator. Signal BOOST from diode multiplexer 17.4 is supplied to reduce the offset voltage of the integrator. Amplifier circuit 17.8 compares the integrator output with reference voltage VCOMP and when the integrator output exceeds VCOMP, output signal COMP changes from high to low.

Oscillator circuit 17.10 receives power-down signal PD from TTL-converter/power-down detector 7.2 of FIG. 7 and bias signals PB1, PB2, NB1, and NB2 and voltage reference signals VRL and VRH from bias circuit 17.2. Oscillator circuit 17.10 contains a capacitor network that is trimmed by trim signals TR0–TR3. Oscillator circuit 17.10 is enabled by output signal COMP from amplifier circuit 17.8 going low to produce a pulse signal and disabled by output signal COMP going high.

In performing a light measuring operation, initially capacitances C1 and C2 of switched capacitor circuit 17.6 have a first switched state in which capacitance C1 is connected between ground and node DUMP of amplifier 17.8 while capacitance C2 is connected between VBELO and node DUMP. The integrator in amplifier circuit 17.8 integrates photocurrent pulled from its node SUM. When the output of the integrator exceeds reference voltage VCOMP, the output signal COMP of amplifier circuit 17.8 goes low to enable oscillator circuit 17.10 to produce a signal OSC which is a one-shot pulse.

Switched capacitor circuit 17.6 is responsive to the one-shot pulse to switch capacitances C1 and C2 from the first switched state to a second switched state in which they are connected between VBEHI and node SUM of amplifier circuit 17.8 and thus transfer a charge Q=(VBEHI*C1)+ ($\Delta$VBE*C2), where $\Delta$VBE=VBEHI−VBELO, to the SUM node to at least partially discharge the integrator.

If the photocurrent is so large that the output of the integrator is still greater than VCOMP after the charge transfer, then oscillator circuit 17.10 will produce pulse signals freely at a full-scale frequency of about 1.4 MHz with switched capacitor circuit 17.10 switching capacitances C1 and C2 between the first and second switched states to perform a charge transfer for each pulse.

If after the charge transfer, the output of the integrator is less than VCOMP, output COMP of amplifier circuit 17.8 goes high to disable oscillator circuit 17.10 resulting in a signal OSC that is high. Switched capacitor circuit 17.6 is responsive to the high signal OSC to switch capacitances C1 and C2 back to the first switched state. Signal OSC will remain high until signal COMP received from amplifier circuit 17.8 goes low.

The transfer of charge Q to node SUM whenever signal OSC goes low results in an equivalent average current of:

$$I=F*[(VBEHI*C1)+(\Delta VBE*C2)]$$

being added to the input of the integrator of amplifier circuit 17.8 at node SUM, where F is frequency of pulse signal OSC. The current subtracted from the input of the integrator of amplifier circuit 17.8 at node SUM is the photodiode current.

Since node SUM is in a closed loop, the current added at node SUM equals the current subtracted from node SUM.

The frequency, F, of signal OSC is therefore directly proportional to photodiode current, I, assuming that the value [(VBEHI*C1)+($\Delta$VBE*C2)] is constant and that the integrator in amplifier circuit 17.8 settles completely during the period of pulse signal OSC.

The accuracy of light-to-digital signal converter 1.10 depends primarily on the initial value of the capacitances in switched capacitor circuit 17.6 and the temperature characteristics of these capacitances and signals VBEHI and $\Delta$VBE. The capacitances in switched capacitor circuit 17.6 are poly-to-poly capacitors and thus have a very low temperature coefficient. Signals VBEHI and $\Delta$VBE are related to the bandgap of silicon with VBEHI having a negative temperature coefficient and $\Delta$VBE having a positive temperature coefficient. For a flat temperature characteristic of the value of [(VBEHI*C1)+($\Delta$VBE*C2)], the term [VBEHI+C1/C2($\Delta$VBE)] can be set to be approximately equal to 1.25 V.

Figure 18:
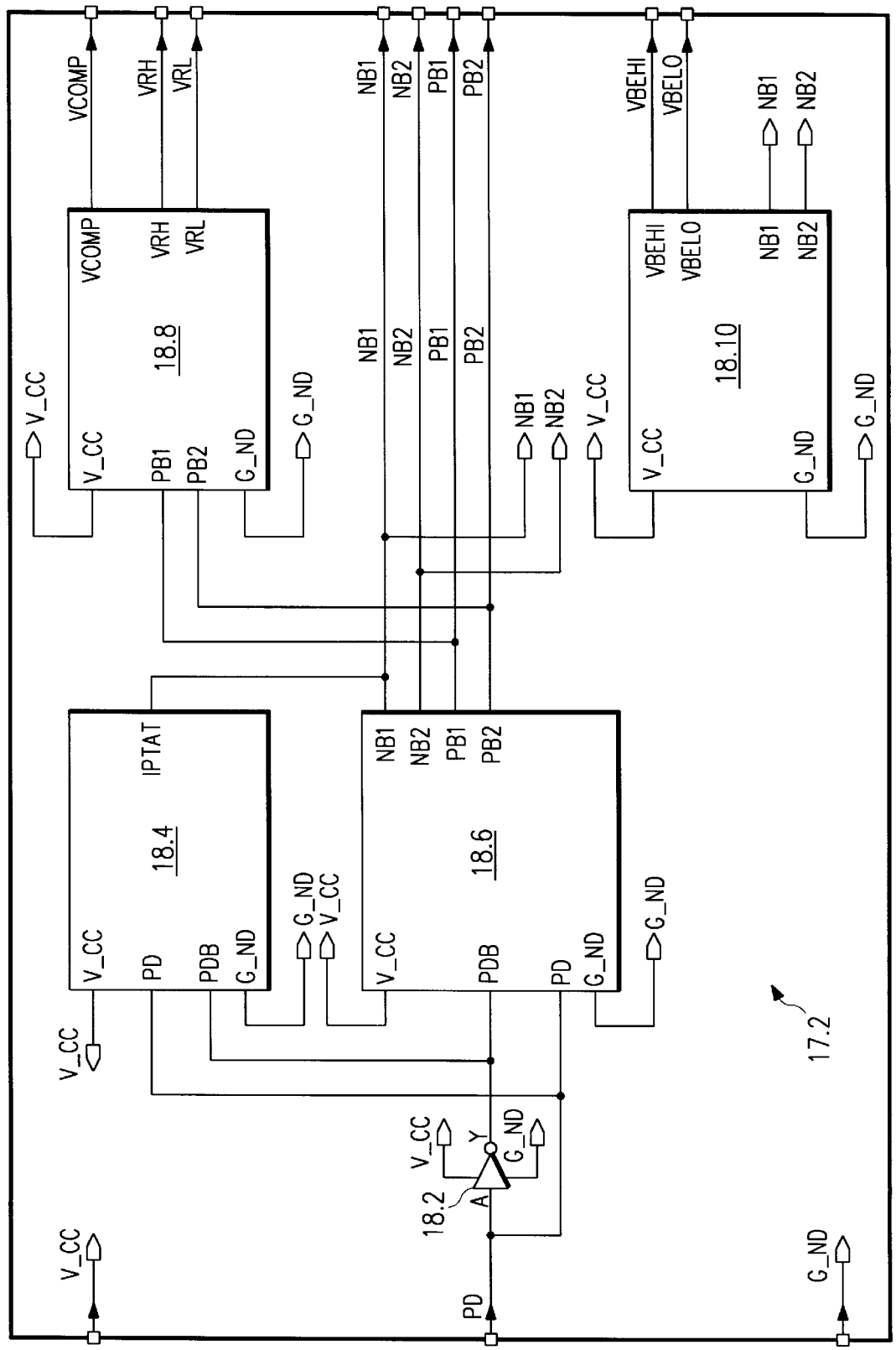
FIG. 18 is an electrical schematic diagram in partial block form of bias circuit 17.2 of FIG. 17.

FIG. 18 is a block diagram showing bias circuit 17.2 of FIG. 17 in more detail. Bias circuit 17.2 generates bias voltages used throughout light-to-digital signal converter 1.10. Bias circuit 17.2 includes inverter 18.2, IPTAT (Current Proportional To Absolute Temperature) current source circuit 18.4, current source bias voltage circuit 18.6, threshold reference voltage circuit 18.8, and bandgap reference voltage circuit 18.10.

IPTAT current source 18.4 receives power down signal PD from TTL-converter/power-down detector 7.2 of FIG. 7 and signal PDB, the complement of signal PD, from inverter 18.2. IPTAT current source 18.4 is turned off in the power-down mode when signals PD and PDB are high and low, respectively. IPTAT current source 18.4 is turned on when converter 1.10 is not in the power-down mode (i.e. signals PD and PDB are low and high, respectively) to generate an output signal IPTAT which has a current that is proportional to absolute temperature.

Current source bias voltage circuit 18.6 receives power down signal PD from TTL-converter/power-down detector 7.2 of FIG. 7 and signal PDB, the complement of signal PD, from inverter 18.2. Signal IPTAT from current source 18.4 is coupled to node NB1 of BIAS circuit 18.6. BIAS circuit 18.6 generates signals NB1 and NB2 that are used in light-to-digital signal converter 1.10 to bias selected n-channel field effect transistors and signals PB1 and PB2 that are used in light-to-digital signal converter 1.10 to bias selected p-channel field effect transistors.

In the power-down mode (i.e. signals PD and PDB are high and low, respectively), current source bias voltage circuit 18.6 generates output signals NB1 and NB2 which are low and output signals PB1 and PB2 which are high. As a result, in the power-down mode n-channel field effect transistors throughout converter 1.10 receiving bias signals NB1 and NB2 are turned off as are p-channel field effect transistors receiving bias signals PB1 and PB2.

When converter 1.10 is not in the power-down mode (i.e. signals PD and PDB are low and high, respectively), current source bias voltage circuit 18.6 generates output signals NB1, NB2, PB1, and PB2 having bias values that turn on those n- and p-channel field effect transistors through converter 1.10 that receive these bias signals.

Threshold reference voltage circuit 18.8 receives bias signals PB1 and PB2 from current source bias voltage circuit 18.6 and produces output signals VCOMP, VRH, and VRL. Output signal VCOMP is a threshold voltage signal supplied to a comparator in amplifier circuit 17.8. Output signals VRH and VRL are threshold voltage signals supplied to a comparator in oscillator circuit 17.10.

Bandgap voltage reference circuit 18.10 receives bias signals NB1 and NB2 from current source bias voltage circuit 18.6 and supplies output signals VBEHI and VBELO to switched capacitor circuit 17.6 of FIG. 17. Output signal VBEHI is in the range of about 620–640 mV and output signal VBELO is in the range of about 520–540 mV.

Figure 19:
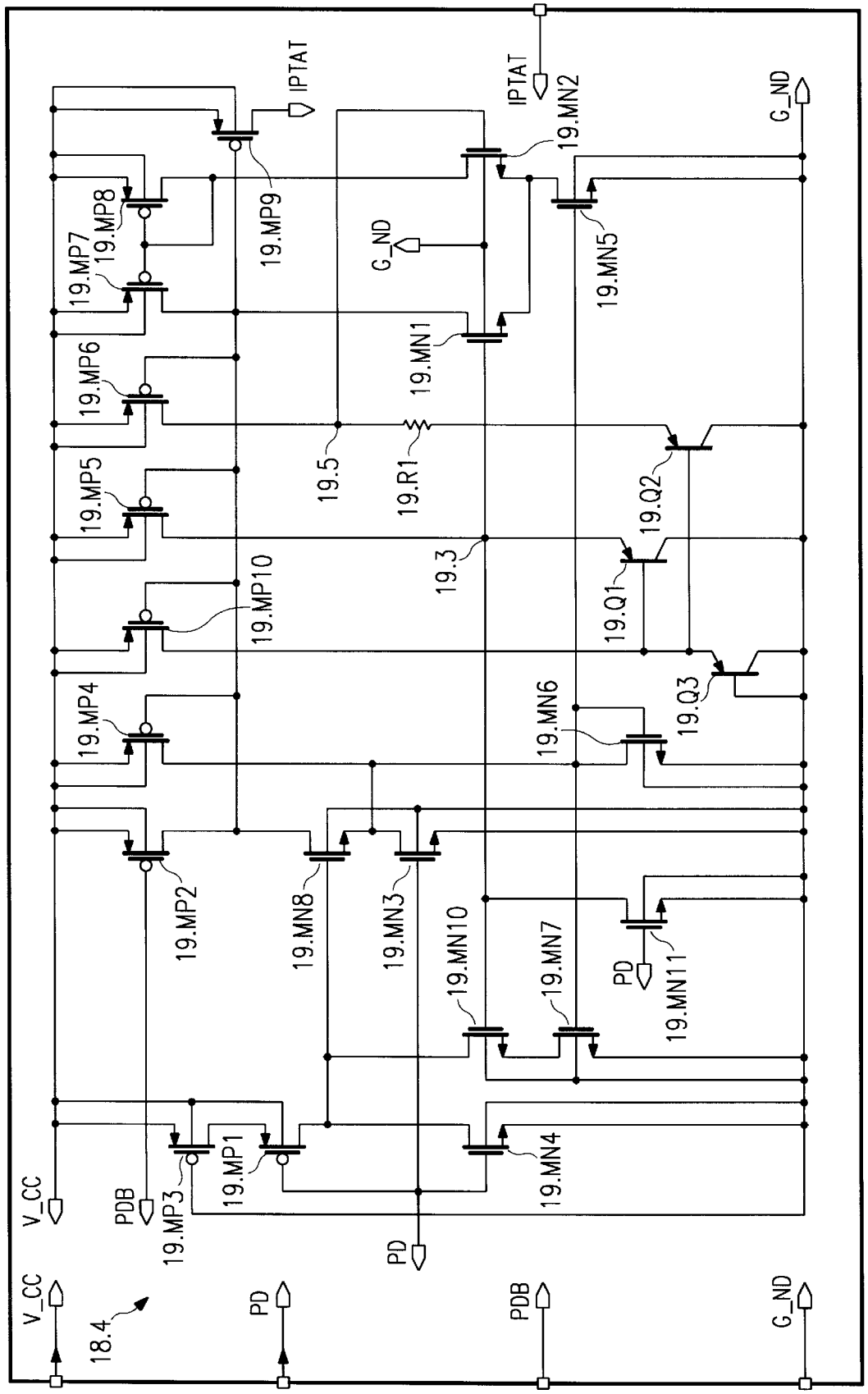
FIG. 19 is an electrical schematic diagram of current proportional to absolute temperature (IPTAT) source 18.4 of FIG. 18.

FIG. 19 is an electrical schematic diagram of IPTAT (current proportional to absolute temperature) current source 18.4 of FIG. 18. IPTAT current source 18.4 includes p-channel field effect transistors 19.MP1–19.MP10, n-channel field effect transistors 19.MN1–19.MN10, PNP transistors 19.Q1–19.Q3, and resistor 19.R1. IPTAT current source 18.4 receives input signals PD and PDB and produces output signal IPTAT.

Input signal PD is applied to the gates of transistors 19.MP1, 19.MN3, 19.MN4, and 19.MN11. Input signal PDB, which is the complement of signal PD, is applied to the gate of transistor 19.MP2. Output signal IPTAT is produced at the drain of transistor 19.MP9. In the power-down mode, IPTAT current source 18.4 is disabled. When light-to-digital signal converter 1.10 is not in the power-down mode, output signal IPTAT has a current that is proportional to absolute temperature.

In the power-down mode, signal PDB is low to turn on transistor 19.MP2 and signal PD is high to turn on transistors 19.MN3, 19.MN4, and 19.MN11 and turn off transistor 19.MP1. As a result, transistors 19.MN5, 19.MN8, 19.MN10, 19.MN1, 19.MP4, 19.MP10, 19.MP5, 19.MP6, 19.MP9 are off to disable IPTAT current source 18.4.

When light-to-digital signal converter 1.10 exits the power-down mode, signal PDB goes from low to high to turn off transistor MP2; signal PD goes from high to low to turn on transistor 19.MP1 and turn off transistors 19.MN3, 19.MN4, and 19.MN11; and transistor 19.MP3 remains on.

As a result of transistors 19.MP3 and 19.MP1 being on, start-up transistor 19.MN8 is turned on. The gates of transistors 19.MP4, 19.MP10, 19.MP5, 19.MP6, and 19.MP9 are thus brought low to turn transistors 19.MP4, 19.MP10, 19.MP5, 19.MP6, and 19.MP9 on. As transistor 19.MP4 turns on, the gates of transistors 19.MN7 and 19.MN5 are brought high to turn transistors 19.MN7 and 19.MN5 on. As transistor 19.MP5 turns on, the gates of transistors 19.MN1 and 19.MN10 are coupled to the power supply V_CC to turn transistors 19.MN1 and 19.MN10 on. As transistor 19.MP6 turns on, the gate of transistor 19.MN2 is also coupled to the power supply V_CC to turn transistor 19.MN2 on.

As transistors 19.MN1, 19.MN2, and 19.MN5 turn on, the gates of transistors 19.MP7 and 19.MP8 are brought sufficiently low to turn on transistors 19.MP7 and 19.MP8.

With transistors 19.MN10 and 19.MN7 on, the gate of start-up transistor 19.MN8 is brought low causing it to turn off. Since transistors 19.MN1 and 19.MN5 are on, transistors 19.MP4, 19.MP10, 19.MP5, and 19.MP6 remain on.

Transistors 19.MP5 and 19.MP6 are coupled with sources connected in common and gates connected in common so as to have the same current density. Transistor 19.MP5 has a W/L ratio 4 times that of transistor 19.MP6. As a result, the current through transistor 19.MP5 is 4 times that through transistor 19.MP6.

Transistor 19.Q1 has its emitter coupled to the drain of transistor 19.MP5 and transistor 19.Q2 has its emitter coupled to the drain of transistor 19.MP6 through resistor 19.R1. Transistor 19.Q1 has an emitter area 8 times that of transistor 19.Q2 resulting in an emitter current density for transistor 19.Q1 that is 32 times the emitter current density for transistor 19.Q2.

As a result of the difference in current densities, the delta VBE between transistors 19.Q1 and 19.Q2 is given by the following equation:

1.) delta $VBE = VBE_{19.Q1} - VBE_{19.Q2} = (kT/q)ln(J_{22.Q2}/J_{22.Q1})) = (kT/q)ln(32)$ where: k=Boltzman's constant, T=absolute temperature, and q=electron charge.

Transistors 19.MP7, 19.MP8, 19.MN1, and 19.MN2 form a differential amplifier having inputs at nodes 19.3 and 19.5. Node 19.3 is connected between the drain of transistor 19.MP5 and the emitter of transistor 19.Q1. Node 19.5 is connected between the drain of transistor 19.MP6 and resistor 19.R1. Transistors 19.MN1 and 19.MN2 are configured as a differential pair with the gate of transistor 19.MN1 connected to the drain of transistor 19.MP5 and the gate of transistor 19.MN2 connected to the drain of transistor 19.MP6. Transistors 19.MP7 and 19.MP8 are configured as a current mirror with sources coupled in common and gates coupled in common to the drain of transistor 19.MN2.

The differential amplifier formed by transistors 19.MN1, 19.MN2, 19.MP7, and 19.MP8 operates to drive nodes 19.3 and 19.5, which are connected to the gates of transistors 19.MN1 and 19.MN2, to the same voltage. Since the voltage at node 19.3 equals $VBE_{19.Q3} + VBE_{19.Q1}$ and the voltage at node 19.5 equals VBEQ3+VBEQ2+voltage across resistor 19.R1, $VBE_{19.Q1}$ must equal $VBE_{19.Q2}$+voltage across resistor 19.R1 for nodes 19.3 and 19.5 to be at the same voltage. Therefore, the difference between $VBE_{19.Q1}$ and $VBE_{19.Q2}$, which is delta VBE from equation 1 above, must be reflected across resistor 19.R1 for nodes 19.3 and 19.5 to be at the same voltage. When the voltage across resistor 19.R1 is equal to delta VBE and the resistance of resistor 19.R1 is R1, the current through resistor 19.R1 and transistor 19.MP6 is equal to delta VBE/R1. Since delta VBE is proportional to absolute temperature, the current through transistor 19.MP6 is also proportional to absolute temperature.

Transistors 19.MP6 and 19.MP9 are identical and are also configured as a current mirror with sources coupled in common and gates coupled in common to the drain of transistor 19.MN1. As a result, the current through transistor 19.MP9, which appears as output signal IPTAT, is equal to that through transistor 19.MP6 and is also proportional to absolute temperature.

Figure 20:
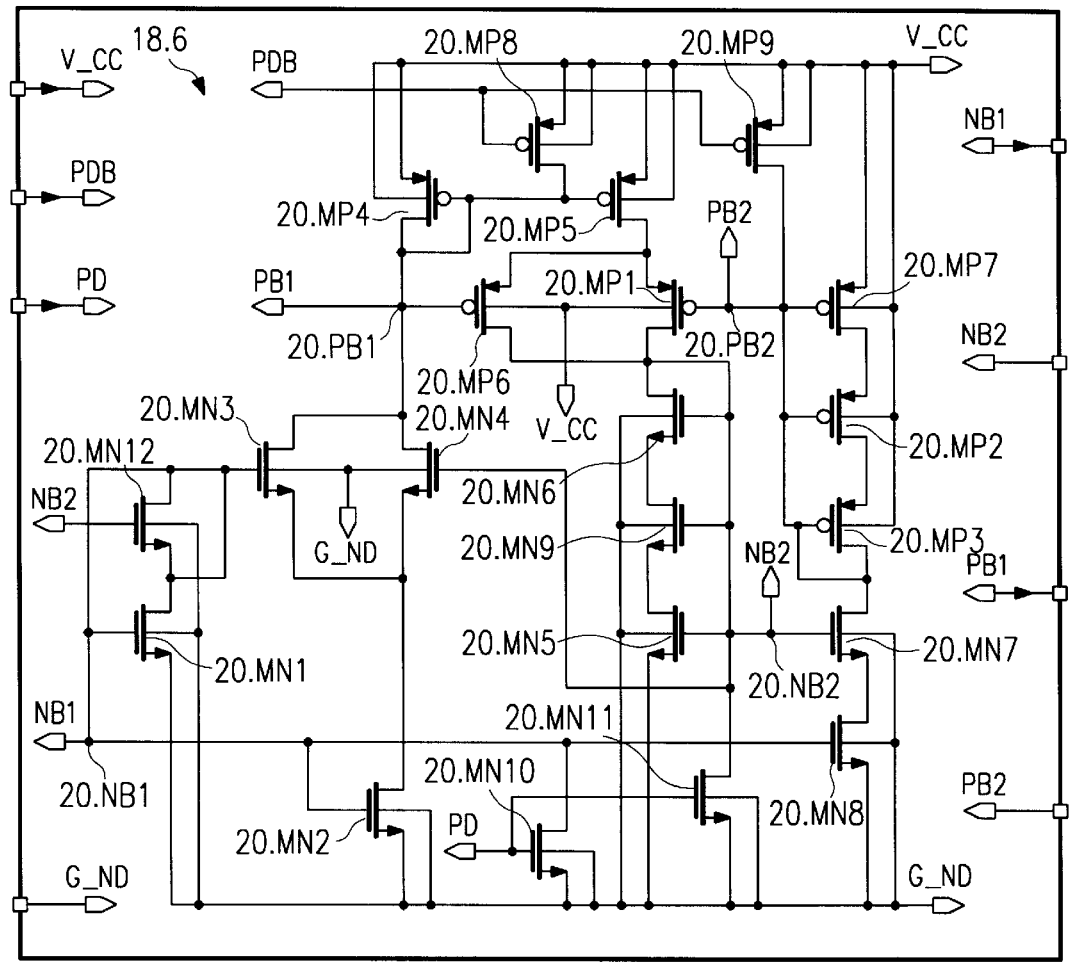
FIG. 20 is an electrical schematic diagram of current source bias circuit 18.6 of FIG. 18.

FIG. 20 is an electrical schematic diagram of current source bias voltage circuit 18.6 of FIG. 18. Current source bias voltage circuit 18.6 includes p-channel field effect transistors 20.MP1–20.MP9 and n-channel field effect transistors 20.MN1–20.MN12. Current source bias voltage circuit 18.6 receives input signals PD, and PDB and produces output signals NB1, NB2, PB1, and PB2. Output signals NB1 and NB2 are current source bias voltage signals applied to n-channel field effect transistors throughout converter 1.10 to set up known current and voltages. Output signals PB1 and PB2 are current source bias voltage signals applied to p-channel field effect transistors throughout converter 1.10 to set up known current and voltages.

Input signal PDB is applied to the gates of transistors 20.MP8 and 20.MP9. Input signal PD, which is the complement of signal PDB, is applied to the gates of transistors 20.MN10 and 20.MN11. Output signal NB1 is produced at node 20.NB1. Output signal NB2 is produced at node 20.NB2. Output signal PB1 is produced at node 20.PB1. Output signal PB2 is produced at node 20.PB2.

In the power-down mode, signal PDB is low to turn on transistors 20.MP8 and 20.MP9 and signal PD is high to turn on transistors 20.MN10 and 20.MN11. As a result, output signals PB1 and PB2 are high and output signals NB1 and NB2 are low. Those p-channel field effect transistors throughout converter 1.10 that receive bias signals PB1 and PB2 are therefore turned off in the power-down mode. Those n-channel field effect transistors throughout converter 1.10 that receive bias signals NB1 and NB2 are therefore also turned off in the power-down mode.

When light-to-digital signal converter 1.10 exits the power-down mode, signal PDB goes from low to high to turn off transistors 20.MP8 and 20.MP9 and signal PD goes from high to low to turn off transistors 20.MN10 and 20.MN11. Signal IPTAT is supplied via node 20.NB1 to the gates of transistors 20.MN1, 20.MN2, 20.MN3, and 20.MN8 and the drain of transistor 20.MN1 from IPTAT current source 18.4 to turn these transistors on. Transistors 20.MP4, 20.MP5, and 20.MP6 then turn on. The current through transistors 20.MP4, 20.MN3, and 20.MN2 mirrors the current through transistor 20.MN1 and sets the value of bias signal PB1 in the operating mode.

Transistors 20.MN6, 20.MN9, 20.MN5, 20.MN7, and 20.MN4 then turn on as a result of transistors 20.MP5 and 20.MP6 being on. The current through transistors 20.MP5, 20.MP6, 20.MN6, 20.MN9, and 20.MN5 mirrors the current through transistor 20.MP4. Series connected transistors 20.MN6, 20.MN9, and 20.MN5 form a high swing cascode bias source to set the value of bias signal NB2 in the operating mode. Start-up transistor 20.MN3 turns off after transistor 20.MN4 turns on and the current through transistors 20.MP4, 20.MN4, and 20.MN2 now mirrors the current through transistor 20.MN1 and sets the value of bias signal PB1 in the operating mode.

Transistors 20.MP1, 20.MP7, 20.MP2, and 20.MP3 then turn on as result of transistors 20.MN7 and 20.MN8 being on. Start-up transistor 20.MP6 turns off as transistor 20.MP1 turns on and the current through transistors 20.MP5, 20.MP1, 20.MN6, 20.MN9, and 20.MN5 now mirrors the current through transistor 20.MP4. The current through transistors 20.MP7, 20.MP2, 20.MP3, 20.MN7, and 20.MN8 mirrors the current through transistor 20.MN1. Series connected transistors 20.MP7, 20.MP2, and 20.MP3 form a high swing cascode bias source to set the value of bias signal PB2 in the operating mode.

Figure 21:
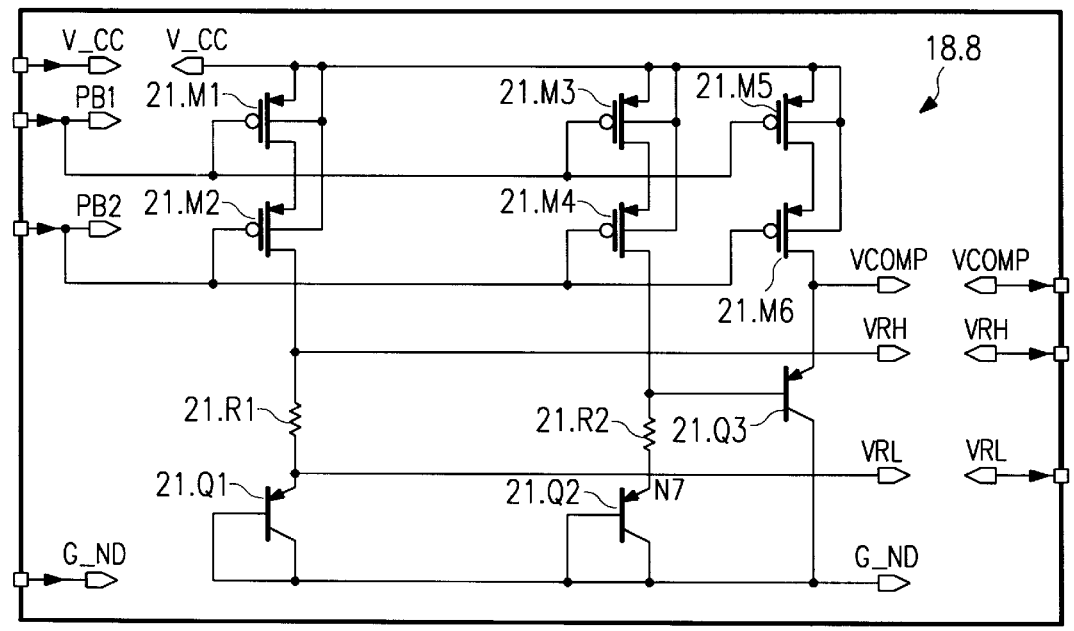
FIG. 21 is an electrical schematic diagram of threshold reference bias circuit 18.8 of FIG. 18.

FIG. 21 is an electrical schematic diagram of threshold reference voltage circuit 18.8 of FIG. 18. Threshold reference voltage circuit 18.8 includes p-channel field effect transistors 21M1–21.M6, PNP transistors 21.Q1, 21.Q2, and 21.Q3, and resistors 21.R1 and 21.R2. Threshold reference voltage circuit 18.8 receives bias signals PB1 and PB2 from current source bias voltage circuit 18.6 and produces output signals VCOMP, VRH, and VRL. Output signal VCOMP is a threshold voltage signal supplied to a comparator in amplifier circuit 17.8. Output signals VRH and VRL are threshold voltage signals supplied to a comparator in oscillator circuit 17.10.

In the power-down mode, bias signals PB1 and PB2 are high to turn off transistors 21M1–21.M6. In the operating mode (i.e. non-power-down mode), bias signals PB1 and PB2 turn transistors 21.M1–21.M6 on. The current that flows through transistors 21M1 and 21.M2, resistor 21.R1, and transistor 21.Q1 sets up threshold voltage signals VRH and VRL and is proportional to absolute temperature so that VRH–VRL is also proportional to absolute temperature. The current flowing through transistors 21.M5, 21.M6, and 21.Q3 sets up threshold voltage signal VCOMP.

Figure 22:
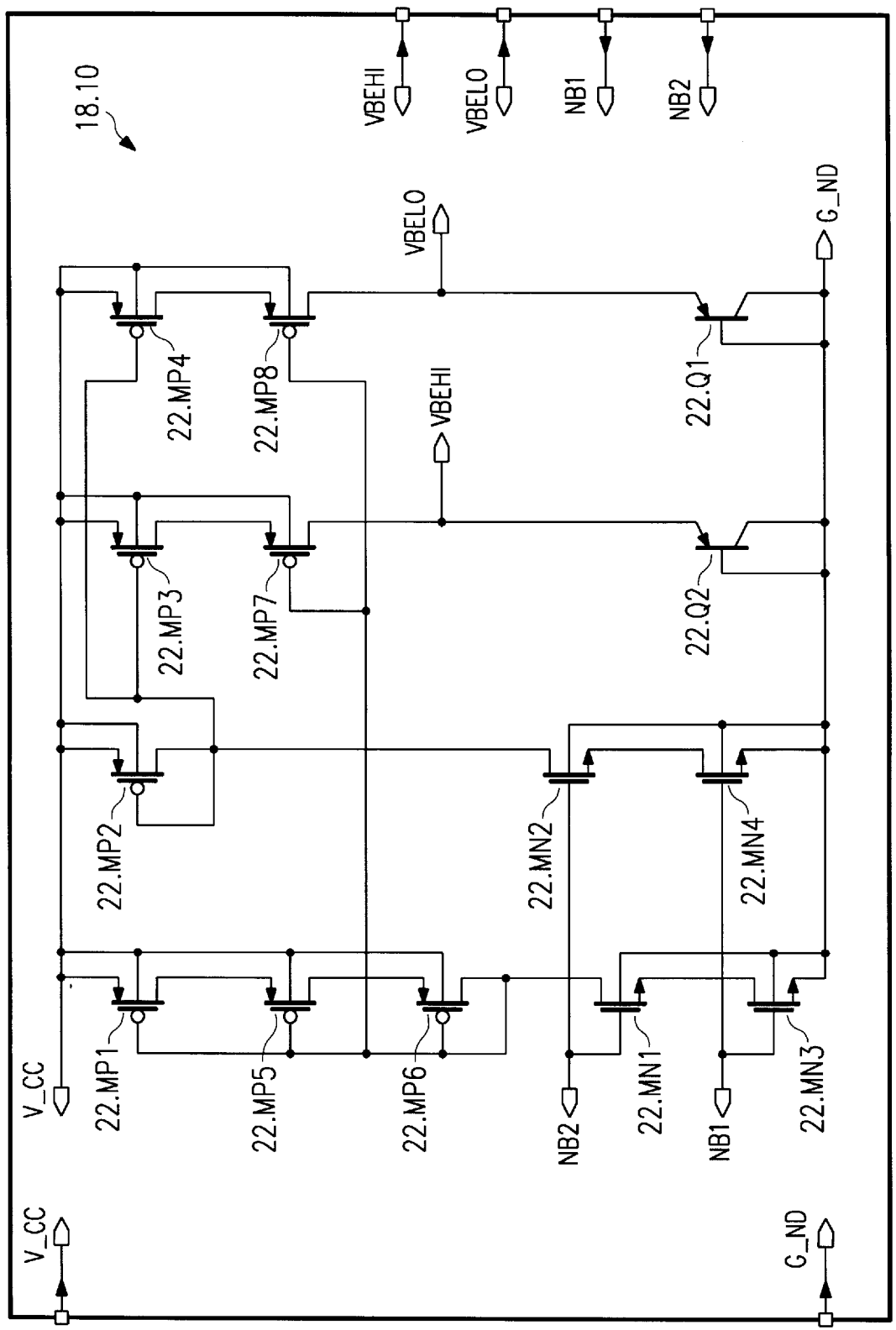
FIG. 22 is an electrical schematic diagram of bandgap circuit 18.10 of FIG. 18.

FIG. 22 is an electrical schematic diagram of bandgap voltage reference circuit 18.10 of FIG. 18. Bandgap voltage reference circuit 18.10 includes p-channel field effect transistors 22.MP1–22.MP8, n-channel field effect transistors 22.MN1–22.MN4, and PNP transistors 22.Q1 and 22.Q2. Bandgap voltage reference circuit 18.10 receives bias signals NB1 and NB2 from current source bias voltage circuit 18.6 and supplies output signals VBEHI and VBELO to switched capacitor circuit 17.6 of FIG. 17. At room temperature, output signal VBEHI is in the range of about 620–640 mV and output signal VBELO is in the range of about 520–540 mV.

In the power-down mode, bias signals NB1 and NB2 are low to turn off transistors 22.MN1–22.MN4. As a result, transistors 22.MP1–22MP.8, 22.Q1, and 22.Q2 are also off.

In the operating mode (i.e. non-power-down mode), bias signals NB1 and NB2 turn transistors 22.MN1–22.MN4 on. As a result of transistors 22.MN1 and 22.MN3 turning on, transistors 22.MP1, 22.MP5, 22.MP6, 22.MP7, and 22.MP8 turn on and as a result of transistors 22.MN2 and 22.MN4 turning on, transistors 22.MP2, 22.MP3, and 22.MP4 turn on. A current in the range of 12–15 $\mu$A flows through transistors 22.MN3 and 22.MN4 at room temperature.

Series connected transistors 22.MP1, 22.MP5, and 22.MP6 form a cascode bias source to bias transistors 22.MP7 and 22.MP8. Transistors 22.MP3 and 22.MP4 mirror the current through transistor 22.MP2. The W/L ratio of transistor 22.MP3 is four times that of transistor 22.MP4. The W/L ratio of transistor 22.MP7 is also four times that of transistor 22.MP8. As a result, the current supplied to the emitter of transistor 22.Q2 is four times that supplied to the emitter of transistor 22.Q1.

In addition, the emitter area of transistor 22.Q1 is 11.5 times that of transistor 22.Q2 so that the emitter current density of transistor 22.Q1 is 46 times that of transistor 22.Q2. As a result, the delta VBE between transistors 22.Q2 and 22.Q1 (delta VBE=$VBE_{22.Q2}-VBE_{22.Q1}=(kT/q)\ln(J_{22.Q2}/J_{22.Q1})$) is approximately 100 mV with VBEHI being in the range of about 620–640 mV and VBELO being in the range of about 520–540 mV at room temperature.

Figure 23:
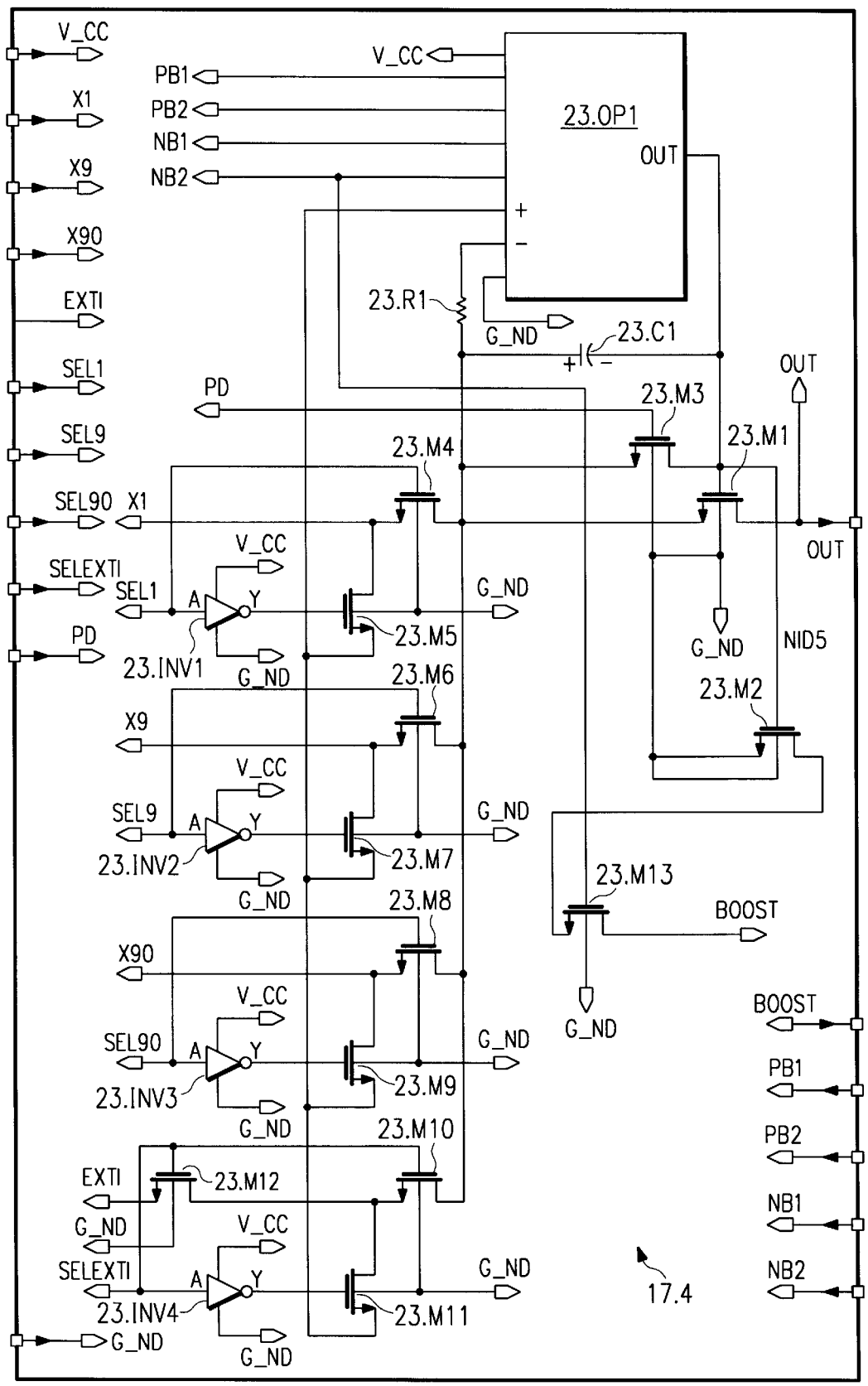
FIG. 23 is an electrical schematic diagram in partial block form of diode multiplexer circuit 17.4 of FIG. 17.

FIG. 23 is an electrical schematic diagram of diode multiplexer circuit 17.4 of FIG. 17. Diode multiplexer circuit 17.4 includes inverters 23.INV1–23.INV4, n-channel field effect transistors 23.M1–23.M13, operational amplifier 23.OP1 having a non-inverting input coupled to ground at node G_ND, resistor 23.R1, and capacitor 23.C1 coupled between the output and inverting input of operational amplifier 23.OP1. Capacitor 23.C1 has a value of approximately 5 pf to provide high frequency compensation.

Diode multiplexer circuit 17.4 receives input signals PB1, PB2, NB1, and NB2 from bias circuit 17.2 of FIG. 17, input signals X1, X9, X90 from photodiode array 1.24 of FIG. 1, optional test current input signal EXTI from the output enable pin, and input signals SEL1, SEL9, SEL90, SELEXTI, and PD from input interface 2.2 of FIG. 6. Diode multiplexer circuit 17.4 supplies an output signal OUT to the SUM inputs of switched capacitor circuit 17.6 and amplifier circuit 17.8 and an output signal BOOST to amplifier circuit 17.8 of FIG. 17.

In the power-down mode, input signals PB1, PB2, NB1, and NB2 disable operational amplifier 23.OP1 and turn off transistor 23.M13. In addition, a high signal PD turns on transistor 23.M3 to couple the output of operational amplifier 23.OP1 to its inverting input through resistor 23.R1.

In the operating mode (i.e. non-power-down mode), input bias signals PB1, PB2, NB1, and NB2 enable operational amplifier 23.OP1 and turn on transistor 23.M13 and a low signal PD turns transistor 23.M3 off. During normal operation, select signal SELEXTI is low and one or more of select signals SEL1, SEL9, and SEL90 is high to selectively couple an associated signal X1, X9, or X90 to the inverting input of operational amplifier 23.OP1. In a test mode of operation, select signals SEL1, SEL9, and SEL90 are low and select signal SELEXTI is high to couple associated test current signal EXTI supplied via the output enable pin to the inverting input of operational amplifier 23.OP1.

If select signal SEL1 is high, transistor 23.M4 is on and transistor 23.M5 is off. As a result, signal X1, the output of a single photodiode in array 1.24 of FIG. 1, is coupled to the inverting input of operational amplifier 23.OP1 through resistor 23.R1.

If select signal SEL1 is low, transistor 23.M4 is off and transistor 23.M5 is on. As a result, signal X1 is coupled to ground at node G_ND.

If select signal SEL9 is high, transistor 23.M6 is on and transistor 23.M7 is off. As a result, signal X9, the output of a nine parallel connected photodiodes in array 1.24 of FIG. 1, is coupled to the inverting input of operational amplifier 23.OP1 through resistor 23.R1.

If select signal SEL9 is low, transistor 23.M6 is off and transistor 23.M7 is on. As a result, signal X9 is coupled to ground at node G_ND.

If select signal SEL90 is high, transistor 23.M8 is on and transistor 23.M9 is off. As a result, signal X90, the output of ninety parallel connected photodiodes in array 1.24 of FIG. 1, is coupled to the inverting input of operational amplifier 23.OP1 through resistor 23.R1.

If select signal SEL90 is low, transistor 23.M8 is off and transistor 23.M9 is on. As a result, signal X90 is coupled to ground at node G_ND.

If select signal SELEXTI is high, transistor 23.M10 is on and transistor 23.M11 is off. As a result, signal EXTI, an external test signal supplied via the output enable pin, is coupled to the inverting input of operational amplifier 23.OP1 through resistor 23.R1.

If select signal SELEXTI is low, transistor 23.M10 is off and transistor 23.M11 is on. As a result, signal EXTI is coupled to ground at node G_ND.

The output of operational amplifier 23.OP1 is connected to the gate of transistors 23.M2 and the gate of source follower transistor 23.M1. The source of transistor 23.M1 is connected to the inverting input of operational amplifier 23.OP1 through resistor 23.R1. Whenever any one of the select signals SEL1, SEL9, SEL90, or SELEXTI goes high and the associated signal X1, X9, X90 or EXTI pulls the inverting input of operational amplifier 23.OP1 low, the output of operational amplifier 23.OP1 will go high to turn on transistor 23.M1. Therefore, the only current path for any of signals X1, X9, X90, or EXTI that has been selected is via transistor 23.M1 and output signal OUT of diode multiplexer 17.4.

Since operational amplifier 23.OP1 is configured in a closed loop configuration with the non-inverting input coupled to ground at node G_ND, the inverting input of operational amplifier 23.OP1 will also be driven to ground. The inverting input of operational amplifier 23.OP1 therefore acts as a virtual ground. Transistor 23.M1 is connected as a source follower with its source coupled to the inverting input of operational amplifier 23.OP1 through resistor 23.R1 and output signal OUT provided at its drain. Circuitry receiving output signal OUT from diode multiplexer 17.4 therefore does not see the large capacitance of the photodiode array 1.24 but instead sees the small gate to drain and substrate capacitance of transistor 23.M1, typically only about 0.1 pf.

This arrangement of operational amplifier 23.OP1 and source follower transistor 23.M1, with operational amplifier 23.OP1 generating a virtual ground and transistor 23.M1 translating the output current of the photodiode array 1.24, isolates the large capacitance associated with photodiode array 1.24 of FIG. 1, as much as 110–150 pf when the entire array is selected, from the rest of light-to-digital signal converter 1.10. The capacitance seen by circuitry receiving the output signal OUT of diode multiplexer 17.4 is only about 0.1 pf and is due solely to transistor 23.M1. This is particularly significant with respect to operational amplifiers in amplifier circuit 17.8, which is described in detail below. The closed loop gain bandwidth product of these operational amplifiers is inversely related to the capacitive loading at their inputs. The significant reduction in capacitive loading provided by diode multiplexer circuit 17.4 permits the use of lower frequency operational amplifiers in amplifier circuit 17.8.

Diode multiplexer circuit 17.4 also includes transistor 23.M2 coupled in a current mirror configuration with transistor 23.M1. Transistors 23.M1 and 23.M2 are identical transistors and have the same gate input voltage. Transistors 23.M1 and 23.M2 also have substantially the same source potential since the source of transistor 23.M1 is at the virtual ground generated by operational amplifier 23.OP1 and the source of transistor 23.M2 is coupled to ground at node G_ND.

As a result, the current through transistor 23.M1 is substantially equal to the current through transistor 23.M2. The current through transistor 23.M2 also flows through transistor 23.M13 and is available as output signal BOOST which is supplied to amplifier circuit 17.8 to reduce an offset voltage of an operational amplifier in amplifier circuit 17.8 as will be described in detail below.

Figure 24:
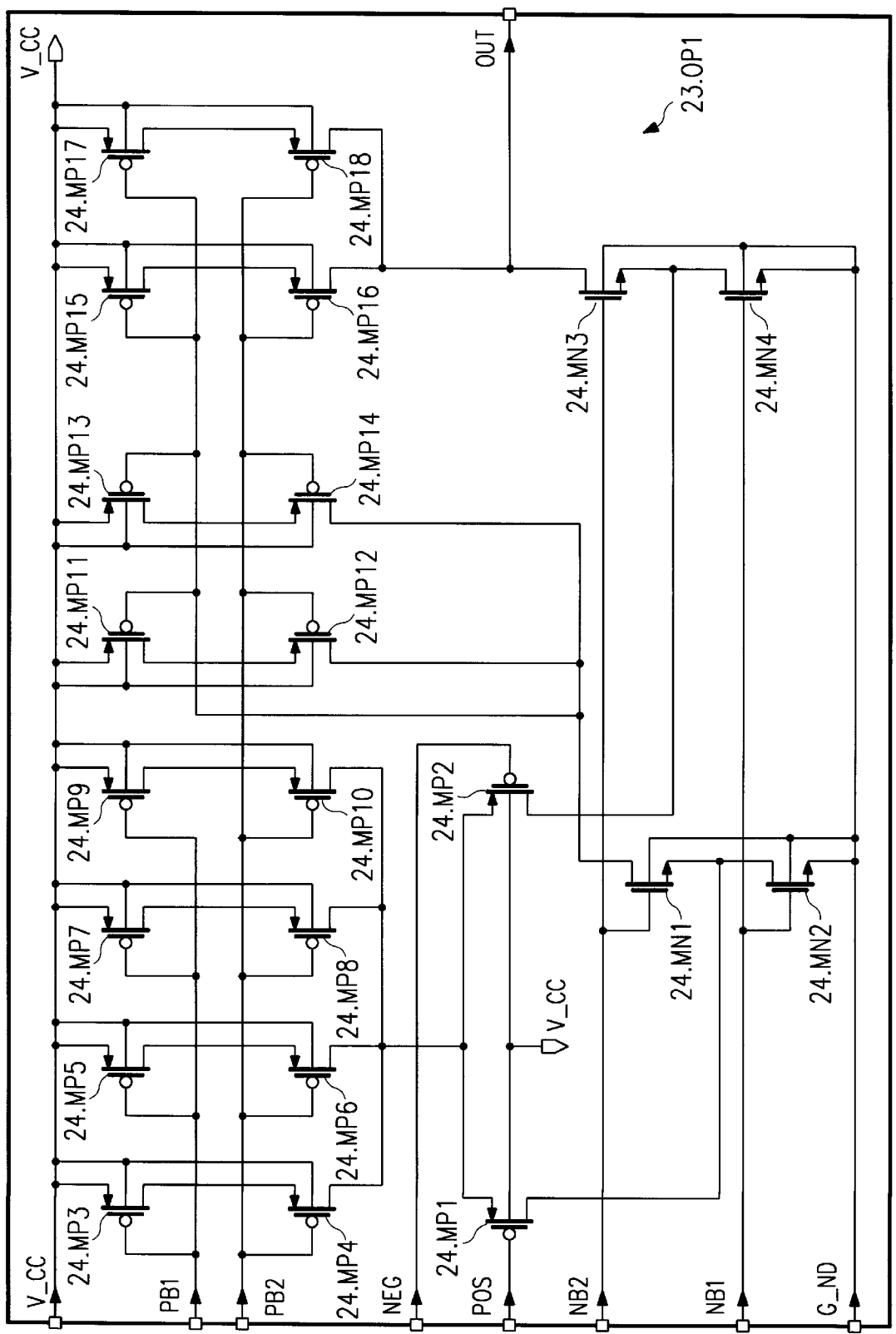
FIG. 24 is an electrical schematic diagram of operational amplifier circuit 23.OP1 of FIG. 23.

FIG. 24 is an electrical schematic diagram of operational amplifier 23.OP1 of FIG. 23. Operational amplifier 23.OP1 includes p-channel field effect transistors 24.MP1–24.MP18 and n-channel field effect transistors 24.MN1–24.MN4. Operational amplifier 23.OP1 receives bias signals PB1, PB2, NB1, and NB2 from bias circuit 17.2 of FIG. 17, has an inverting input NEG and a non-inverting POS, and produces an output signal OUT.

In the power-down mode, bias signals PB1, PB2, NB1, and NB2 are high and low, respectively, to turn transistors 24.MP3–24.MP18 and transistors 24.MN1–24.MN4 off to disable operational amplifier 23.OP1.

In the operating mode (i.e. non-power-down mode), bias signals PB1 and PB2 turn on transistors 24.MP3–24.MP18 and bias signals NB1 and NB2 turn on transistors 24.MN1–24.MN4 to enable operational amplifier 23.OP1. When enabled, operational amplifier 23.OP1 operates as a conventional operational amplifier.

Figure 25:
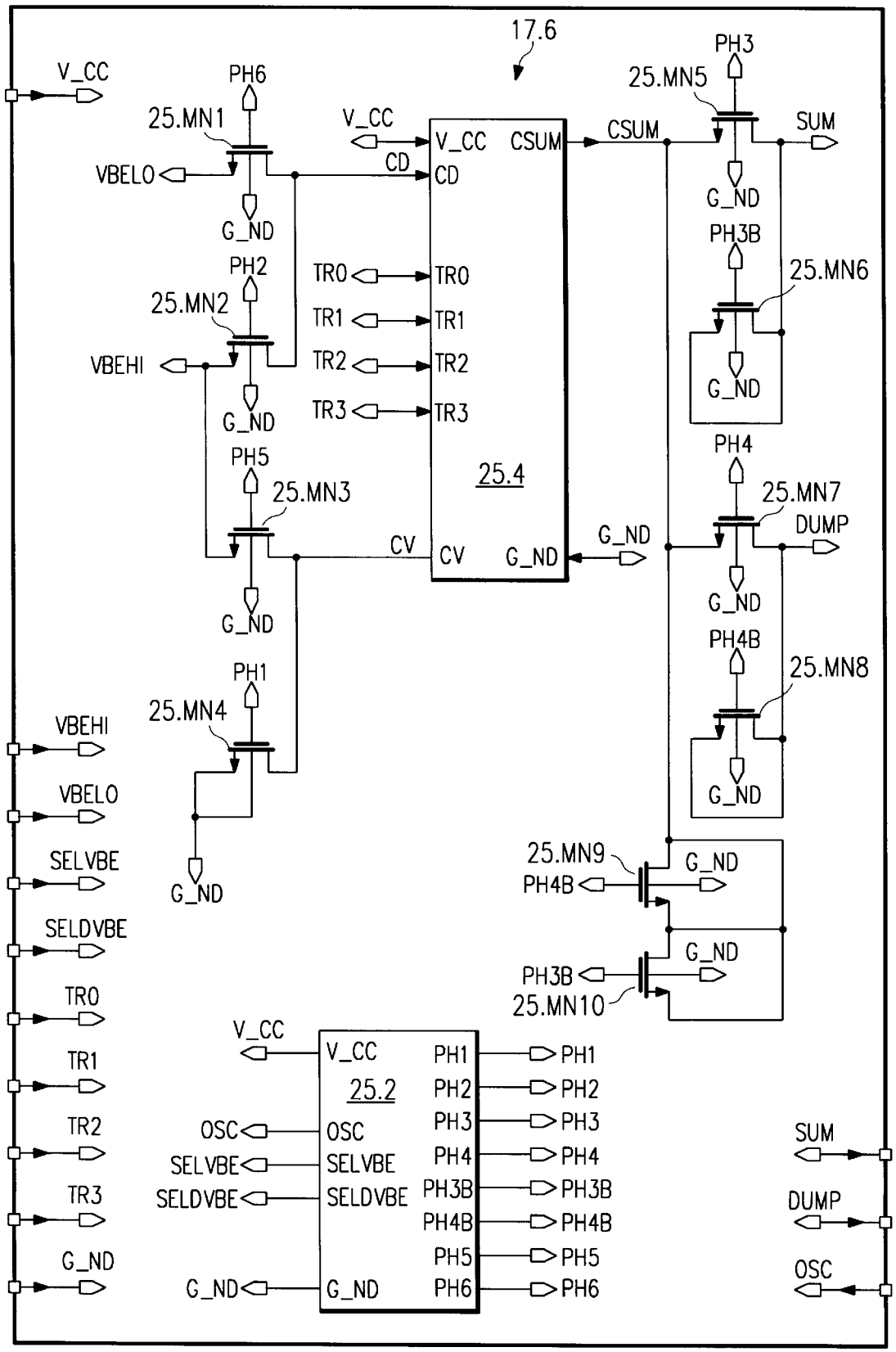
FIG. 25 is an electrical schematic diagram in partial block form of switched capacitor circuit 17.6 of FIG. 17.

FIG. 25 is an electrical schematic diagram in partial block form of switched capacitor circuit 17.6 of FIG. 17. Switched capacitor circuit 17.6 includes a clock circuit 25.2, a capacitor circuit 25.4, and n-channel transistors 25.MN1–25.MN10.

Clock circuit 25.2 receives input signal OSC from oscillator circuit 17.10 of FIG. 10 and input signals SELDVBE and SELVBE from input interface circuit 2.2 of FIG. 6. Clock circuit 25.2 produces output signals PHI–PH6, PH3B, and PH4B.

Output signals PH3, PH3B, PH4, and PH4B of clock circuit 25.2 are clock signals produced in response to input signal OSC. Output signals PH2 and PH6 are produced in response to input signals OSC and SELDVBE. When input signal SELDVBE is high, output signals PH2 and PH6 are additional clock signals. When input signal SELDVBE is low, signals PH2 and PH6 are low. Output signals PH5 and PH1 are produced in response to input signals OSC and SELVBE. When input signal SELVBE is high, signals PH5 and PH1 are additional clock signals. When input signal SELVBE is low, output signals PH5 and PH1 are low.

Input signals SELVBE and SELDVBE are both high during normal operation and during the third test mode. Input signal SELVBE is low and input signal SELDVBE is high during a first test mode for testing the value of ΔVBE, where ΔVBE=VBEHI−VBELO. Input signal SELDVBE is low and input signal SELVBE is high during a second test mode for testing the value of VBEHI.

Figure 28A:
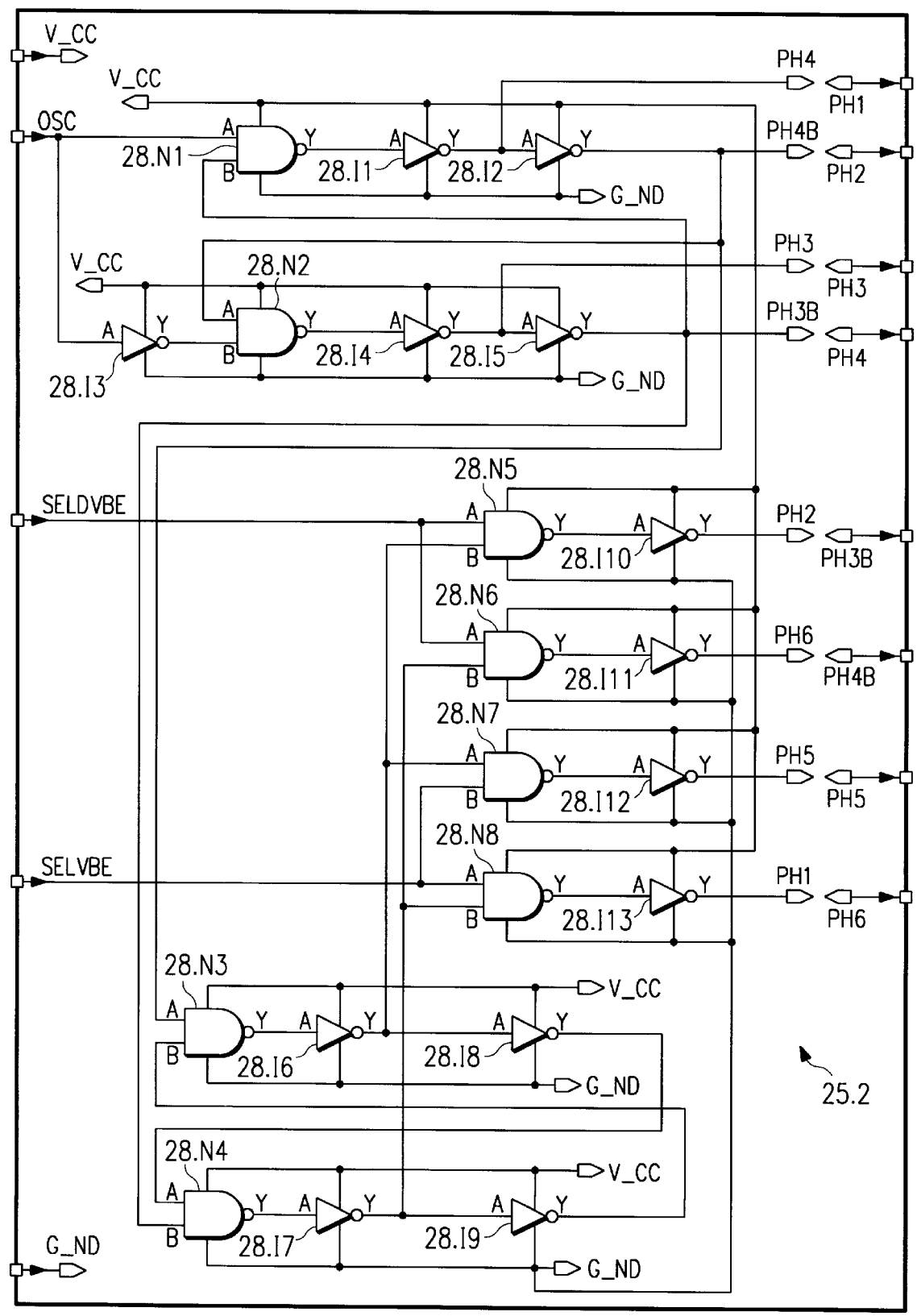
FIG. 28a is an electrical schematic diagram of clock circuit 25.2 of FIG. 25.
Figure 28B:
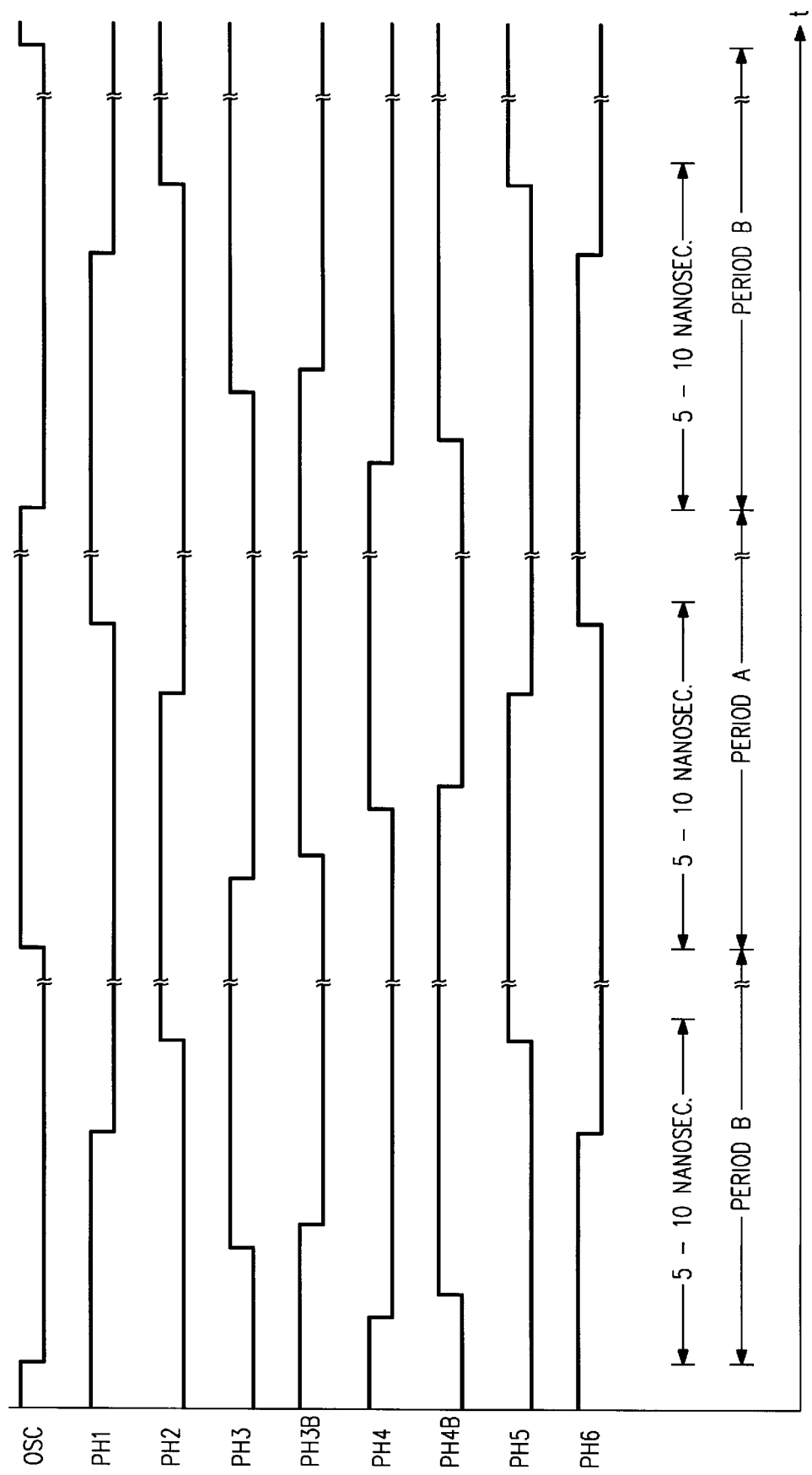
FIG. 28b is a timing diagram showing the output signals of clock circuit 25.2.

FIG. 28b is a timing diagram showing clock signals PH1–PH6, PH3B, and PH4B produced by clock circuit 25.2 in response to input signal OSC when input signals SELDVBE and SELVBE are high. Each of clock signals PH1–PH6, PH3B, and PH4B is applied to the gate of an associated one of transistors 25.MN1–25.MN10 to control whether the transistor is on or off.

Capacitor circuit 25.4 is a circuit having a first capacitance C1 between input node CV and output node CSUM and a second capacitance C2, that is six times larger than the first capacitance C1, between input node CD and output node CSUM. Trim signals TR0–TR3 are supplied to capacitor circuit 25.4 for trimming the first and second capacitances to desired values. Input node CD is selectively coupled to VBELO by transistor 25.MN1 and to VBEHI by transistor 25.MN2. Input node CV is selectively coupled to VBEHI by transistor 25.MN3 and to ground at node G_ND by transistor 25.MN4.

Output node CSUM of capacitor circuit 25.4 is selectively connected to node SUM by transistor 25.MN5. Node SUM is connected to the input of an integrator in amplifier circuit 17.8. Output node CSUM of capacitor circuit 25.4 is also selectively connected to node DUMP by transistor 25.MN7. Node DUMP is connected to the inverting input of an operational amplifier in amplifier circuit 17.8.

During normal operation (i.e. non-test mode) signals SELDVBE and SELVBE are high and clock signals PH1–PH6, PH3B, and PH4B shown in FIG. 28b are applied to the gates of transistors 25.MN1–25.MN10. During time period A in FIG. 28b, the clock signals cause transistors 25.MN1, 25.MN4, 25.MN7, 25.MN6, and 25.MN10 to be on and transistors 25.MN2, 25.MN3, 25.MN5, 25.MN8, and 25.MN9 to be off. As a result, input node CD of capacitor circuit 25.4 is connected to VBELO by transistor 25.MN1; input node CV of capacitor circuit 25.4 is connected to ground at node G_ND by transistor 25.MN4; and output node CSUM of capacitor circuit 25.4 is connected to node DUMP by transistor 25.MN7. Transistor 25.MN8 has its source and drain tied to the drain of transistor 25.MN7. Transistor 25.MN9 has its source and drain tied to the source of transistor 25.MN7. Transistors 25.MN8 and 25.MN9 turn off when transistor 25.MN7 turns on to provide a first order cancellation of the effect on the charge at nodes CSUM and DUMP caused by capacitive switch coupling due to switching transistor 25.MN7 on.

During time period A, the integrator in amplifier circuit 17.8 of FIG. 17 is integrating photodiode current. When the integrated value exceeds a reference value, output signal COMP of amplifier 17.8 goes from high to low to gate oscillator circuit 17.10 of FIG. 17. This causes the output signal OSC of oscillator circuit 17.10 to go low causing clock circuit 25.2 to produce non-overlapping clock signals PH1–PH6, PH3B, and PH4B as shown in time period B in FIG. 28b. The clock signals cause transistors 25.MN1, 25.MN4, 25.MN7, 25.MN6, and 25.MN10 to be off and transistors 25.MN2, 25.MN3, 25.MN5, 25.MN8, and 25.MN9 to be on. As a result, input node CD of capacitor circuit 25.4 is connected to VBEHI by transistor 25.MN2; input node CV of capacitor circuit 25.4 is connected to VBEHI by transistor 25.MN3; and output node CSUM of capacitor circuit 25.4 is connected to node SUM by transistor 25.MN5. As a result, a charge of:

$$Q=(VBEHI*C1)+(\Delta VBE*C2),$$

where ΔVBE=VBEHI−VBELO is transferred to node SUM and the input of the integrator to discharge the integrator. Transistors 25.MN6 and 25.MN10 turn off when transistor 25.MN5 turns on to provide a first order cancellation of the effect on the charge at nodes CSUM and SUM caused by capacitive switch coupling due to switching transistor 25.MN5 on.

The transfer of charge Q to node SUM whenever signal OSC goes low results in an equivalent average current of:

$$I=F*[(VBEHI*C1)+(\Delta VBE*C2)]$$

being added to the input of the integrator of amplifier circuit 17.8 at node SUM, where F is frequency of signal OSC. The current subtracted from the input of the integrator of amplifier circuit 17.8 at node SUM is the photodiode current.

Since node SUM is in a closed loop, the current added at node SUM equals the current subtracted from node SUM. The frequency, F, of signal OSC is therefore directly proportional to photodiode current, I, assuming that the value [(VBEHI*C1)+(ΔVBE*C2)] is constant and that the integrator in amplifier circuit 17.8 settles completely during the period of signal OSC.

Time period A has a length that varies inversely with the magnitude of the photodiode current and may be measured in seconds for very low light levels. Time period B is essentially constant at about 350 nanoseconds.

The accuracy of light-to-digital signal converter 1.10 depends primarily on the initial value of the capacitors in capacitor circuit 25.4 and the temperature characteristics of the capacitors and the elements in bandgap reference circuit 18.10. The capacitors in capacitor circuit 25.4 are poly-to-poly capacitors and thus have a very low temperature coefficient. The temperature characteristics of the elements in bandgap reference circuit 18.10 are well known. For a flat temperature characteristic of the value of [(VBEHI*C1)+(ΔVBE*C2)], the term [VBEHI+C2/C1(ΔVBE)] can be set to be approximately equal to 1.25 V. For values of VBEHI and ΔVBE of about 640 mV and 100 mV, respectively, C2 has a value six times that of C1. Initial values of the capacitors in capacitor circuit 25.4 can be set by trimming at probe as discussed below with respect to FIG. 27.

The third test mode of operation, in which signals SELDVBE and SELVBE are high, is identical to normal operation described above with the exception that instead of integrating photodiode current, the integrator in amplifier circuit 17.8 of FIG. 17 integrates a known current EXTI supplied by way of the output enable pin. The third test mode permits the operation of light-to-digital signal converter 1.10 to be tested without exposure to light.

During the second test mode, in which signal SELDVBE is low and signal SELVBE is high to test the value of VBEHI, clock signals PH1, PH3–PH5, PH3B, and PH4B as shown in FIG. 28b and low clock signals PH2 and PH6 are applied to the gates of transistors 25.MN1–25.MN10. During time period A in FIG. 28b, the clock signals cause transistors 25.MN4, 25.MN6, 25.MN7, and 25.MN10 to be on and transistors 25.MN1, 25.MN2, 25.MN3, 25.MN5, 25.MN8, and 25.MN9 to be off. As a result, input node CD of capacitor circuit 25.4 is not connected to VBELO by transistor 25.MN1; input node CV of capacitor circuit 25.4 is connected to ground at node G_ND by transistor 25.MN4; and output node CSUM of capacitor circuit 25.4 is connected to node DUMP by transistor 25.MN7.

During this period, the integrator in amplifier circuit 17.8 of FIG. 17 is integrating a known current EXTI supplied by way of the output enable pin. When the integrated value exceeds a reference value, output signal COMP of amplifier 17.8 goes from high to low to gate oscillator circuit 17.10 of FIG. 17. This causes the output signal OSC of oscillator circuit 17.10 to go low causing clock circuit 25.2 to produce clock signals PH1, PH3–PH5, PH3B, and PH4B as shown in time period B in FIG. 28b. Clock signals PH2 and PH6 remain low. The clock signals cause transistors 25.MN1, 25.MN2, 25.MN4, 25.MN6, 25.MN7, and 25.MN10 to be off and transistors 25.MN3, 25.MN5, 25.MN8, and 25.MN9 to be on. As a result, input node CD of capacitor circuit 25.4 is not connected to VBEHI by transistor 25.MN2; input node CV of capacitor circuit 25.4 is connected to VBEHI by transistor 25.MN3; and output node CSUM of capacitor circuit 25.4 is connected to node SUM by transistor 25.MN5. As a result, a charge of:

$$Q = (VBEHI * C1),$$

is transferred to node SUM and the input of the integrator to discharge the integrator.

The transfer of charge Q to node SUM whenever signal OSC goes low results in an equivalent average current of:

$$I = F * (VBEHI * C1)$$

being added to the input of the integrator of amplifier circuit 17.8 at node SUM, where F is frequency of signal OSC. The current subtracted from the input of the integrator of amplifier circuit 17.8 at node SUM is the known current EXTI.

Since node SUM is in a closed loop, the current added at node SUM equals the current EXTI subtracted from node SUM. Since current I, frequency F, and capacitance C1 in the above equation are known, the actual value of VBEHI can be determined.

During the first test mode, in which signal SELVBE is low and signal SELDVBE is high to test the value of ΔVBE or VBEHI–VBELO, clock signals PH2–PH4, PH6, PH3B, and PH4B as shown in FIG. 28b and low clock signals PH1 and PH5 are applied to the gates of transistors 25.MN1–25.MN10. During time period A in FIG. 28b, the clock signals cause transistors 25.MN1, 25.MN6, 25.MN7, and 25.MN10 to be on and transistors 25.MN2, 25.MN3, 25.MN4, 25.MN5, 25.MN8, and 25.MN9 to be off. As a result, input node CD of capacitor circuit 25.4 is connected to VBELO by transistor 25.MN1; input node CV of capacitor circuit 25.4 is not connected to ground at node G_ND by transistor 25.MN4; and output node CSUM of capacitor circuit 25.4 is connected to node DUMP by transistor 25.MN7.

During this period, the integrator in amplifier circuit 17.8 of FIG. 17 is integrating a known current EXTI supplied by way of the output enable pin. When the integrated value exceeds a reference value, output signal COMP of amplifier 17.8 goes from high to low to gate oscillator circuit 17.10 of FIG. 17. This causes the output signal OSC of oscillator circuit 17.10 to go low causing clock circuit 25.2 to produce clock signals PH2–PH4, PH6, PH3B, and PH4B as shown in time period B in FIG. 28b. Clock signals PH1 and PH5 remain low. The clock signals cause transistors 25.MN1, 25.MN3, 25.MN4, 25.MN6, 25.MN7, and 25.MN10 to be off and transistors 25.MN2, 25.MN5, 25.MN8, and 25.MN9 to be on. As a result, input node CD of capacitor circuit 25.4 is connected to VBEHI by transistor 25.MN2; input node CV of capacitor circuit 25.4 is not connected to VBEHI by transistor 25.MN3; and output node CSUM of capacitor circuit 25.4 is connected to node SUM by transistor 25.MN5. As a result, a charge of:

$$Q = (\Delta VBE * C2),$$

where ΔVBE=VBEHI−VBELO is transferred to node SUM and the input of the integrator to discharge the integrator.

The transfer of charge Q to node SUM whenever signal OSC goes low results in an equivalent average current of:

$$I = F * (\Delta VBE * C2)$$

being added to the input of the integrator of amplifier circuit 17.8 at node SUM, where F is frequency of signal OSC. The current subtracted from the input of the integrator of amplifier circuit 17.8 at node SUM is the known current EXTI.

Since node SUM is in a closed loop, the current added at node SUM equals the current EXTI subtracted from node SUM. Since current I, frequency F, and capacitance C2 in the above equation are known, the actual value of ΔVBE can be determined.

Figure 26:
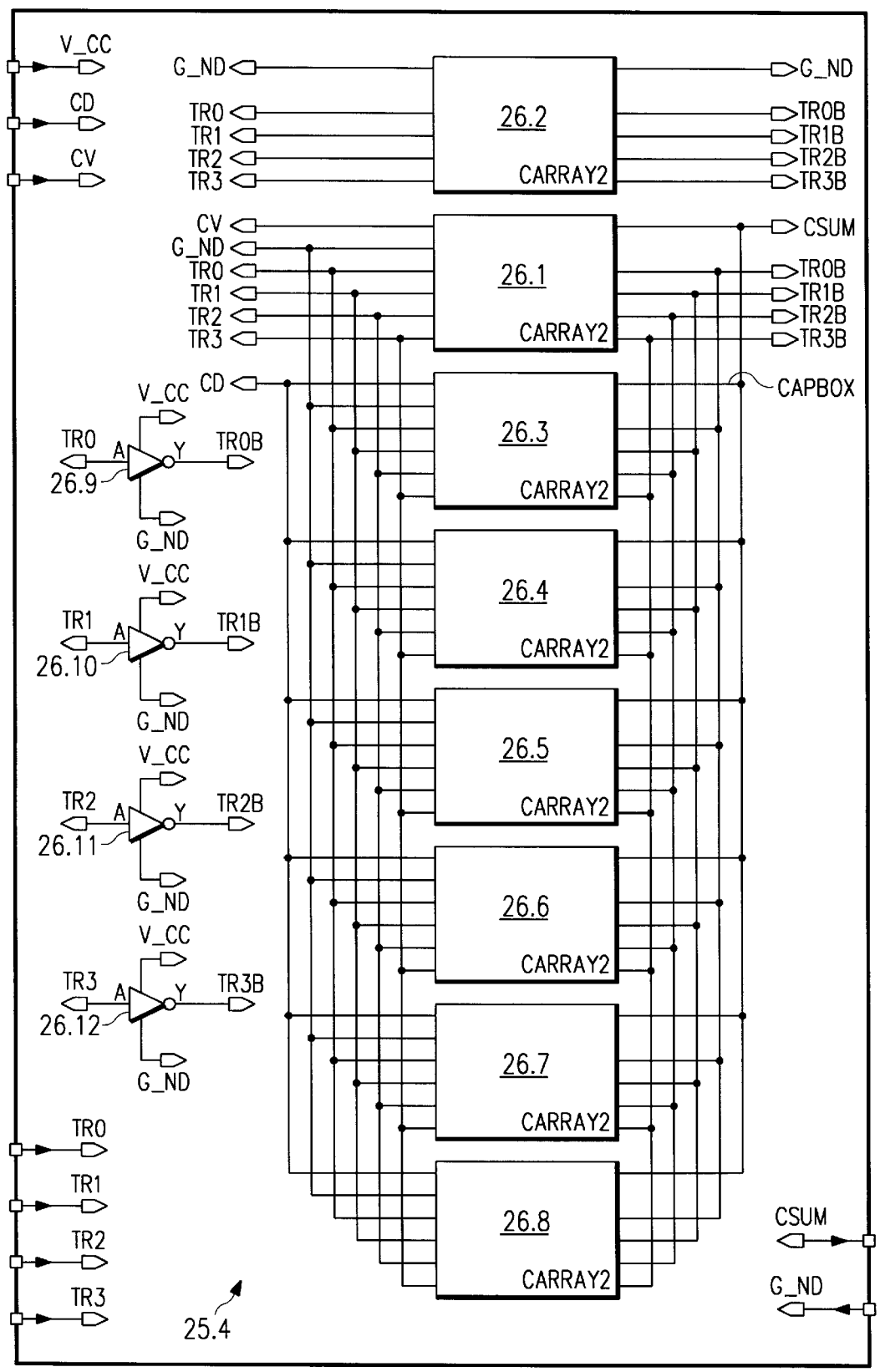
FIG. 26 is an electrical schematic diagram in partial block form of capacitor circuit 25.4 of FIG. 25.

FIG. 26 is a block diagram of capacitor circuit 25.4 of FIG. 25. Capacitor circuit 25.4 includes a plurality of identical capacitor arrays 26.1–26.8 and inverters 26.9–26.12. Trim signals TR0–TR3 are supplied from fuse circuit 1.30 (see FIGS. 1 and 16) to the inputs of inverters 26.9–26.12, respectively, to produce complementary trim signals TR0B–TR3B. Trim signals TR0–TR3 and their logical complements, trim signals TR0B–TR3B, are supplied to capacitor arrays 26.1–26.8 to adjust the capacitance of capacitor arrays 26.1–26.8 to a desired value. Trim signals TR0–TR3 and TR0B–TR3B control the capacitance of capacitor arrays 26.1–26.8 by controlling the number of capacitors connected in parallel in each array as will be described in detail in FIG. 27.

Input node CV is connected to the input of capacitor array 26.1. Input node CD is connected to the input of capacitor arrays 26.3–26.7. The outputs of capacitor arrays 26.1 and 26.3–26.7 are connected in common to output node CSUM. Capacitor array 26.2 has its input and output connected to ground at node G_ND. Capacitor array 26.2 is a redundant array that can be added to the others by way of a metal level option if needed for a greater range of capacitor values.

Figure 27:
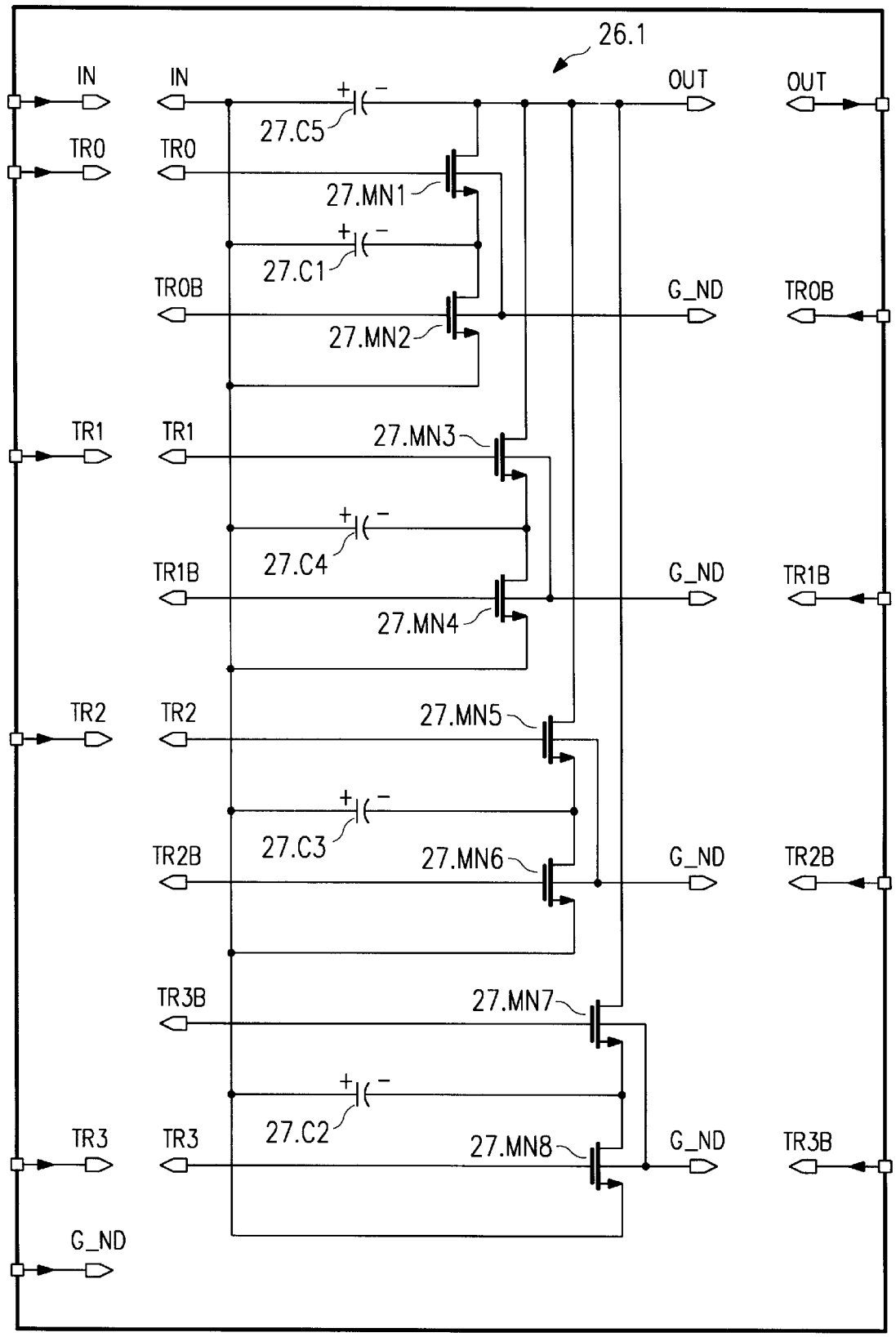
FIG. 27 is an electrical schematic diagram of capacitor array 26.1 of FIG. 26.

FIG. 27 is an electrical schematic diagram of capacitor array 26.1 of FIG. 26. Capacitor 26.1 includes capacitors 27.C1–27.C5 and n-channel transistors 27.MN1–27.MN8. The total capacitance between nodes IN and OUT is determined by the values of one or more capacitors 27.C1–27.C5 that have a first terminal connected to node IN and a second terminal connected to node OUT. Capacitor 27.C5 has first and second terminals permanently connected to nodes IN and OUT. Each of capacitors 27.C1–27.C4 can be selectively connected in parallel with capacitor 27.C5 by turning an associated one of transistors 27.MN1, 27.MN7, 27.MN5, and 27.MN3 on and an associated one of transistors 27.MN2, 27.MN8, 27.MN6, and 27.MN4 off.

Capacitors 27.C1–27.C5 preferably have nominal values of 0.1 pf, 0.8 pf, 0.5 pf, 0.2 pf, and 3.2 pf, respectively. Prior to probe, trim signals TR0–TR3 are initially low and trim signals TR0B–TR3B are initially high. As a result, transistors 27.MN1, 27.MN3, 27.MN5, and 27.MN8 are off and transistors 27.MN2, 27.MN4, 27.MN6, and 27.MN7 are on and only capacitor 27.C2 is connected in parallel with capacitor 27.C5. The remaining capacitors 27.C1, 27.C4, and 27.C3 have their first and second terminals connected to node IN.

The anticipated value of the capacitance between nodes IN and OUT during probe is therefore the parallel capacitance of capacitors 27.C5 and 27.C2 or 4.0 pf. If the actual value of the capacitance between nodes IN and OUT measured during probe differs from the anticipated value, the actual value can be adjusted by programming the values of trim signals TR0–TR3 and TR0B–TR3B to connect one or more of capacitors 27.C1, 27.C4, and 27.C3 in parallel with capacitor 27.C5 or to terminate the parallel connection of capacitor 27.C2 with capacitor 27.C5.

For example, if the actual value of the capacitance between nodes IN and OUT measured during probe with trim signals TR0–TR3 low and trim signals TR0B–TR3B high is 3.8 pf and the desired capacitance is 4.0 pf, then trim signal TR0 and its complement TR0B can be programmed to be high and low, respectively, to turn transistor 27.MN3 on and transistor 27.MN4 off. With transistor 27.MN3 on and transistor 27.MN4 off, capacitor 27.C4 with a value of 0.2 pf will be coupled in parallel with capacitors 27.C5 and 27.C1.

Trim signals TR0–TR3 and TR0B–TR3B are permanently set during probe by blowing polysilicon fuses as described in detail above with respect to FIG. 16. The ability to adjust the capacitance between nodes IN and OUT of capacitor array 26.1 permits compensation to be made for any deviation from a desired value of capacitance that may result from process variations.

FIG. 28a is an electrical schematic diagram of clock circuit 25.2 of FIG. 25. Clock circuit 25.2 includes inverters 28.I1–28.I13 and NAND gates 28.N1–28.N8. Clock circuit 25.2 receives input signal OSC from oscillator circuit 17.10 of FIG. 17 and input signals SELDVBE and SELVBE from input interface circuit 2.2 of FIG. 6. Clock circuit 25.2 produces output signals PH1–PH6, PH3B, and PH4B which are non-overlapping clock signals.

Output signals PH3, PH3B, PH4, and PH4B are clock signals produced in response to input signal OSC. Output signals PH2 and PH6 are produced in response to input signals OSC and SELDVBE. When input signal SELDVBE is high, output signals PH2 and PH6 are additional clock signals. When input signal SELDVBE is low, signals PH2 and PH6 are low. Output signals PH5 and PH1 are produced in response to input signals OSC and SELVBE. When input signal SELVBE is high, signals PH5 and PH1 are additional clock signals. When input signal SELVBE is low, output signals PH1 and PH5 are low.

FIG. 28b is a timing diagram showing clock signals PH1–PH6, PH3B, and PH4B produced by clock circuit 25.2 when signals SELDVBE and SELVBE are high.

Figure 29:
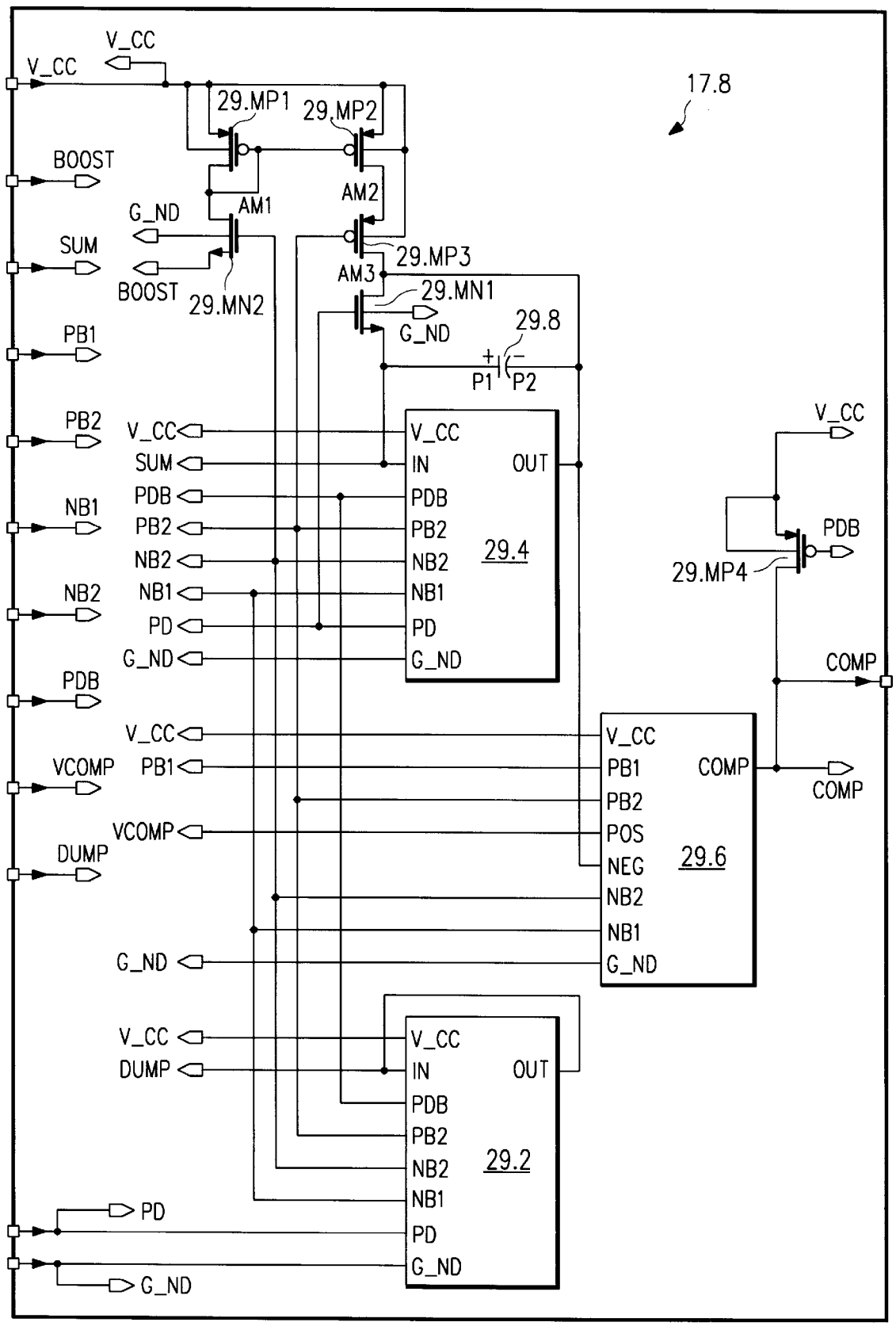
FIG. 29 is an electrical schematic diagram in partial block form of the amplifier circuit 17.8 of FIG. 17.

FIG. 29 is an electrical schematic diagram in partial block form of amplifier circuit 17.8 of FIG. 17. Amplifier circuit 17.8 includes first operational amplifier 29.2, second operational amplifier 29.4, comparator 29.6, integrating capacitor 29.8, n-channel transistors 29.MN1 and 29.MN2, and p-channel transistors 29.MP1–29.MP4.

Operational amplifiers 29.2 and 29.4 receive bias signals PB2, NB1, and NB2 from bias circuit 17.2 of FIG. 17 and power-down signals PD and PDB from input interface circuit 6.2 of FIG. 2. In the power-down mode, bias signal PB2 is high and bias signals NB1 and NB2 are low to disable current sources in operational amplifiers 29.2 and 29.4. In addition, signal PDB is low and signal PD is high to force operational amplifiers 29.2 and 29.4 to produce an output signal OUT that is low. In the power-down mode, signals PB2, NB1, NB2, PD, and PDB thus disable operational amplifiers 29.2 and 29.4. In the operating mode (i.e. non-power-down mode), bias signals PB2, NB1 and NB2 enable current sources in operational amplifiers 29.2 and 29.4. In addition, signal PDB is high and signal PD is low to enable operational amplifier circuit 29.2.

Comparator 29.6 receives bias signals PB1, PB2, NB1, and NB2 from bias circuit 17.2 of FIG. 17. In the power-down mode, bias signals PB1 and PB2 are high and bias signals NB1 and NB2 are low to disable current sources in comparator 29.6 and thus comparator 29.6 itself. In the operating mode (i.e. non-power-down mode), bias signals PB2, NB1 and NB2 enable current sources in comparator 29.6 thus enabling comparator 29.6.

The gates of transistors 29.MN2 and 29.MP3 receive bias signals NB2 and PB2, respectively, and are thus turned off in the power-down mode and on in the operating mode (i.e. non-power-down mode). The gates of transistors 29.MN1 and 29.MP4 receive signals PD and PDB, respectively, and are thus also turned off in the power-down mode and on in the operating mode (i.e. non-power-down mode). In the power-down mode, the output signal COMP of amplifier circuit 17.8 is forced high since transistor 29.MP4 is on.

Operational amplifier 29.4 has an inverting input IN that is connected to node SUM of switched capacitor circuit 17.6 of FIG. 25. Integrating capacitor 29.8 is connected between the input IN and the output OUT of operational amplifier 29.4. Operational amplifier 29.4 and capacitor 29.8 form an integrator that integrates photodiode current pulled from node SUM.

The output OUT of operational amplifier 29.4 is connected to the negative or inverting input NEG of comparator 29.6. The positive or non-inverting input of comparator 29.6 receives reference voltage signal VCOMP from bias circuit 18.8 of FIGS. 18 and 21. Whenever the voltage at output OUT of operational amplifier 29.4 exceeds VCOMP, the output signal COMP produced by comparator 29.6 goes low. Whenever the voltage at output OUT of operational amplifier 29.4 is less than VCOMP, the output signal COMP produced by comparator 29.6 goes high.

Operational amplifier 29.2 has an output OUT that is connected to its inverting input IN. Input IN of operational amplifier 29.2 operates as a low impedance voltage source and is typically at 0.8 volts at 25 degrees Centigrade, which is nominally equal to the voltage of bias signal NB1. Input IN of operational amplifier 29.2 is connected to node DUMP of switched capacitor circuit 17.6 of FIG. 25. The capacitors in capacitor circuit 25.4 of FIG. 25 are connected to input IN of operational amplifier 29.2 in order to permit them to charge to desired reference potentials.

Transistors 29.MP1, 29.MP2, 29.MP3, 29.MN1, and 29.MN2 form an offset voltage compensation circuit to reduce current induced offset voltage in operational amplifier 29.4 caused by photodiode current or test current being integrated by integrating capacitor 29.8 and pulled from node SUM in FIG. 29. Without the offset voltage compensation circuit, the current to be integrated by capacitor 29.8 would have to be supplied by operational amplifier 29.4 and would result in an offset voltage that would adversely affect the accuracy of light-to-digital signal converter 1.10.

Transistors 29.MP1, 29.MN2, 29.MP2, and 29.MP3 form a current mirror in which the current through transistors 29.MP1 and 29.MN1 to node BOOST is mirrored by and equal to the current through transistors 29.MP2 and 20.MP3. Since signal PD is low causing transistor 29.MN1 to be off, the current through transistors 29.MP2 and 29.MP3 is supplied to the output OUT of operational amplifier 29.4 and integrated by capacitor 29.8. As discussed above with respect to FIG. 23, the currents being pulled from nodes BOOST and SUM by multiplexer 17.4 of FIG. 23 are approximately equal. The current through transistors 29.MP2 and 29.MP3 therefore also closely approximates the current pulled from node SUM and acts as a boost current substantially eliminating the need for current to be supplied by operational amplifier 29.4. As a result, the offset voltage of operational amplifier 29.4 is substantially reduced as are errors attributable to the offset voltage.

Figure 30:
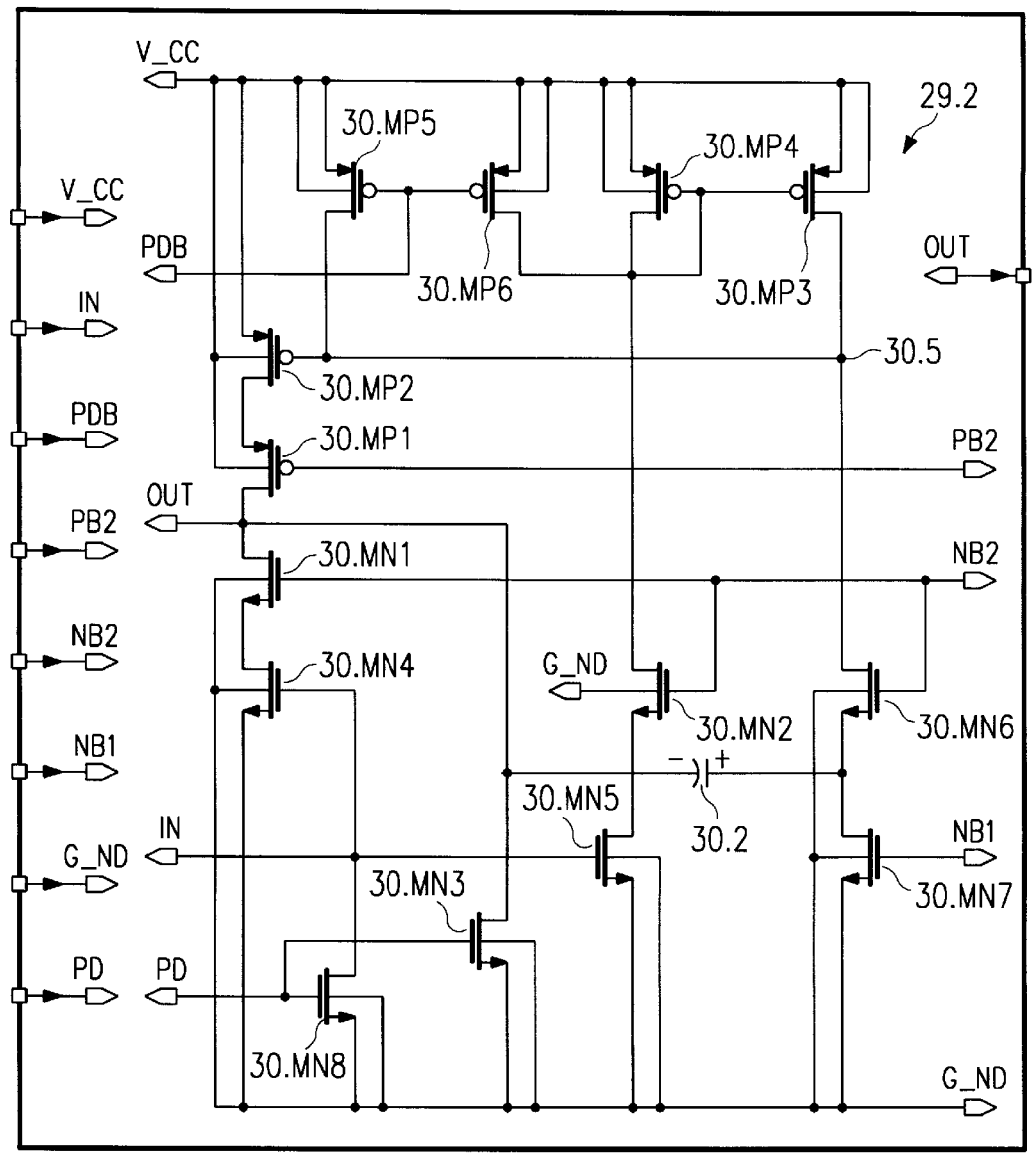
FIG. 30 is an electrical schematic diagram of operational amplifier 29.2 of FIG. 29.

FIG. 30 is an electrical schematic diagram of first operational amplifier circuit 29.2 of FIG. 29. Operational amplifier circuit 29.2 includes n-channel transistors 30.MN1–30.MN8, p-channel transistors 30.MP1–30.MP6, and compensation capacitor 30.2. Operational amplifier circuit 29.2 receives bias signals PB2, NB1, and NB2 from bias circuit 17.2 of FIG. 17, power-down signals PD and PDB from input interface circuit 6.2 of FIG. 2, has an input IN connected to the node SUM of switched capacitor circuit 17.6 of FIG. 25, and supplies an output signal OUT to comparator 29.6 of FIG. 29.

Operational amplifier 29.2 is a class AB, high gain, high bandwidth operational amplifier. Bias signal NB1 is supplied to the gate of n-channel transistor 30.MN7, which serves as the non-inverting input of operational amplifier 29.2. Since non-inverting input signal NB1 is also a bias signal, amplifier circuit 29.2 does not have differential inputs as in classic operational amplifiers. Input IN is connected to the gate of n-channel transistor 30.MN5, which serves as the inverting input of operational amplifier 29.2. The sources of transistors 30.MN7 and 30.MN5 are connected to ground at node G_ND. The drain of transistor 30.MN7 is connected to the source of n-channel transistor 30.MN6 and to a first terminal of compensation capacitor 30.2. The drain of transistor 30.MN5 is connected to the source of n-channel transistor 30.MN2. Bias signal NB2 is supplied to the gates of transistors 30.MN6, 30.MN2, and 30.MN1. The drain of transistor 30.MN6 is connected to the drain of p-channel transistor 30.MP3. The drain of transistor 30.MN2 is connected to the drains of p-channel transistors 30.MP4 and 30.MP6. The gates of transistors 30.MP4 and 30.MP3 are connected to the drain of transistor 30.MP4.

The gate of p-channel transistor 30.MP2 is connected to node 30.5 which is connected between the drains of transistors 30.MN5 and 30.MP3. The source of transistor 30.MP2 is connected to supply voltage V_CC and the drain of transistor 30.MP2 is connected to the source of p-channel transistor 30.MP1. P-channel transistor 30.MP5 has a source connected to V_CC and a drain connected to the gate of transistor 30.MP2. Signal PDB is supplied to the gates of transistors 30.MP5 and 30.MP6.

The drain of transistor 30.MP1 is connected in common to the drains of n-channel transistors 30.MN1 and 30.MN3, a second terminal of compensation capacitor 30.2, and to the output OUT of operational amplifier circuit 29.2. Bias signal PB2 is supplied to the gate of transistor 30.MP1. Bias signal NB2 is supplied to the gate of transistor 30.MN1. The source of transistor 30.MN1 is connected to the drain of transistor 30.MN4. The gate of transistor 30.MN4 is connected to the drain of transistor 30.MN8, to the gate of transistor 30.MN5, and to input IN. Signal PD is supplied to the gates of transistors 30.MN8 and 30.MN3. The sources of transistors 30.MN8 and 30.MN3 are connected to ground at node G_ND.

In the power-down mode, bias signal PB2 is high and bias signals NB1 and NB2 are low to turn transistors 30.MP1, 30.MN1, 30.MN2, 30.MN6, and 30.MN7 off. In addition, signal PDB is low and signal PD is high to turn on transistors 30.MP5, 30.MP6, 30.MN8, and 30.MN3. As a result, operational amplifier circuit 29.2 is disabled and produces an output signal OUT that is low.

In the operating mode (i.e. non-power-down mode), bias signals PB2, NB1 and NB2 turn transistors 30.MP1, 30.MN1, 30.MN2, 30.MN6, and 30.MN7 on. In addition, signal PDB is high and signal PD is low to turn off transistors 30.MP5, 30.MP6, 30.MN8, and 30.MN3. As a result, operational amplifier circuit 29.2 is enabled.

In operation, bias voltage NB1 establishes a nominal current through transistor 30.MN7. When the voltage at input node IN matches the voltage NB1, transistors 30.MP3 and 30.MN6 are operating in the saturation region. This results in a high differential, small signal gain for voltages between nodes IN and NB1 that is observed at node 30.5. The signal at node 30.5 is further amplified by transistor 30.MP2. A typical, small signal gain from node IN to node OUT is 80–100 dB at low frequencies. Since this high gain path is a two-stage amplifier, compensation is required and is provided by the pole-splitting capacitor 30.2, which has a value of about 5 pf. Capacitor 30.2 is connected to the cascode connection of transistors 30.MN6 and 30.MN7 to eliminate the classical problem of right half plane zeroes found in pole splitting techniques when applied to CMOS amplifiers.

In addition to the high gain path provided by differential transistor pair 30.MN5 and 30.MN7 and transistor 30.MP2, there is a moderate gain (40–50 dB), high frequency path created by the cascode stage of transistors 30.MN4 and 30.MN1 that results from the gate of transistor 30.MN4 being connected to input node IN. This path is a single stage amplifier and has one dominant pole determined by the capacitive loading at output node OUT.

Second operational amplifier circuit 29.4 is identical to amplifier 29.2 with the exception that the value of compensation capacitor 30.2 is 2.5 pf instead of 5.0 pf.

Figure 30A:
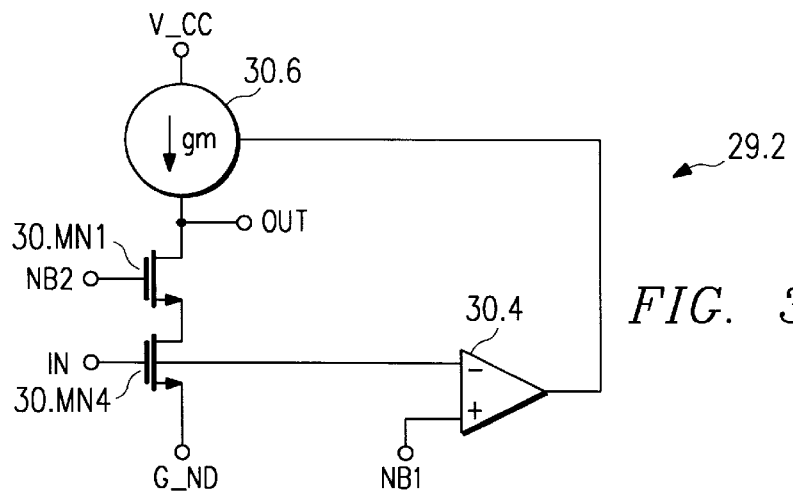
FIG. 30a is a simplified schematic diagram of amplifier 29.2 of FIG. 30.

FIG. 30a is a simplified schematic diagram of amplifier circuit 29.2 of FIG. 30 more clearly illustrating the moderate gain, high frequency path and the high gain, lower frequency path. Amplifier circuit 29.2 includes cascode connected transistors 30.MN1 and 30.MN4, op-amp 30.4, and transconductance circuit 30.6. Bias signal NB2 is supplied to the gate of transistor 30.MN1. Input signal IN is supplied to the gate of transistor 30.MN4 and the inverting input of op-amp 30.4. Bias signal NB1 is supplied to the non-inverting input of op-amp 30.4. The output of op-amp 30.4 is supplied to and controls transconductance circuit 30.6. The output terminal OUT of amplifier circuit is connected between the output of transconductance circuit 30.6 and the drain of transistor 30.MN1.

Amplifier circuit 29.2 has a moderate gain (40–50 dB), high frequency path resulting from a first stage formed by cascode connected transistors 30.MN4 and 30.MN1. In addition, amplifier circuit 29.2 has a lower frequency, high gain (80–100 dB) path resulting from a second stage formed by op-amp 30.4 and transconductance circuit 30.6.

Op-amp 30.4 includes differential transistor pair 30.MN5 and 30.MN7 from FIG. 30. Transconductance circuit 30.6 includes transistor 30.MP2 from FIG. 30.

Figure 31:
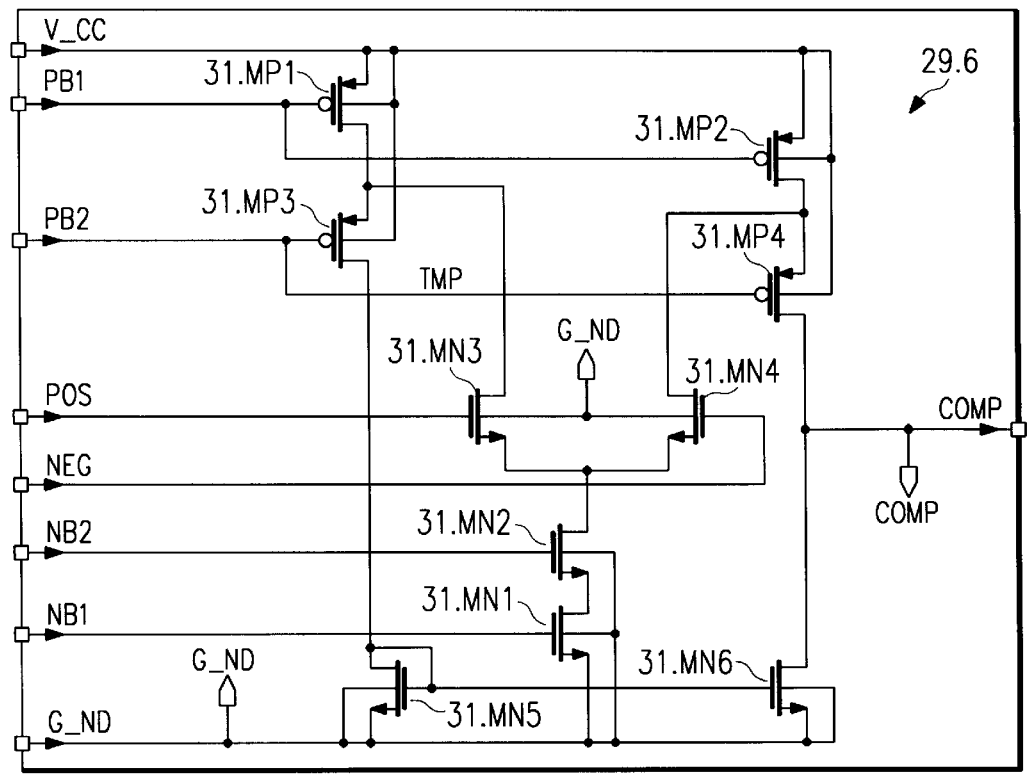
FIG. 31 is an electrical schematic diagram of comparator circuit 29.6 of FIG. 29.

FIG. 31 is an electrical schematic diagram of comparator 29.6 of FIG. 29. Comparator 29.6 includes n-channel transistors 31.MN1–31.MN6 and p-channel transistors 31.MP1–31.MP4. Comparator 29.6 receives bias signals PB1, PB2, NB1, and NB2 from bias circuit 17.2 of FIG. 17, has an inverting input NEG connected to the output of amplifier 29.4 of FIG. 29 and a non-inverting input POS connected to receive signal VCOMP from bias circuit 17.2 of FIG. 17, and produces an output signal COMP.

In the power-down mode, bias signals PB1 and PB2 are high and bias signals NB1 and NB2 are low to turn transistors 31.MP1–31.MP4 and transistors 31.MN1 and 31.MN2 off to disable comparator 29.6.

In the operating mode (i.e. non-power-down mode), bias signals PB1 and PB2 are low and bias signals NB1 and NB2 are high to turn transistors 31.MP1–31.MP4, 31.MN1, and 31.MN2 on to enable comparator 29.6. When enabled, comparator 29.6 operates as a conventional differential comparator to produce an output signal COMP that is high or low in response to the voltages applied to the inverting and non-inverting inputs NEG and POS, respectively. Comparator 29.6 produces an output signal COMP that is high when the output of amplifier 29.4, which is applied to inverting input NEG, is less than signal VCOMP, which is applied to non-inverting input POS. Comparator 29.6 produces an output signal COMP that is low when the output of amplifier 29.4, which is applied to inverting input NEG, is greater than signal VCOMP, which is applied to non-inverting input POS.

Figure 32:
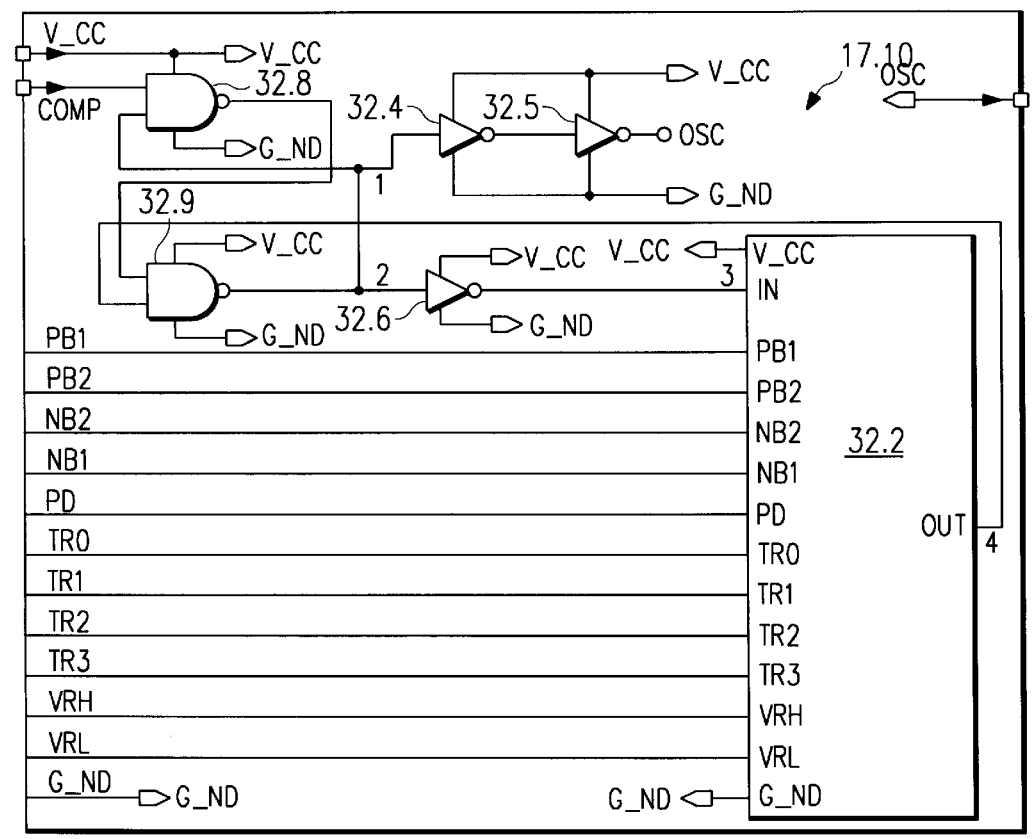
FIG. 32 is an electrical schematic diagram in partial block form of the oscillator circuit 17.10 of FIG. 17.

FIG. 32 is an electrical schematic diagram in partial block form of oscillator circuit 17.10 of FIG. 17. Oscillator circuit 17.10 includes delay circuit 32.2, inverters 32.4–32.6, and NAND gates 32.8 and 32.9. Oscillator circuit 17.10 receives an input signal COMP from comparator 29.9 of FIG. 29 and supplies an output signal OSC to multiplexer 6.8 and counter clear/three-state control circuit 6.4 of FIG. 6.

Delay circuit 32.2 operates as an inverter with hysteresis and delay. When input signal IN applied to delay circuit 32.2 changes state from low to high, there is a delay of approximately 250 nanoseconds before output signal OUT produced by delay circuit 32.2 changes state from high to low. When input signal IN applied to delay circuit 32.2 changes state from high to low, there is a delay of approximately 350 nanoseconds before output signal OUT produced by delay circuit 32.2 changes state from low to high. The different delays permit oscillator 17.10 to operate at a maximum frequency of about 1.6 MHz.

Delay circuit 32.2 receives bias signals PB1, PB2, NB1, NB2 and threshold voltage signals VRH, VRL from bias circuit 18.6 of FIGS. 18 and 20, power-down signal PD from TTL converter 7.2 of FIGS. 7 and 8, and trim signals TR0–TR3 from fuse circuit 1.30 of FIG. 16. Delay circuit 32.2 is selectively enabled or disabled in response to signals PB1, PB2, NB1, NB2, and PD. Threshold voltage signals VRH and VRL are used by a comparator in delay circuit 32.2 to provide the appropriate delay and hysteresis. Trim signals TR0–TR3 control the value of a capacitance in delay circuit 32.2.

Oscillator 17.10 operates as a gated oscillator to provide a frequency output with a pulse width of about 350 nanoseconds. Once input signal COMP goes low, oscillator 17.10 will begin oscillating and will continue oscillating until input signal COMP goes high. Oscillator 17.10 completes an integral number of complete cycles so that if input signal COMP goes high before an oscillation cycle is complete, that oscillation cycle will continue until completed.

High to low changes in the state of input signal COMP are latched into oscillator 17.10 by cross-coupled NAND gates 32.8 and 32.9. Inverter 32.6, delay circuit 32.2, and NAND gate 32.9 operate as a ring oscillator whenever input signal COMP goes low. During operation of light-to-digital signal converter 1.10 in light levels that are less than the maximum detectable light intensity, output signal OSC of oscillator 17.10 has a frequency equal to the rate at which input signal COMP changes state, which is directly related to incident light intensity. During operation of light-to-digital signal converter 1.10 in light levels that exceed the maximum detectable light intensity, input signal COMP remains low without changing state so that oscillator 17.10 produces output signal OSC having its maximum frequency of about 1.6 MHz.

Figure 33:
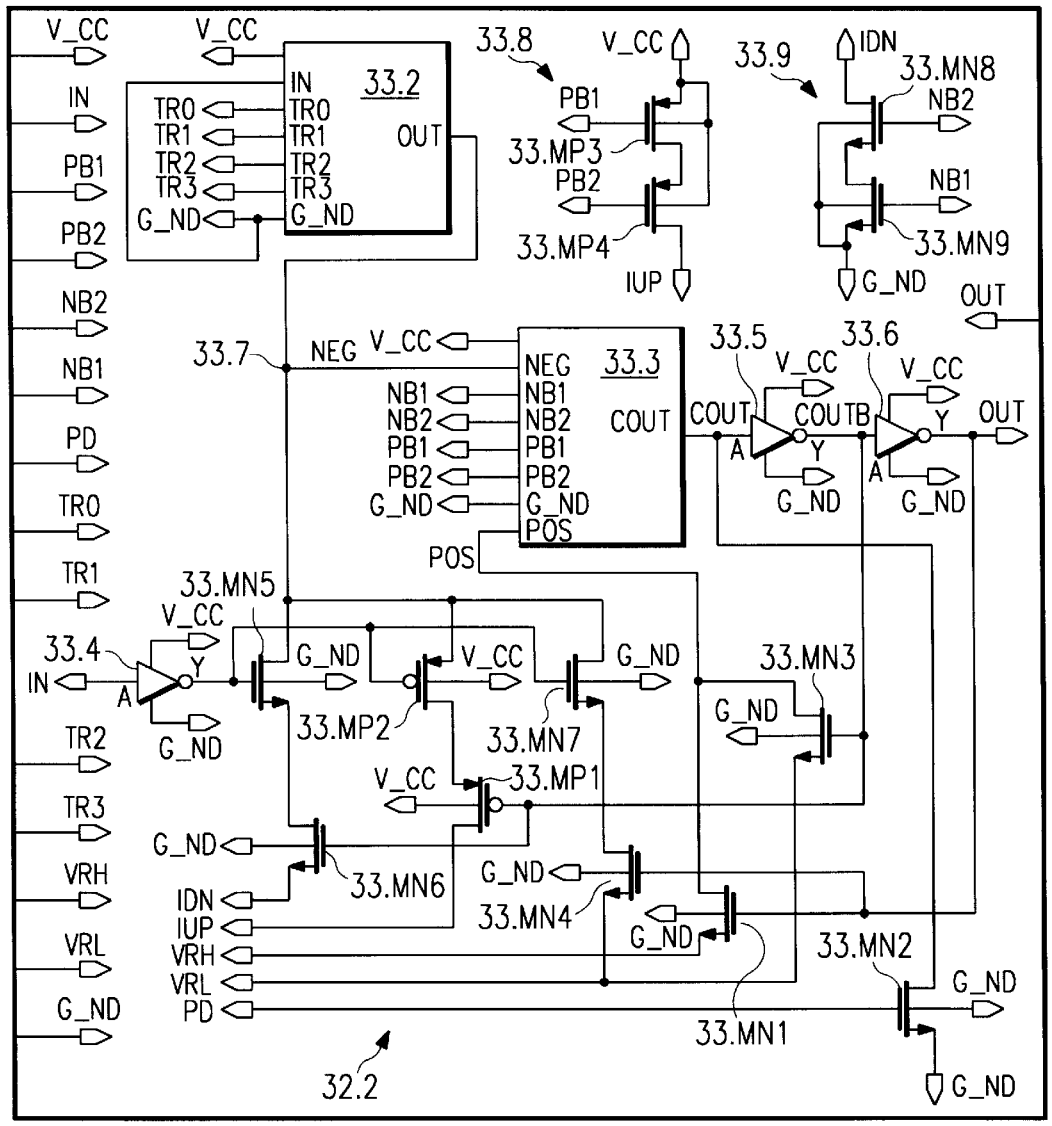
FIG. 33 is an electrical schematic diagram in partial block form of the delay circuit 32.2 of FIG. 32.

FIG. 33 is an electrical schematic diagram in partial block form of delay circuit 32.2 of FIG. 32. Delay circuit 32.2 includes delay capacitor circuit 33.2, delay comparator 33.3, inverters 33.4–33.6, n-channel transistors 33.MN1–33.MN9, and p-channel transistors 33.MP1–33.MP4. Delay circuit 32.2 receives input signals TR0–TR3, IN, PB1, PB2, NB1, NB2, VRH, VRL, and PD and produces output signal OUT. As seen in FIG. 32, input signal IN is received from inverter 32.6 of oscillator 17.10 and output signal OUT is supplied to NAND gate 32.4 of oscillator 17.10.

Delay circuit 32.2 operates as an inverter with hysteresis and delay. When input signal IN applied to inverter 33.4 changes state from low to high, there is a delay of approximately 250 nanoseconds before output signal OUT produced by inverter 33.6 changes state from high to low. When input signal IN changes state from high to low, there is a delay of approximately 350 nanoseconds before output signal OUT changes state from low to high. The different delays permit oscillator 17.10 of FIGS. 17 and 32 to operate at a maximum frequency of about 1.6 MHz.

Delay capacitor circuit 33.2 includes a plurality of parallel connected capacitors that provide a selected capacitance between the input and output of delay capacitor circuit 33.2. Trim signals TR0–TR3 are supplied to delay capacitor circuit 33.2 from fuse circuit 1.30 (see FIGS. 1 and 16) to control the value of the capacitance between the input and output of delay capacitor circuit 33.2. Trim signals TR0–TR3 are used to trim capacitors in capacitor circuit 25.4 as discussed above with respect to FIG. 25. Since trimming the capacitors in capacitor circuit 25.4 trims the full scale reference frequency of light-to-digital converter 1.10, by simultaneously trimming the capacitors in delay capacitor circuit 33.2 the value of the pulse width is centered at about 350 nanoseconds.

Transistors 33.MP3 and 33.MP4 form a current source 33.8 that is selectively enabled or disabled in response to bias signals PB1 and PB2 received from bias circuit 18.6 of FIGS. 18 and 20. When light-to-digital signal converter 1.10 is in the power-down mode, bias signals PB1 and PB2 are high to turn transistors 33.MP3 and 33.MP4 off and disable current source 33.8. When light-to-digital signal converter 1.10 is in the operating mode (i.e. not in the power-down mode), bias signals PB1 and PB2 turn transistors 33.MP3 and 33.MP4 on to enable current source 33.8 to produce a charging current signal IUP.

Transistors 33.MN8 and 33.MN9 form a current source 33.9 that is selectively enabled or disabled in response to bias signals NB1 and NB2 received from bias circuit 18.6 of FIGS. 18 and 20. When light-to-digital signal converter 1.10 is in the power-down mode, bias signals NB1 and NB2 are low to turn transistors 33.MN8 and 33.MN9 off and disable current source 33.9. When light-to-digital signal converter 1.10 is in the operating mode (i.e. not in the power-down mode), bias signals NB1 and NB2 turn transistors 33.MN8 and 33.MN9 on to enable current source 33.9 to produce a discharging current signal IDN.

Delay comparator 33.3 is also selectively enabled or disabled in response to bias signals PB1, PB2, NB1, and NB2 received from bias circuit 18.6 of FIGS. 18 and 20. When light-to-digital signal converter 1.10 is in the power-down mode, bias signals PB1 and PB2 are high and bias signals NB1 and NB2 are low to disable delay comparator 33.3. When light-to-digital signal converter 1.10 is in the operating mode (i.e. not in the power-down mode), bias signals PB1, PB2, NB1, and NB2 enable delay comparator 33.3.

Delay comparator 33.3 has a negative or inverting input NEG connected to node 33.7 which is connected to the output of delay capacitor circuit 33.2. Node 33.7 is also selectively connected to receive discharging current signal IDN when transistors 33.MN5 and 33.MN6 are on, charging current signal IUP when transistors 33.MP2 and 33.MP1 are on, and voltage reference signal VRL when transistors 33.MN7 and 33.MN4 are on.

Delay comparator 33.3 has a positive or non-inverting input POS that is selectively connected to receive either a low voltage threshold signal VRL or a high voltage threshold signal VRH from bias circuit 18.8 of FIG. 18. The non-inverting input POS of delay comparator 33.3 receives low voltage threshold signal VRL when the output of inverter 33.6 is low turning transistor 33.MN1 off and the output of inverter 33.5 is high which turns transistor 33.MN3 on. The non-inverting input POS of delay comparator 33.3 receives signal VRH when the output of inverter 33.6 is high turning transistor 33.MN1 on and the output of inverter 33.5 is low which turns transistor 33.MN3 off.

When light-to-digital signal converter 1.10 is in the power-down mode, input signal PD is high to turn transistor 33.MN2 on connecting the input of inverter 33.5 to ground at node G_ND causing the output OUT of inverter 33.6, which is also the output of delay circuit 32.2, to go low. When light-to-digital signal converter 1.10 is in the operating mode (i.e. not in the power-down mode), input signal PD is low to turn transistor 33.MN2 off.

Operation of delay circuit 32.2 will be described beginning first with the situation in which input signal IN applied to the input of inverter 33.4 is low and output signal OUT produced by inverter 33.6 is high. In this situation, the output of inverter 33.4 is high to turn transistors 33.MN5 and 33.MN7 on and transistor 33.MP2 off; the output COUTB of inverter 33.5 is low to turn transistors 33.MN3 and 33.MN6 off and transistor 33.MP1 on; the output OUT of inverter 33.6 is high to turn transistors 33.MN4 and 33.MN1 on. Since transistors 33.MN4 and 33.MN7 are on, the inverting input NEG of delay comparator 33.3 is clamped at approximately the voltage VRL. Since transistor 33.MN1 is on, the non-inverting input POS of delay comparator 33.3 is clamped at approximately the voltage VRH. Since the voltage at non-inverting input POS of delay comparator 33.3 is maintained at a higher value than the voltage at inverting input NEG, the output COUT of delay comparator 33.3 is maintained high.

When input signal IN supplied by inverter 32.6 to the input of inverter 33.4 goes from low to high, the output of inverter 33.4 goes low to turn transistors 33.MN5 and 33.MN7 off and transistor 33.MP2 on. Delay capacitor circuit 33.2 is coupled to charging current signal IUP via transistors 33.MP2 and 33.MP1 and begins to charge.

When the voltage at node 33.7 and the inverting input NEG of delay comparator 33.3 is greater than the high voltage threshold, VRH, at the non-inverting input POS, the output COUT of delay comparator 33.3 goes low. The output COUTB of inverter 33.5 then goes high to turn transistors 33.MN3 and 33.MN6 on and transistor 33.MP1 off. The output OUT of inverter 33.6 then goes low to turn transistors 33.MN4 and 33.MN1 off.

Since transistor 33.MN3 is on, the non-inverting input POS of delay comparator 33.3 is clamped at approximately the voltage VRL. Delay capacitor circuit 33.2 then begins to discharge. If input signal IN applied to inverter 33.4 goes low at this time, transistor 33.5 turns on and delay capacitor circuit 33.2 is coupled to discharging current signal IDN via transistors 33.MN5 and 33.MN6 to speed up discharge. When the voltage at node 33.7 and the inverting input NEG of delay comparator 33.3 is less than that at non-inverting input POS, the output COUT of delay comparator 33.3 goes high; the output COUTB of inverter 33.5 is low to turn transistors 33.MN3 and 33.MN6 off and transistor 33.MP1 on; the output OUT of inverter 33.6 is high to turn transistors 33.MN4 and 33.MN1 on.

If input signal IN applied to inverter 33.4 is still high, delay capacitor circuit 33.2 is coupled to charging current signal IUP via transistors 33.MP2 and 33.MP1 and begins to charge again. The above-described process will repeat until input signal IN applied to inverter 33.4 goes low causing input NEG of delay comparator 33.3 to be clamped at approximately the voltage VRL and input POS to be clamped at approximately the voltage VRH.

Figure 33A:
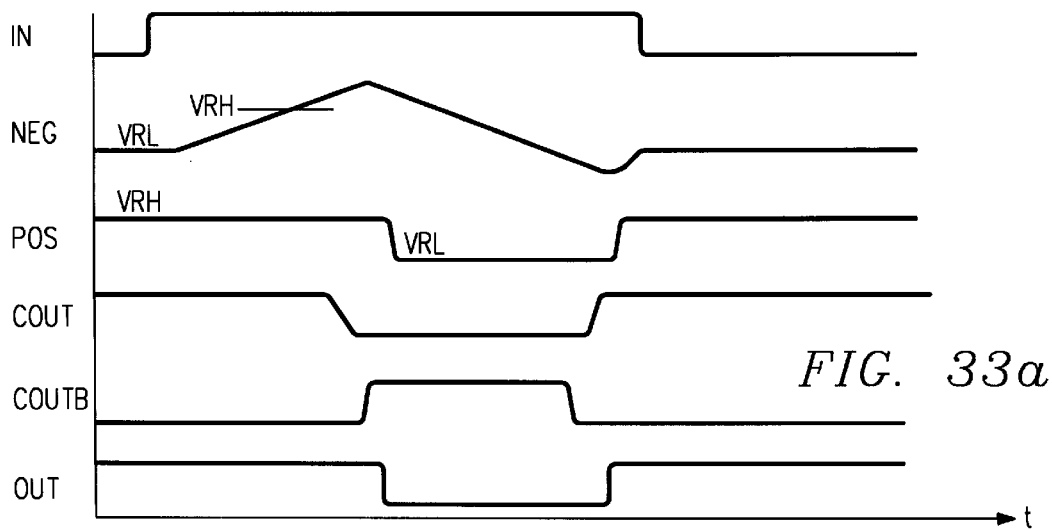
FIG. 33a is a timing diagram illustrating the operation of delay circuit 32.2 of FIG. 33.

FIG. 33a is a timing diagram illustrating the situation in which input signal IN applied to inverter 33.4 goes low after a single pulse appears at output OUT of inverter 33.6.

The separate delays from the time input IN of delay circuit 32.2 changes from high to low or from low to high to the time the output OUT of delay circuit 32.2 changes from low to high or from high to low are determined by the values of current signals IUP and IDN and threshold voltage signals VRH and VRL. Current signals IUP and IDN are related to threshold voltage signals VRH and VRL such that the delays are temperature insensitive. Temperature changes that cause changes in threshold voltage signals VRH and VRL also cause proportional changes in current signals IUP and IDN that result in the delays remaining constant.

Figure 34:
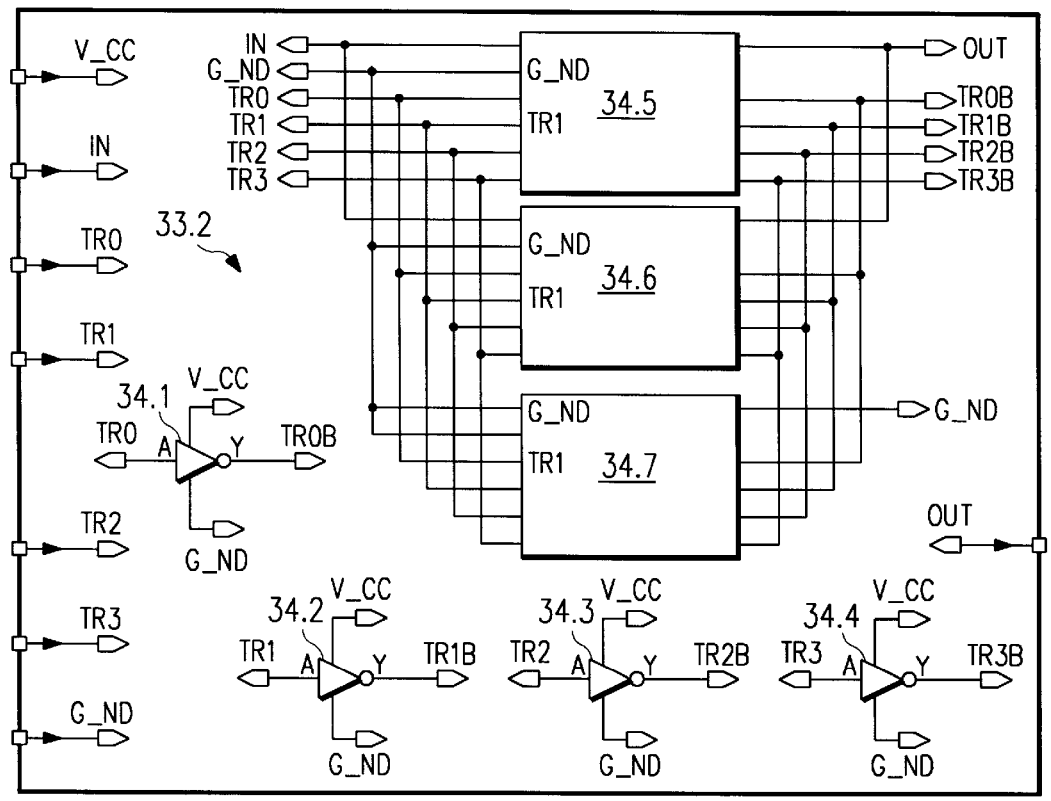
FIG. 34 is an electrical schematic diagram in partial block form of the delay capacitor circuit 33.2 of FIG. 33.

FIG. 34 is an electrical schematic diagram in partial block form of delay capacitor circuit 33.2 of FIG. 33. Delay capacitor circuit 33.2 includes inverters 34.1–34.4 and capacitor arrays 34.5–34.7. Trim signals TR0–TR3 are supplied from fuse circuit 1.30 (see FIGS. 1 and 16) to the inputs of inverters 34.1–34.4, respectively, to produce complementary trim signals TR0B–TR3B.

Trim signals TR0–TR3 and their logical complements, trim signals TR0B–TR3B, are supplied to capacitor arrays 34.5–34.7 to adjust the capacitance of capacitor arrays 34.5–34.7 to a desired value. Capacitor arrays 34.5–34.7 are identical to capacitor array 26.2 of FIG. 27. Trim signals TR0–TR3 and TR0B–TR3B control the capacitance of capacitor arrays 34.5–34.7 by controlling the number of capacitors connected in parallel in each array as previously discussed in detail with respect to capacitor 26.2 of FIG. 27.

The inputs of capacitor arrays 34.5 and 34.6 are connected in common to input IN of delay capacitor circuit 32.2 which is connected to ground at node G_ND as shown in FIG. 33. The outputs of capacitor arrays 34.5 and 34.6 are connected in common to output OUT of capacitor circuit 32.2. As seen in FIG. 33, the output OUT of capacitor circuit 32.2 is connected to node 33.7 of delay capacitor circuit 32.2 of FIG. 33 and thus to the negative or inverting input NEG of delay comparator 33.3 Node 33.7 is alternately connected to bias signals IUP and IDN to charge and discharge the capacitors in capacitor arrays 34.5 and 34.6.

Capacitor array 34.7 has its input and output connected to ground at node G_ND. Capacitor array 34.7 is a redundant array that can be added to the other arrays by way of a metal level option if needed for a greater range of capacitor values. Capacitor array 34.7 is optional and may be omitted if desired.

Figure 35:
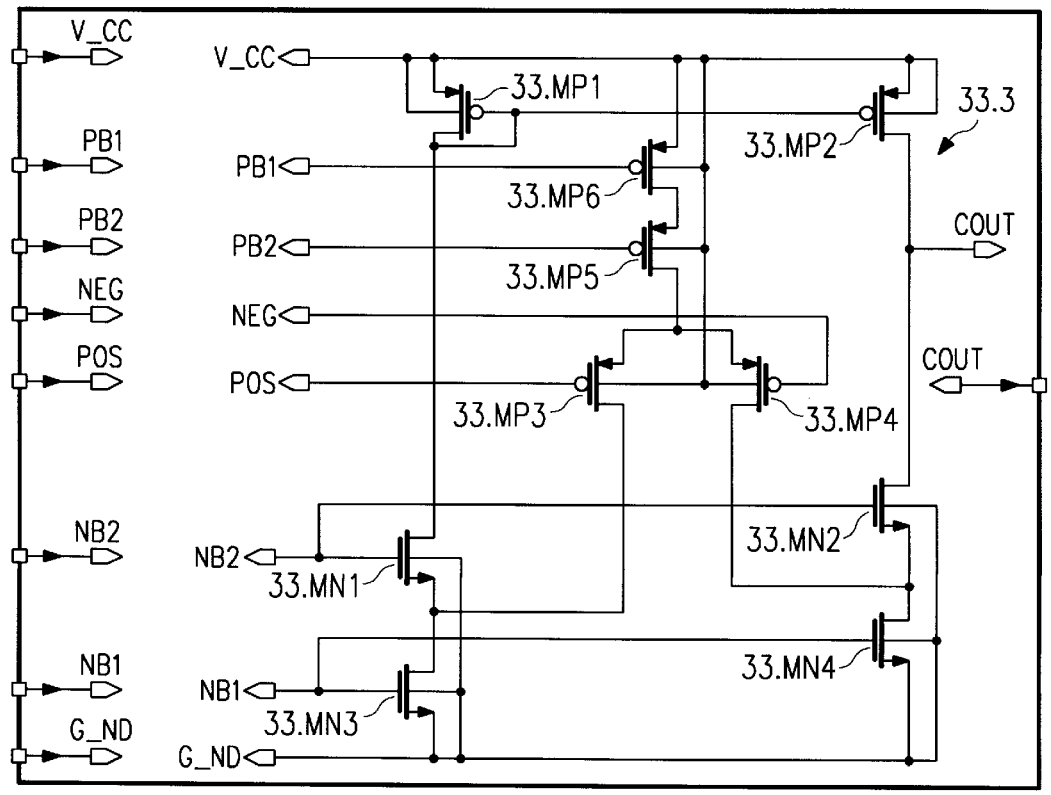
FIG. 35 is an electrical schematic diagram of delay comparator circuit 33.3 of FIG. 33.

FIG. 35 is an electrical schematic diagram of delay comparator 33.3 of FIG. 33. Delay comparator includes n-channel transistors 35.MN1–35.MN4 and p-channel transistors 35.MP1–35.MP6. Delay comparator 33.3 receives bias signals PB1, PB2, NB1, and NB2 from bias circuit 17.2 of FIG. 17, has an inverting input NEG connected to the output OUT of delay capacitor circuit 33.2 of FIG. 33 and a non-inverting input POS that is alternately connected to receive signals VRH and VRL from threshold reference voltage circuit 18.8 of FIGS. 18 and 21, and produces an output signal COUT.

When light-to-digital signal converter 1.10 is in the power-down mode, bias signals PB1 and PB2 are high and NB1 and NB2 are low to turn transistors 35.MP5–35.MP6 and transistors 35.MN1–35.MN4 off to disable delay comparator 33.3.

When light-to-digital signal converter 1.10 is in the operating mode (i.e. non-power-down mode), bias signals PB1, PB2, NB1, and NB2 turn transistors 35.MP5–35.MP6 and 35.MN1–35.MN4 on to enable delay comparator 33.3. When enabled, delay comparator 33.3 operates as a conventional folded cascode differential comparator to produce an output signal COUT that is high or low in response to the voltages applied to the inverting and non-inverting inputs NEG and POS, respectively.

Delay comparator 33.3 produces an output signal COUT that is high when the voltage applied to inverting input NEG is less than the voltage applied to non-inverting input POS. Delay comparator 33.3 produces an output signal COUT that is low when the voltage applied to inverting input NEG, exceeds the voltage applied to non-inverting input POS.

Figure 36:
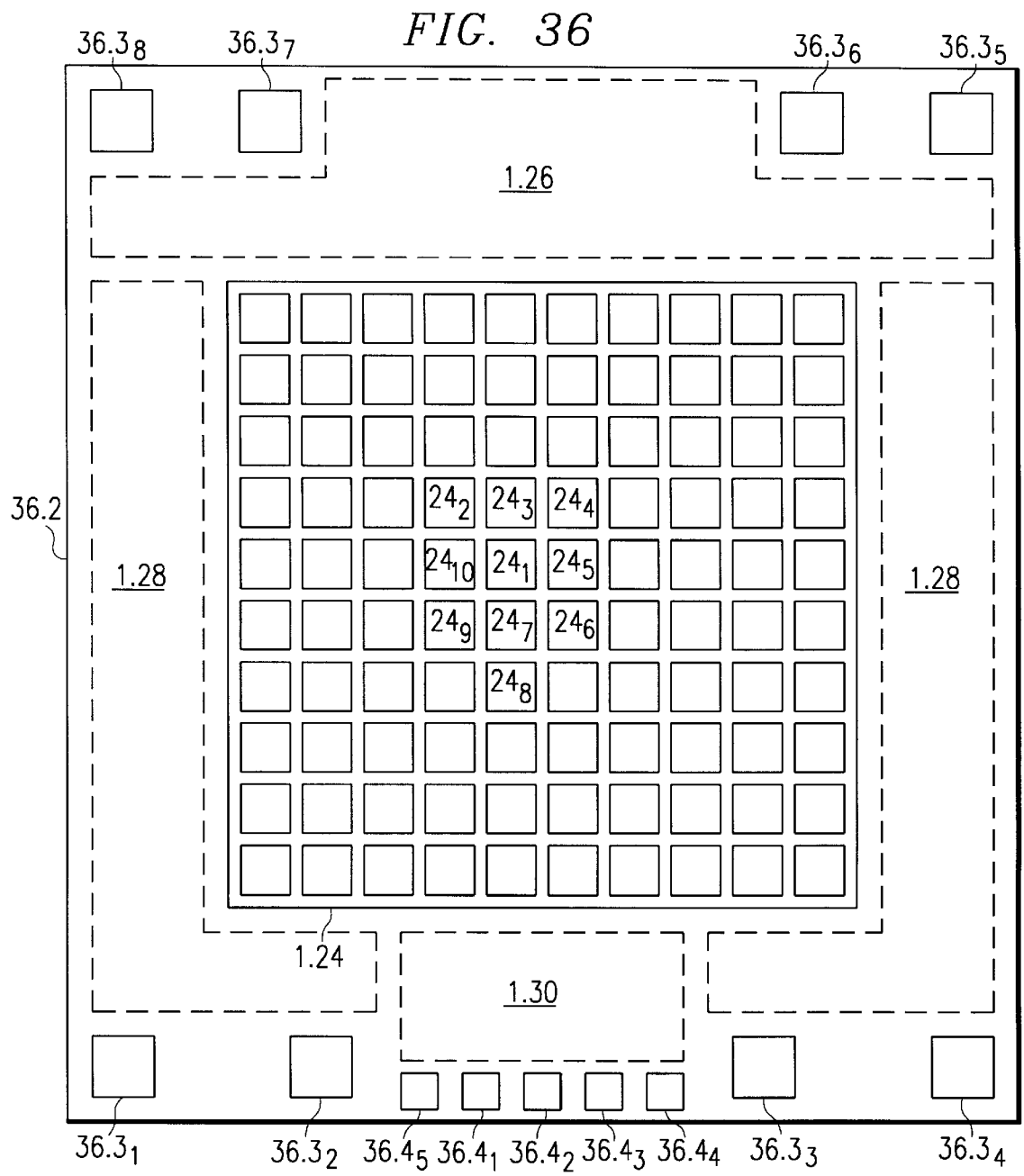
FIG. 36 is a layout diagram of the light-to-digital signal converter of FIG. 1.

FIG. 36 is a layout diagram showing the relative locations of control circuit 1.26, current-to-digital signal converter 1.28, photodiode array 1.24, and fuse circuit 1.30 of FIG. 1 on a semiconductor die 36.2. Also shown are the locations of bond pads 36.31–36.38 which are bonded to external leads or pins (not shown) during packaging. Trim pads 36.4$_1$–36.4$_4$ and fuse common pad 36.4$_5$ are also shown and can be accessed at the trim at probe manufacturing step prior to packaging for trimming selected capacitors in light-to-digital signal converter 1.10.

Photodiode array 1.24 is located in the center of die 36.2 and is arranged as a 10 by 10 array of photodiodes. Photodiode array 1.24 is made up of three separate photodiode groups. The first photodiode group includes only photodiode 24$_1$. The second photodiode group includes 9 parallel connected photodiodes 24$_2$–24$_{10}$. The third group includes the remaining 90 photodiodes in array 1.24 which are also connected in parallel.

Figure 37:
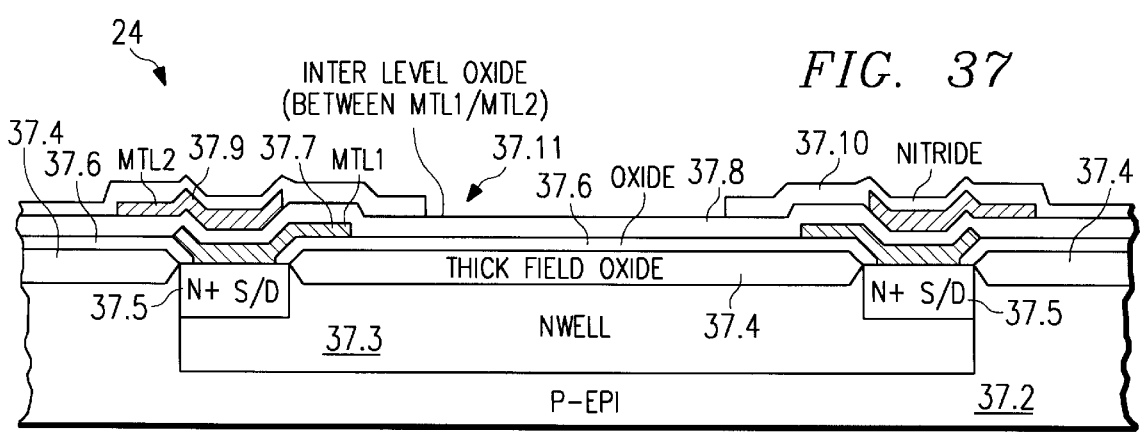
FIG. 37 is a cross-sectional elevation view of one of the photodiodes of the light-to-digital signal converter of FIG. 1.

FIG. 37 is a cross section of one of the photodiodes 24 in array 1.24. Photodiode 24 is a P-N junction photodiode formed in a P- epitaxial layer 37.2 of silicon. Photodiode 24 includes an N well 37.3 having a surface area of approximately 110 μm by 110 μm formed in P- epitaxial layer 37.2. A thick field oxide layer 37.4 is formed over the surface of P-epitaxial layer 37.2 and over the surface of N well 37.3 except where N+ contact region 37.5 is formed in N well 37.3. N+ contact region 37.5 extends around the periphery of N well 37.3. Region 37.5 may be formed at the same time as N+ source/drain regions for N-channel field effect transistors in light-to-digital signal converter 1.10 are formed.

A thin oxide layer 37.6 is formed over thick field oxide 37.4 and N+ contact region 37.5. First level metal conductor 37.7 contacts N+ region 37.5 through an opening in thin oxide layer 37.6 formed during oxide etch. First level metal conductor 37.7 extends over a portion of thick field oxide 37.4 above N well 37.3 to act as a light shield defining a photodiode active area of approximately 96 μm by 96 μm.

An interlevel oxide layer 37.8 is then formed over conductor 37.7 and oxide layer 37.6. A second level metal layer 37.9 is then formed as a light shield over areas adjacent to N well 37.3. A nitride layer 37.10 is formed over second metal layer 37.9 and interlevel oxide layer 37.8. A portion of nitride layer 37.10 is removed to define an opening 37.11 in nitride layer 37.10 over the photodiode active region. Opening 37.11, which has an area of approximately 90 μm by 90 μm, reduces short wavelength absorption and reduces reflection at all wavelengths.

Figure 38A:
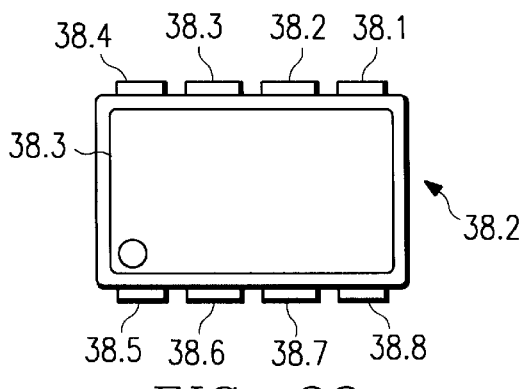
FIGS. 38a–38c are top, side, and front views, respectively, of an 8-pin dual-in-line package in which the light-to-digital signal converter of FIG. 1 is encapsulated.
Figure 38B:
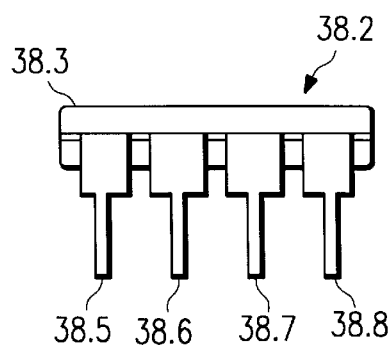
Figure 38C:
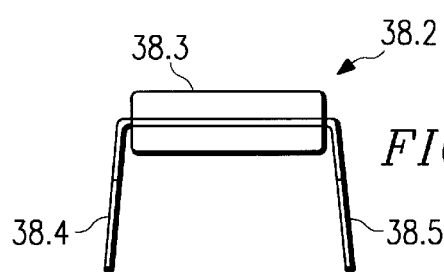

FIGS. 38a–38c are top, side, and front views, respectively, of an 8-pin dual-in-line package 38.2 in which semiconductor die 36.2 (not shown) is encapsulated. Package 38.2 includes clear plastic encapsulant 38.3 through which light can pass to impinge on photodiode array 1.30 (not shown). Package 38.2 also includes leads or pins 38.3$_1$–38.3$_8$ that are connected by wire to bond pads on semiconductor die 36.2. Pins 38.3$_1$–38.3$_5$, 38.3$_7$, and 38.3$_8$ receive signals S0, S1, output enable OE, G_ND, V_CC, S2, and S3, respectively. Pin 38.3$_6$ supplies the output signal OUT of the light-to-digital signal converter 1.10.

Figure 39A:
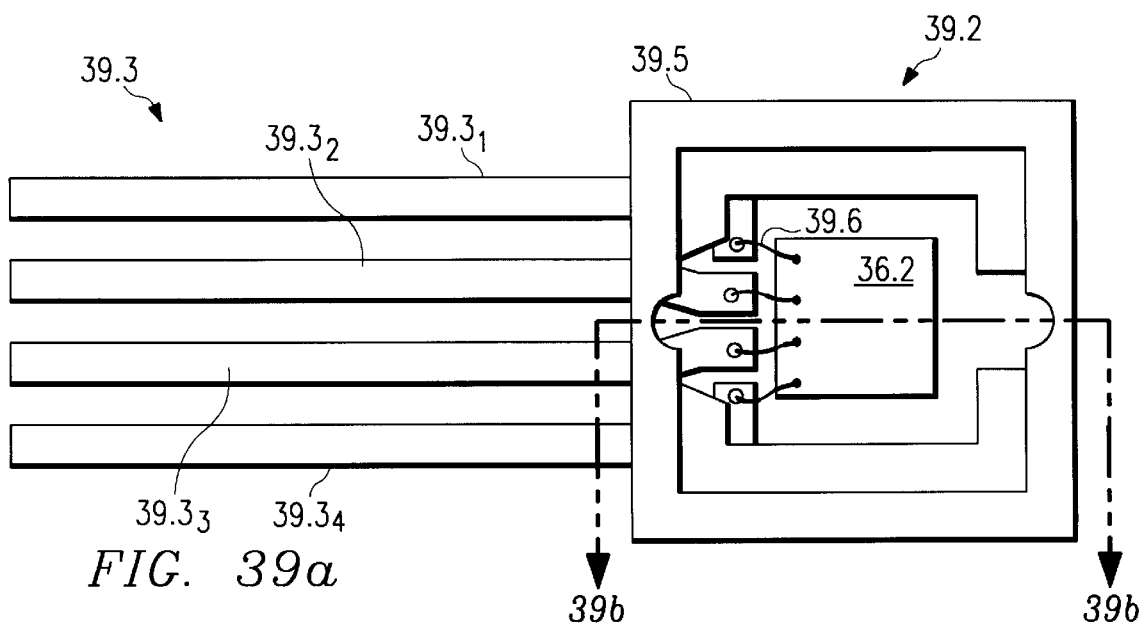
FIGS. 39a and 39b are top and cross-sectional elevation views, respectively, of a non-programmable, 4-pin package in which light-to-digital signal converter of FIG. 1 is encapsulated.
Figure 39B:
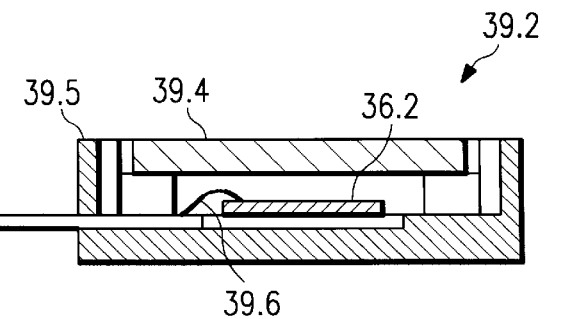

FIGS. 39a–39b are top and cross-sectional elevation views of a non-programmable, 4-pin package 39.2 in which semiconductor die 36.2 is encapsulated. Package 39.2 includes a lead frame 39.3 on which semiconductor die 36.2 is mounted. Lead frame 39.3 includes pins 39.3$_1$–39.3$_4$. A plastic housing 39.5, having a cavity in which semiconductor die 36.2 is located, is molded around lead frame 39.3. A glass window 39.4 is bonded to plastic housing 39.5 to permit light to impinge on the photodiode array on semiconductor die 36.2.

Pins 39.1$_1$–39.1$_4$ conduct the output enable OE, G_ND, V_CC, and output OUT signals of light-to-digital signal converter 1.10 and are connected to die 36.2 by wires 39.6. The bond pads on semiconductor die 36.2 that would normally receive signals S0–S3 are tied to either V_CC or G_ND on die 36.2 to permanently select the sensitivity and full scale output frequency of light-to-digital signal converter 1.10.

A three pin device could be achieved by eliminating the pin that conducts the output enable signal OE and by tying the bond pad that would normally receive the output enable signal OE to V_CC.

A few preferred embodiments have been described in detail hereinabove. It is to be understood that the scope of the invention also comprehends embodiments different from those described, yet within the scope of the claims. For example, other types of analog-to-digital conversion, such as delta-sigma conversion or dual slope conversion could be used to convert current signals from the photodiode array to a digital signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A monolithic light-to-digital signal converter, comprising:
- a semiconductor die;
- an array of photodiodes, said array including at least first, second, and third sections, said first section producing a first current signal in response to incident light, said second section producing a second current signal in response to incident light, said third section producing a third current signal in response to incident light;
- a current-to-digital signal converter circuit formed in a face of said semiconductor die adjacent said light responsive circuit for receiving said current signals and producing a digital signal; and
- a control circuit for receiving said digital signal and producing an output signal, said control circuit responsive to first programming signals for producing first control signals, said current-to-digital converter circuit responsive to said first control signals for selectively either converting said first current signal into said digital signal, or combining said first and second current signals into a first composite signal and converting said first composite into said digital signal, or combining said first, second, and third current signals into a second composite signal and converting said second composite signal into said digital signal, said control circuit receiving said digital signal and scaling said digital signal in response to second programming signals by a selected one of a plurality of values to produce said output signal.

2. The monolithic light-to-digital signal converter of claim 1, in which said first section includes one photodiode, said second section includes nine photodiodes connected in parallel, and said third section includes ninety photodiodes connected in parallel.

3. The monolithic light-to-digital signal converter of claim 1, in which each of said current signals has a magnitude related to the intensity of the incident light and said digital signal is a pulse signal having a frequency related to the magnitude of said first current signal, said first composite signal, or said second composite signal.

4. The monolithic light-to-digital signal converter of claim 1, in which said digital signal is a pulse signal having a frequency related to the magnitude of said at least one current signal, said control circuit scaling said pulse signal by dividing the frequency of said pulse signal by a selected one on a plurality of values.

* * * * *